US007228325B2

United States Patent
Willson, Jr. et al.

(10) Patent No.: US 7,228,325 B2
(45) Date of Patent: Jun. 5, 2007

(54) BYPASSABLE ADDER

(75) Inventors: Alan N. Willson, Jr., Pasadena, CA (US); Larry S. Wasserman, Granada Hills, CA (US)

(73) Assignee: Pentomics, Inc., Pasadena, CA (US)

( * ) Notice: Subject to any disclaimer, the term of this patent is extended or adjusted under 35 U.S.C. 154(b) by 333 days.

(21) Appl. No.: 09/938,978

(22) Filed: Aug. 24, 2001

(65) Prior Publication Data

US 2002/0083109 A1 Jun. 27, 2002

Related U.S. Application Data

(60) Provisional application No. 60/228,193, filed on Aug. 25, 2000.

(51) Int. Cl.
G06F 7/38 (2006.01)
G06F 17/10 (2006.01)
(52) U.S. Cl. .................... 708/490; 708/670
(58) Field of Classification Search ........ 708/670, 708/700–714, 490
See application file for complete search history.

(56) References Cited

U.S. PATENT DOCUMENTS

| | | | | |
|---|---|---|---|---|
| 3,482,085 A | * | 12/1969 | Smith, Jr. | ............... 708/703 |
| 4,746,899 A | | 5/1988 | Swanson et al. | |
| 4,751,666 A | | 6/1988 | Gillingham | |
| 5,333,288 A | * | 7/1994 | Kusuda | ............... 711/214 |
| 5,875,124 A | * | 2/1999 | Takahashi | ............... 708/702 |
| 5,953,241 A | | 9/1999 | Hansen et al. | |
| 6,308,190 B1 | | 10/2001 | Willson, Jr. et al. | |

OTHER PUBLICATIONS

Chevillat, Pierre R. et al., "Optimum FIR Transmitter and Receiver Filters for Data Transmission over Band-Limited Channels," IEEE Transactions on Communications, vol. Com-30, No. 8, Aug. 1982, pp. 1909-1915.
Kuo, Tzu-Chieh et al., "A Programmable Interpolation Filter for Digital Communications Applications," Proceedings of the 1998 IEEE Interpolation Symposium on Circuits and Systems, May 31-Jun. 3, 1998, Monterey, CA, IEEE, 1998, vol. II, pp. II-98-II-100.
Kuo, Tzu-Chieh, "A Programmable Interpolation Filter for Digital Communication Applications," Thesis, Master of Science in Electrical Engineering, University of California, Los Angeles, CA, 1996, pp. xi, 1-51.
Moreau de Saint-Martin, Francois et al., "Design of Optimal Linear-Phase Transmitter and Receiver Filters For Digital Systems," IEEE, 1995, pp. 885-888.
Proakis, John G. et al., "Digital Signal Processing: Principles, Algorithms, and Applications," Macmillian Publishing Company, New York, pp. 485-502, undated.

(Continued)

Primary Examiner—Chuong D. Ngo
(74) Attorney, Agent, or Firm—Gates & Cooper LLP

(57) ABSTRACT

An adder for adding a signal at a first input (A) and a second input (B) to produce an adder output (S) is disclosed. The adder comprises a bypass input (bypass) and a logic circuit, communicatively coupled to the bypass input (bypass), the first input (A), and the second input (B), the logic circuit configured to hold at least one of the first input (A) and the second input (B) according to the bypass input (bypass).

45 Claims, 41 Drawing Sheets

OTHER PUBLICATIONS

Samueli, Henry, "On the Design of Optimal Equiripple FIR Digital Filters for Data Transmission Applications," IEEE Transactions on Circuits and Systems, vol. 35, No. 12, Dec. 1998, pp. 1542-1546.

Samueli, Henry, "On the Design of FIR Digital Data Transmission Filters with Arbitrary Magnitude Specifications," IEEE Transactions on Circuits and Systems, vol. 38, No. 12, Dec. 1991, pp. 1563-1567.

Thompson, Charles D. et al., "A Digitally-Corrected 20b Delta-Sigma Modulator," IEEE International Solid-State Circuits Conference, Session 11/Oversampled Data Conversion/Paper TP 11.5, IEEE 1994, pp. 194-195.

Vaidyanathan, P.P., "Mulirate Systems and Filter Banks," Prentice Hall, Englewood Cliffs, NJ 07631, pp. 118-134, undated.

Kuskie C. et al. (1995) "A Decimation Filter Architecture for GHz Delta-Sigma Modulators," IEEE Int'l Symposium on Circuits and Systems, pp. 953-956.

Nagari, A. et al., "A 2.7V 11.8 mW Baseband ADC with 72 db Dynamic Range for GSM," 1999, IEEE, Custom Integrated Circuits Conference, pp. 133-136.

* cited by examiner

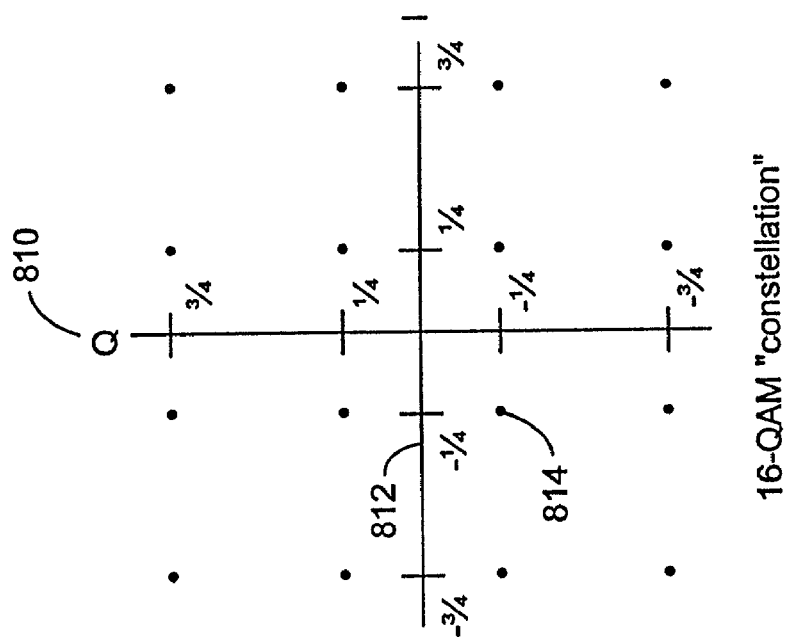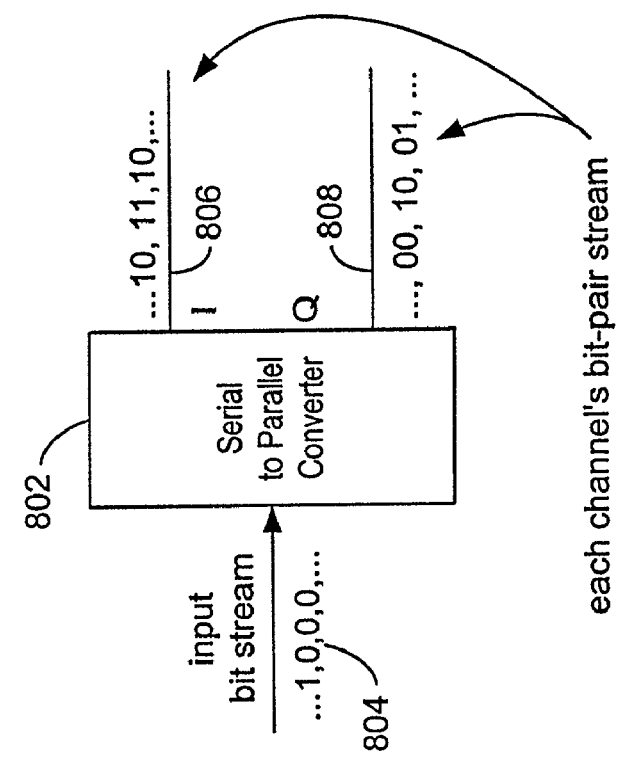
FIG. 8

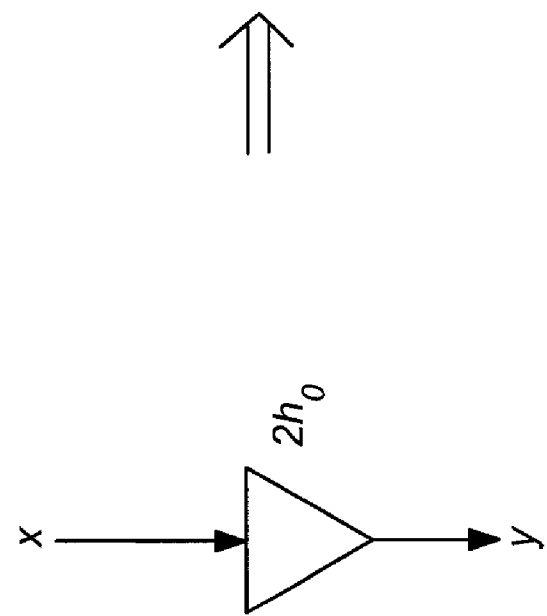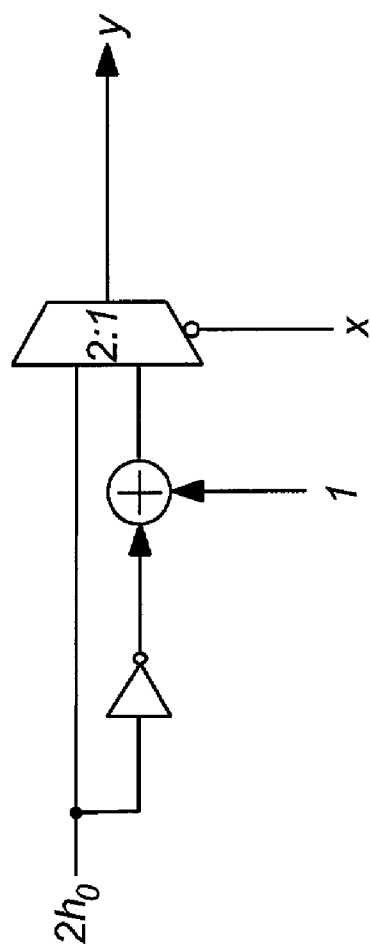
FIG. 29

BYPASSABLE ADDER

CROSS REFERENCE TO RELATED APPLICATIONS

This application claims benefit of U.S. Provisional Application No. 60/228,193, filed Aug. 25, 2000 by Alan N. Willson, Jr. and Larry S. Wasserman and entitled "IMPLEMENTATION OF A DIRECT-FORM LOW POWER DIGITAL PULSE-SHAPING FILTER," which application is hereby incorporated by reference herein; and This application is also related to the following patent applications, each of which hereby incorporated by reference herein:

U.S. patent application Ser. No. 09/912,177, filed Jul. 24, 2001, by Alan N. Willson, Jr. and Larry S. Wasserman and entitled "LOW-POWER PULSE-SHAPING DIGITAL FILTERS", now issued as U.S. Pat. No. 6,553,397, which is a continuation of U.S. patent application Ser. No. 09/211,357, filed Dec. 15, 1998, by Alan N. Willson, Jr. and Larry S. Wasserman and entitled "LOW-POWER PULSE-SHAPING DIGITAL FILTERS," now issued as U.S. Pat. No. 6,308,190.

BACKGROUND OF THE INVENTION

1. Field of the Invention

The present invention relates to systems and methods of digital processing, and in particular to low-power logic circuits for performing mapping functions.

2. Description of the Related Art

A pulse-shaping digital filter is a digital system consisting of a data rate expander (that inserts zeros between successive input bits) followed by a digital filter operating at the higher data rate. The system accepts an input stream of symbols which, in the most elementary form, is a stream of one-bit data, and produces an output stream of B-bit data (where B is a fixed positive integer) having a waveform suitable for processing by a digital-to-analog converter (DAC). The DAC yields an analog signal whose waveform contains the original bit-stream's information while having its frequency content appropriately bandlimited for transmission through some given communication channel.

Pulse-shaping filters, both analog and digital, have been well studied in the literature for several decades and their importance in the implementation of practical communication systems has only increased as the interest in transmitting digital data has increased. The recent popular interest in wireless digital communication systems such as digital cellular telephones has highlighted the need for digital filter implementations that minimize power dissipation. Techniques have been proposed which permit reduced power consumption in digital processing circuits, however, there is a need for logic circuits that can implement the required logic without unnecessary power consumption. The present invention satisfies that need.

SUMMARY OF THE INVENTION

To address the requirements described above, the present invention discloses an adder for adding a signal at a first input (A) and a second input (B) to produce an adder output (S). The adder comprises a bypass input (BY) and a logic circuit, communicatively coupled to the bypass input (BY), the first input (A), and the second input (B), the logic circuit configured to hold at least one of the first input (A) and the second input (B) according to the bypass input (BY).

BRIEF DESCRIPTION OF THE DRAWINGS

Referring now to the drawings in which like reference numbers represent corresponding parts throughout:

FIG. 8 is a block diagram showing a 16-QAM modulation scheme;

FIG. 29 is a diagram of one embodiment of a multiplier;

DETAILED DESCRIPTION OF THE PREFERRED EMBODIMENT

In the following description, reference is made to the accompanying drawings which form a part hereof, and in which is shown, by way of illustration, several embodiments of the present invention. It is understood that other embodiments may be utilized and structural changes may be made without departing from the scope of the present invention.

Hardware Environment

Figure 1:
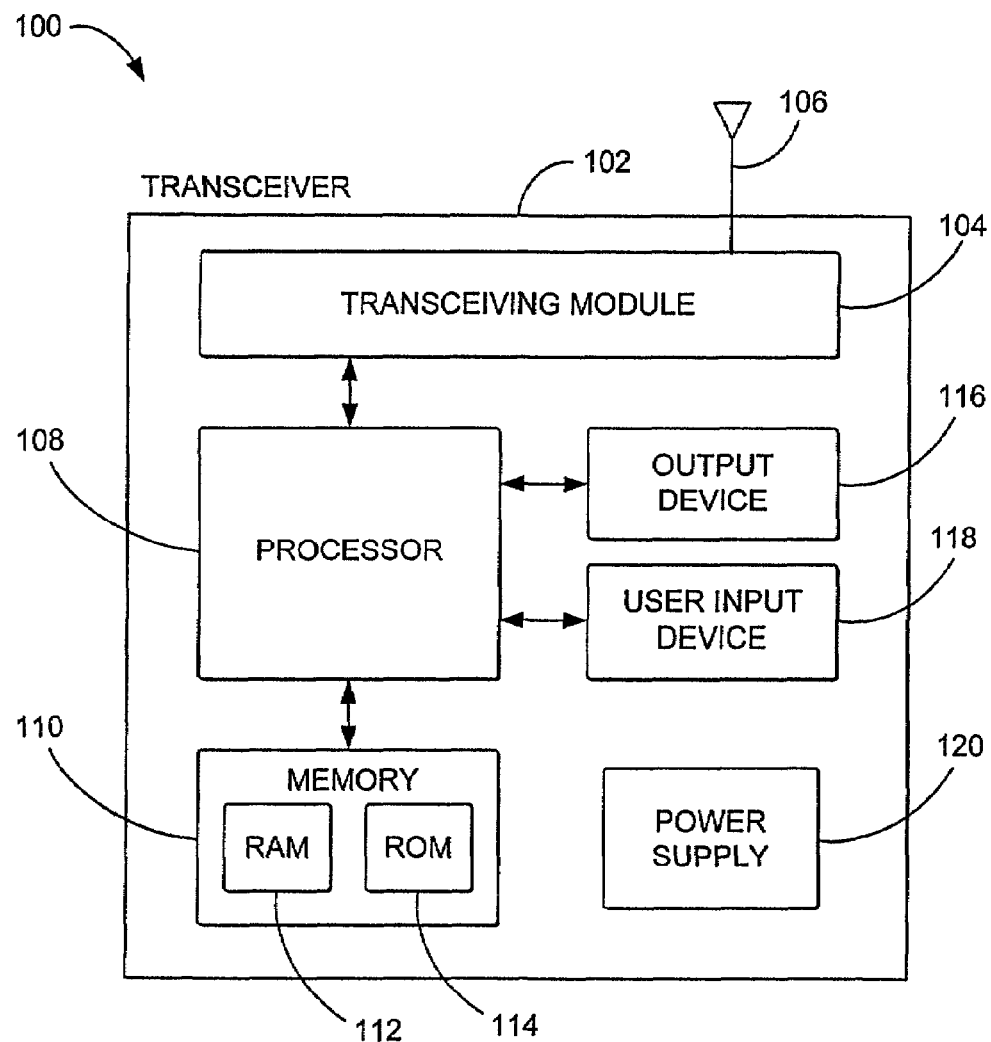
FIG. 1 is a block diagram showing an exemplary hardware environment for practicing the present invention.

FIG. 1 is a block diagram illustrating an exemplary hardware environment for the present invention, comprising a digital transceiver system 100. The digital transceiver system 100 comprises a transceiver 102 having one or more antennae 106 for receiving and transmitting information. An analog or hybrid transceiving module is coupled to the antenna 106 and a processor 108. The transceiving module 104, in cooperation with the processor 108, performs the functions necessary to receive and transmit digital data. Processor 108 implements the digital filters described herein, and is coupled to a memory 110, which may include a random access memory 112 for storing program instructions or data and a read only memory 114 for storing program instructions or other data. The processor is also coupled to an output device 116, such as a speaker system or display, which allows the user to communicate with the transceiver 102. The processor also accepts input from user input device 118, which may be a keypad or other device allowing the user to provide input to the transceiver 102. Power consuming elements in the transceiver are coupled to the power supply 120, which may comprise a battery or other source of electrical power and other associated circuitry to control and disseminate power within the transceiver 102.

While the present invention can be advantageously applied to digital wireless communication systems, it may also be applied to any data processing task utilizing digital filters, including a general purpose computer system.

Figure 2:
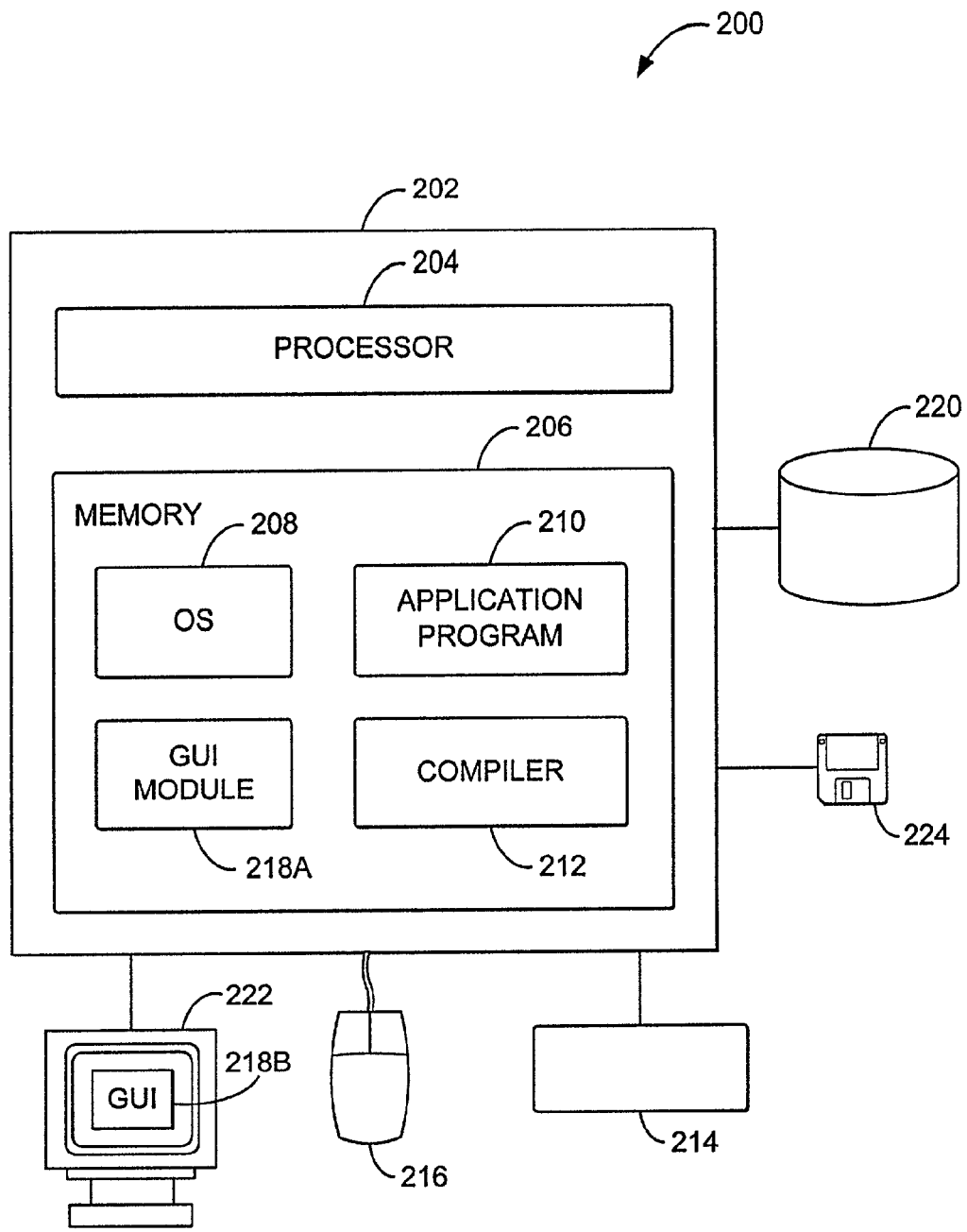
FIG. 2 is a block diagram of an alternative hardware environment for the present invention.

FIG. 2 illustrates an exemplary computer system 200 that could be used to implement low-power pulse-shaping digital filters. The computer system 200 comprises a computer 202 having a processor 204 and a memory, such as random access memory (RAM) 206. The computer 202 is operatively coupled to a display 222, which presents information such as images to the user on an interface such as a graphical user interface 218B. The computer 202 may be coupled to other devices, such as a keyboard 214, a mouse device 216, a printer, etc. Of course, those skilled in the art will recognize that any combination of the above components, or any number of different components, peripherals, and other devices, may be used with the computer 202.

Generally, the computer 202 operates under control of an operating system 208 stored in the memory 206, and interfaces with the user to accept inputs and commands and to present results through an interface such as a graphical user interface (GUI) module 218A. Although the GUI module 218A is depicted as a separate module, the instructions performing the GUI functions can be resident or distributed in the operating system 208, the application program 210, or implemented with special purpose memory and processors. The computer 202 also implements a compiler 212 which allows an application program 210 written in a programming language such as COBOL, C++, FORTRAN, or other language to be translated into processor 204 readable code. After completion, the application 210 accesses and manipulates data stored in the memory 206 of the computer 202 using the relationships and logic that was generated using the compiler 212.

In one embodiment, instructions implementing the operating system 208, the computer program 210, and the compiler 212 are tangibly embodied in a computer-readable medium, e.g., data storage device 220, which could include one or more fixed or removable data storage devices, such as a zip drive, floppy disc drive 224, hard drive, CD-ROM drive, tape drive, smart card, etc. Further, the operating system 208 and the computer program 210 are comprised of instructions which, when read and executed by the computer 202, causes the computer 202 to perform the steps necessary to implement and/or use the present invention. Computer program 210 and/or operating instructions may also be tangibly embodied in memory 206 and/or data communications devices, thereby making a computer program product or article of manufacture according to the invention. As such, the terms "article of manufacture" and "computer program product" as used herein are intended to encompass a computer program accessible from any computer readable device or media.

Those skilled in the art will recognize many modifications may be made to this configuration without departing from the scope of the present invention. For example, those skilled in the art will recognize that any combination of the above components, or any number of different components, peripherals, and other devices, may be used with the present invention.

Background

Figure 3:
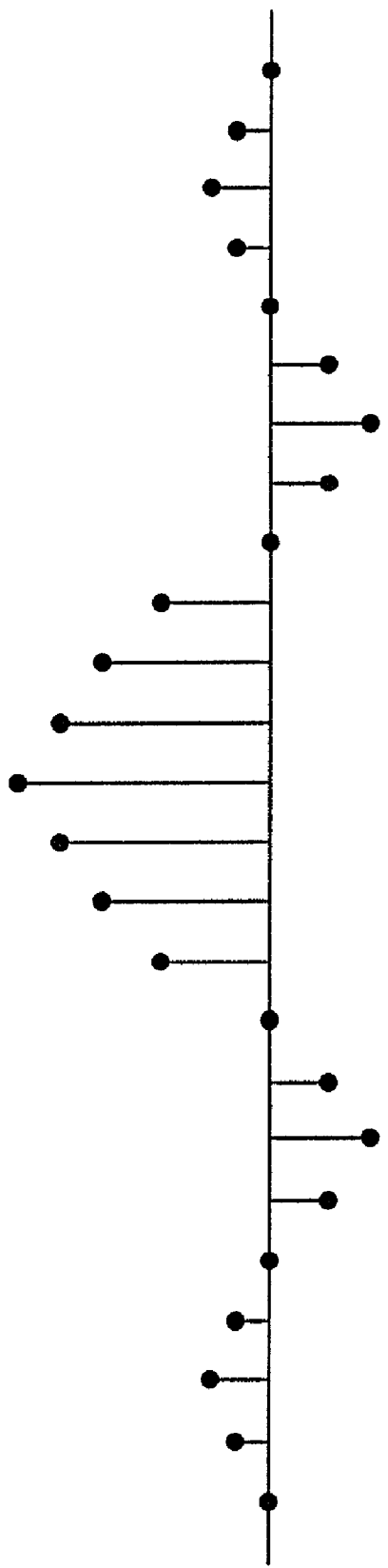
FIG. 3 is an illustration of the impulse response of a typical Nyquist digital filter.

FIG. 3 shows the impulse response of a typical "Nyquist filter." The combined digital transmit and receive filters in a typical communication system are often designed to approximate such filters, as described in P. R. Chevillat and G. Ungerboeck, "Optimum FIR Transmitter and Receiver Filters for Data Transmission over Band-limited Channels," *IEEE Transactions on Communications*, vol. COM-30, pp. 1909–1915, August 1982; H. Samueli, "On the Design of Optimal Equiripple FIR Digital Filters for Data Transmission Applications," *IEEE Transactions on Circuits and Systems*, vol. 35, pp. 1542–1546, December 1988; H. Samueli, "On the Design of Digital Data Transmission Filters with Arbitrary Magnitude Specifications," *IEEE Transac-* tions on *Circuits and Systems*, vol. 38, pp. 1563–1567, December 1991; and F. Moreau de Saint-Martin and P. Siohan, "Design of Optimal Linear-Phase Transmitter and Receiver Filters for Digital Systems," *Proceedings of the 1995International Symposium on Circuits and Systems*, Seattle, Apr. 30–May 3, 1995, pp. 885–888, which references are hereby incorporated by reference herein.

The signal depicted in FIG. 3 would be the sort of signal a receiver's analog-to-digital converter and digital filters would produce when the transmitted bit-stream consisted of just a single bit, i.e., a "1." If the transmitted bit was a "0" then a sequence having the opposite polarity to that of FIG. 3 would be produced within the receiver. A general input bit-stream would, of course, produce superimposed copies of the FIG. 3 sequence or its negative, with each copy corresponding to an input bit and, thus, each copy offset (delayed) from the preceding copy by the number of output samples produced per input bit (a four-sample delay for the FIG. 3 example). Since the FIG. 3 impulse response sequence is arranged to have equally spaced zero values on each side of the center point (every four samples, in this instance), it's evident that, in this superpositioning process, no other response-sequence copies will interfere with the center value of any input bit's response sequence. This absence of inter-symbol interference, of course, provides the means by which, once appropriate synchronization is achieved, the original bit-stream can be recovered.

A transmitter's pulse-shaping filter must have an impulse response that, when cascaded with other filters in the transmitter and receiver, yields a close approximation to the FIG. 3 type impulse response. Its design is also influenced by the requirement that its response sequence, when processed by the transmitter's other digital filters and its digital-to-analog converter (DAC), must produce a suitably bandlimited waveform. Techniques for finite impulse response (FIR) pulse-shaping filter design have been reported in the above references.

Figure 4:
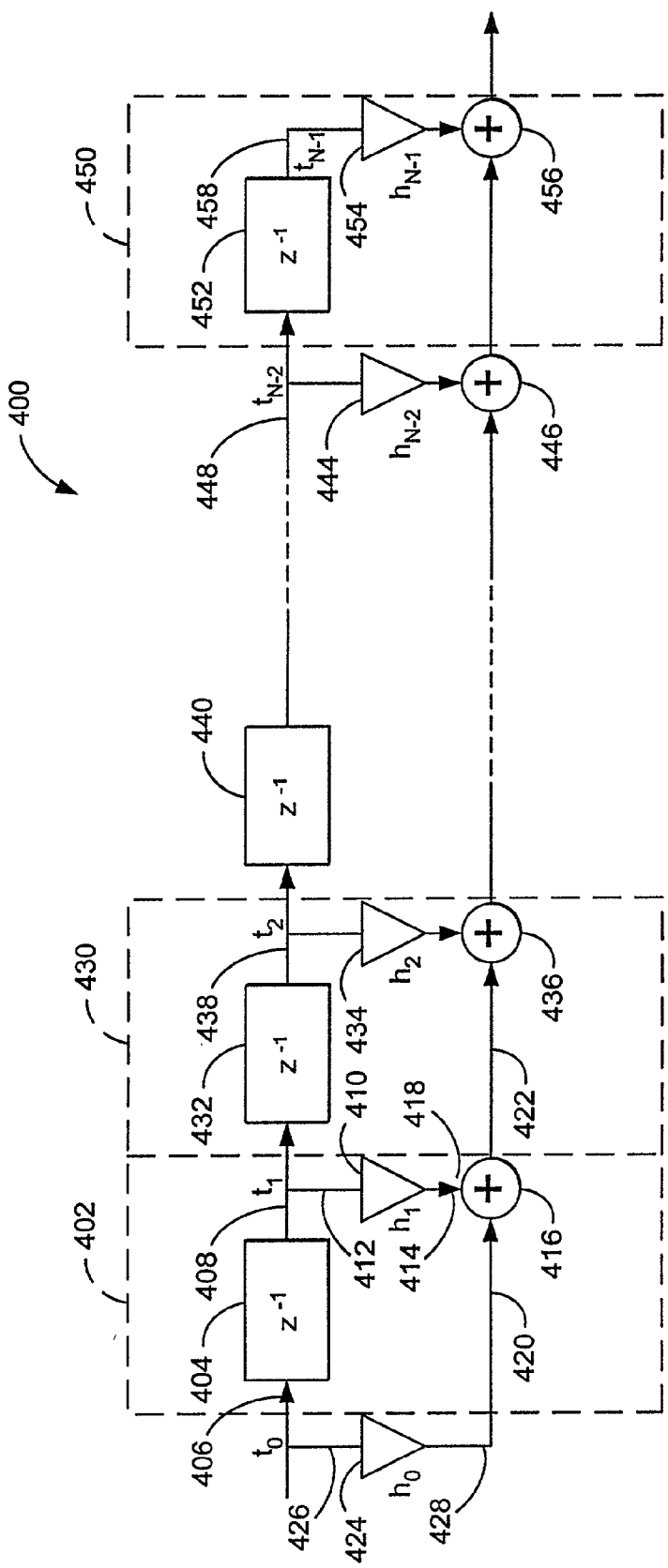
FIG. 4 is a finite impulse response digital filter.

FIG. 4 is a block diagram of a finite impulse response N-tap digital filter 400. The digital filter comprises a plurality of interconnected stages 402, 430 and 450. The first stage 402 has a delay element 404, a weighting element 410, and a summation element 416. The delay element 404 has a delay element input 406, and a delay element output 408 corresponding to a tap value $t_1$ that is coupled to a weighting element input 412. The output of the weighting element 414 is coupled to a first summation element input 418. The first stage 402 is interconnected with the second stage 430 by connection of the delay element output 408 to the delay element input of the following stage 430, and by interconnection of the summation element output 422 of the first stage with the second summation element input of the following stage. The digital filter 400 also comprises a leading gain element 424 whose input is coupled to the delay element input 406 of the delay element 404 of the first stage 402, and whose output is coupled to the second summation element input 420 of the first stage 402. As shown in FIG. 4, the finite impulse response digital filter 400 comprises one or more of the stages described above, and implements a sum of a series of delayed and weighted input values. The tap-weight values of the weighting elements $\{h_0, h_1, \ldots, h_{N-1}\}$ 424, 410, 434, 444, and 454 are selected to achieve a desired digital filter response. As described below, the values of the weighting elements $\{h_0, h_1, \ldots, h_{N-1}\}$ 424, 410, 434, 444, and 454 can be selected to compensate for a mapping of the input bits (i.e., the use of bits selected from the set $\{1,0\}$ for convenient hardware implementation, where the desired response is the response that would result if the inputs were actually selected from the set $\{1, -1\}$).

Since this filter operates upon an expanded bit-stream, with the filter considering a −1 value to correspond to each true input-data bit of zero (as distinct from the zero bits added by the expander, which must be treated as zero) the filter simply needs to compute a sum of terms consisting of each tap weight multiplied by a member of the set $\{0, 1, -1\}$. That is, just N−1 additions are required per input bit, for an N-tap filter.

While the processing of the expanded input bit-stream could be accomplished exactly as described in the preceding paragraph, there are well-known ways to improve the system's organization and efficiency by combining the expansion and filtering operations into a set of smaller FIR filters that operate in parallel at the lower (unexpanded) data rate of the input bit-stream and with only the "1" and "−1" bits occurring. Such "polyphase implementations" are discussed, for example, in P. P. Vaidyanathan, *Multirate Systems and Filter Banks*. Englewood Cliffs, N.J.: Prentice-Hall 1993, which is hereby incorporated by reference herein.

We thus turn our attention to a typical polyphase component filter, which we can still envision as being represented by the FIG. 4 structure; but now we have an input data stream containing no expander zeros, i.e., consisting of a sequence of mapped points taken from the set $\{1, -1\}$. Since, however, it's highly advantageous to employ one-bit data, and since the actual data stream is comprised of zero and one bits, that is what is provided to each polyphase component filter. It will be the filter's responsibility to treat each zero in its input data stream as though it had the value −1. Thus, the filter produces an output sample by accumulating an algebraic sum of the tap weights, where an $h_k$ value is either added or subtracted depending on whether its data bit corresponds to an input bit of one or zero, respectively. Letting N now denote the length of this polyphase component filter, we require N−1 add/subtract operations to produce each output sample. One way to implement the filter, given sufficiently low data rates, would be to sequentially process the tap weights $h_0, \ldots, h_{N-1}$ accumulating their algebraic sum using a single add/subtract unit. However it is organized, some such accumulation process must be performed each time a new input bit is accepted by the FIG. 4 filter.

Low-Power Pulse Shaping Digital Filter

We now describe a method and apparatus for reducing the number of add/subtract operations for the filter shown in FIG. 4 by about one-half. If there were an equal mix of one and zero bits in the incoming bit-stream and if we could process them directly as one and zero, rather than treating the zero as if it were −1, we could achieve our goal of reducing the number of add/subtract operations by just skipping the subtraction operation for all tap weights having a corresponding zero bit. However, this would give the wrong result for the computed output sample value; moreover, it's not evident that enough zero input bits would necessarily be present at some particular point in time that any savings would be achieved. Fortunately, these concerns can be remedied as described below. Notice that, in addition to the potential for power savings by requiring fewer add/subtract operations, the processing of one-bit data in the normal manner also provides the design advantages of a simplified system.

Figure 5A:
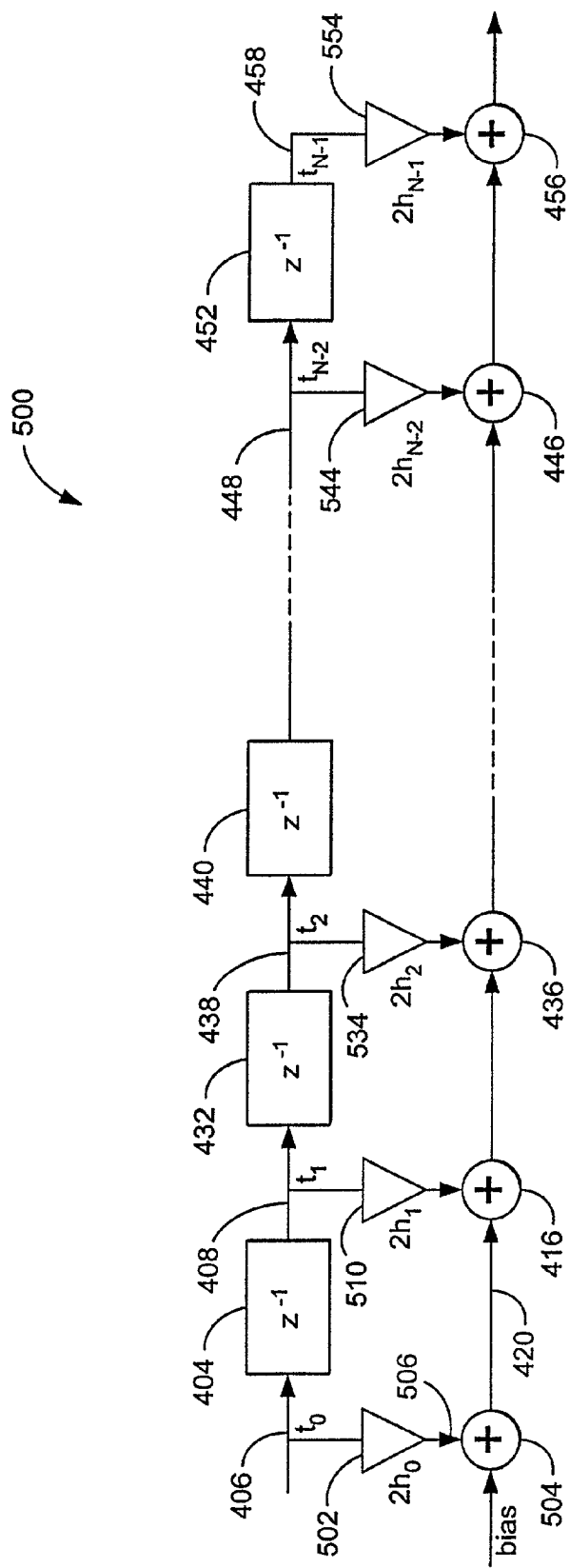
FIGS. 5A–C are block diagrams showing selected embodiments of a low-power pulse-shaping digital filter.

FIG. 5A is a block diagram of a low-power pulse-shaping digital filter 500. The low-power pulse-shaping digital filter 500 comprises the same delay elements 404, 432, 440, and 452 as the general finite impulse response digital filter 400, with two important differences. First, the low-power pulse-shaping digital filter 500 includes a bias element 504, and each of the tap weights has been multiplied by a factor A, which is selected to improve the computational efficiency of the digital filter. A can be selected to improve computational efficiency by reducing the number of digital filter operations, by permitting the use of different hardware implementations which reduce the number of operations, take advantage of advantageous circuit topologies, or to allow the use of special purpose hardware elements. In the illustrative embodiment of FIG. 5A, A=2, hence the tap weights 424, 410, 434, 444, and 454 have been modified from $h_k$ to $2h_k$. In this case, the factor A was selected to reduce the number of add and/or subtract operations.

Figure 5B:
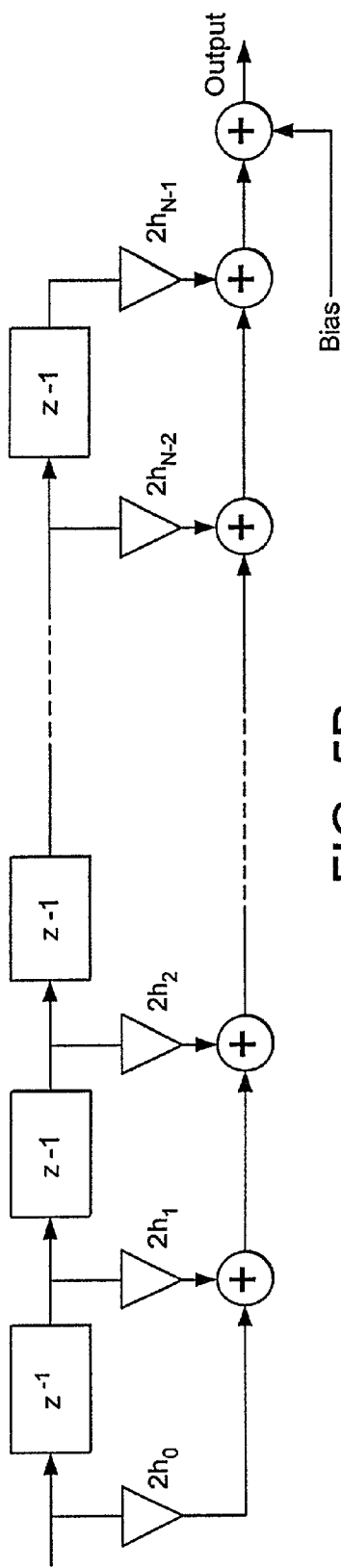
Figure 5C:
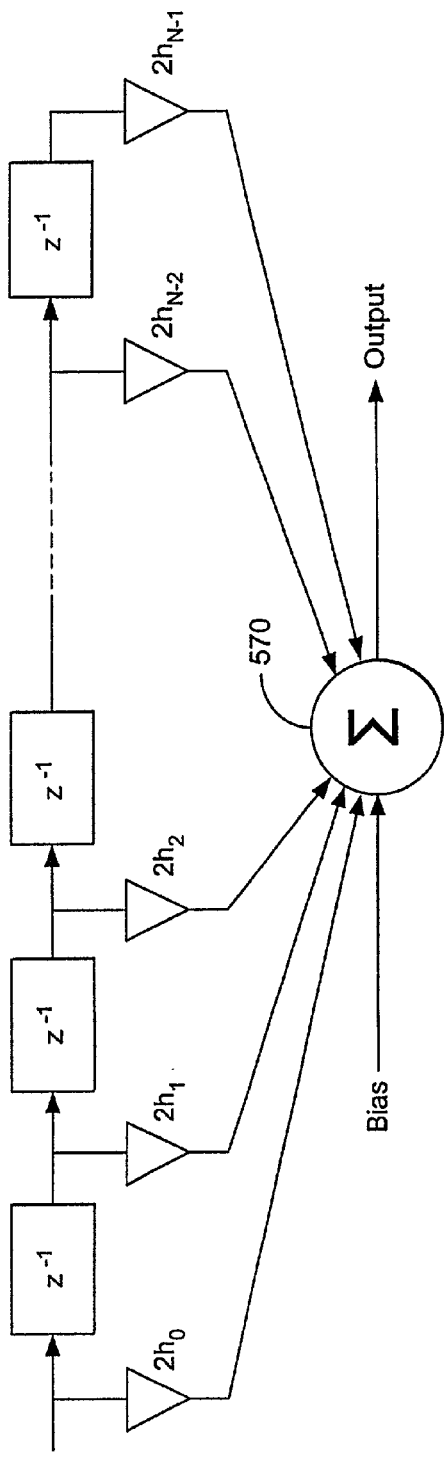

The FIG. 5A digital filter includes a bias or offset value of $-\Sigma h_k = -(h_0 + \ldots + h_{N-1})$ in the accumulator or summing element 504 where the output sample value is to be computed. This bias compensates for the input mapping and modified gain provided by the factor A. In the example of FIG. 5A, if each one and zero input bit are processed normally, a resulting output value will be computed that's equivalent to the value produced by the above-described filter wherein each zero is processed as −1. This is because each tap weight that corresponds to an input one bit will cause twice its correct weight, i.e., $2h_k$, to be added to the output accumulator: however there will also have been a corresponding $-h_k$ amount present in the sum from the $-\Sigma h_k$ initial bias. Similarly, when a tap weight corresponds to a zero input bit, nothing is added to the output accumulator as that is exactly what's needed—there's already a $-h_k$ value present as a component of the initial bias. By skipping the add/subtract operation for all tap weights $h_k$ corresponding to a zero input bit, we can save computational effort; that is, power savings can result. If it could be assured that, in the computation of each output bit, at least half the input data bits were zero, then a saving of at least 50% of the required computation could be assured. Alternative arrangements for this biased accumulation are also possible. We could, for example, use a filter having the structure of FIG. 4 but with modified tap weights, and the effects of the bias value could be incorporated into the subsequent circuitry that process the output samples produced. In particular, a filter could be used in which doubled tap weights are employed and the bias value is added to the final accumulated value, as shown in FIG. 5B, or in which the plurality of summing elements 504, 416, 436, 446, and 456 are replaced by an accumulator 570, as shown in FIG. 5C.

For many types of communication systems, there are certain processes that the incoming data go through which ensure that the one and zero bits appearing in the pulse-shaping filter's input will occur with equal likelihood. If that situation applies then we can simply build a system employing the above-described technique and we'll be assured that, on average, about half the add/subtract operations would be saved, thereby lowering the power dissipation proportionally. Suppose, however, we desire to ensure that such savings occur for any input sequence. Suppose, that we also want to ensure that at most N/2 add/subtract operations are required in the computation of each output sample—no matter what input sequence was being processed. It might at first seem impossible to accomplish that goal since, for example, an input sequence of all ones could be encountered.

However, since it must certainly be the case that there will be a majority of either ones or zeros in any input sequence, we just need to be able to deduce which situation applies as each output bit is being computed; and we can, in fact, be assured of needing at most N/2 add/subtract operations. This is accomplished with a circuit for determining whether the majority of the input values are zero or non-zero.

When the majority input-bit type is zero, we of course use the system already described. When the majority input-bit type is non-zero (ones, for example), a bias of $\Sigma h_k$ can be employed, and we only perform an add/subtract operation for those tap weights corresponding to a zero input bit. This approach requires that only addition operations be employed when the bias is $-\Sigma h_k$ and only subtraction operations when the bias is $\Sigma h_k$. In all cases, add/subtract operations are performed for at most N/2 tap weights.

A variation on this system design that sometimes might be more attractive is to always employ a $-\Sigma h_k$ bias and always perform additions, no matter what the majority input data type, but to perform a negation on the final accumulated output value whenever the input-bit-type majority is one. (Depending on accuracy requirements, a simple conditional bit-inversion—i.e., ones' complement negation—might suffice.)

Given the foregoing, a system may be constructed wherein we know that we must perform at most N/2 add/subtract operations in the computation of each output data sample. Another filter design advantage might ensue from such a system: If the maximum speed of the summation elements being employed is a limiting factor in determining the maximum length of the pulse-shaping filter—for a given input data rate—this computational savings can be recognized as a means of saving processing time, thereby permitting the use of longer filters (or, as a means of building filters that run at higher data rates).

Rather than employing a biased summation, an alternative implementation would consist of pairing-up tap weights—storing, say, $h_0+h_1$ and $h_0-h_1$ rather than $h_0$ and $h_1$. Then, a single add/subtract operation of one of these two values would suffice for both taps' contributions to the filter's output value. While this approach would also halve the number of add/subtract operations, while not increasing data storage requirements and not requiring circuitry for determining the majority bit type, it would, however, require bit-type analysis circuitry on each pair of taps and it would not seem to provide the option we've just mentioned of never requiring subtractions. Furthermore, it would always require approximately N/2 add/subtract operations whereas the method we've outlined requires at most N/2, depending on the data.

While we've been focusing on pulse-shaping filters, the technique of using a bias offset and performing only half the additions normally needed can also be employed in the design of many other kinds of filters, including for example, digital filters associated with sigma delta analog to digital converters (such as that which is disclosed in U.S. Pat. No. 4,746,899, issued to Swanson et al. on May 24, 1988, which is hereby incorporated by reference). In the system disclosed in the Swanson reference, the filter can be implemented using the foregoing technique by, for example, simply using the $-\Sigma h_k$ bias and doubling tap coefficients. Then, the need to store or create negated tap coefficients and to multiplex (mux) the possibly negated tap coefficients can be avoided, thereby saving hardware. This technique can be used in filters that process one-bit data treating an input zero bit as zero rather than −1. In this case we design the same kind of system we've described previously, but the tap coefficients are not doubled and the bias value is either zero or $\Sigma h_k$ depending on whether the majority input bit type is zero or one. When zeros are in the majority at most N/2 additions are performed, and with a majority of ones present it's at most N/2 subtractions. Alternatively, by using a bias offset of zero or $-\Sigma h_k$ and conditionally negating the output value, we can build the filter in a way that always performs at most N/2 additions (i.e., no subtractions are required).

Finding the Majority Input Bit Type

Figure 5D:
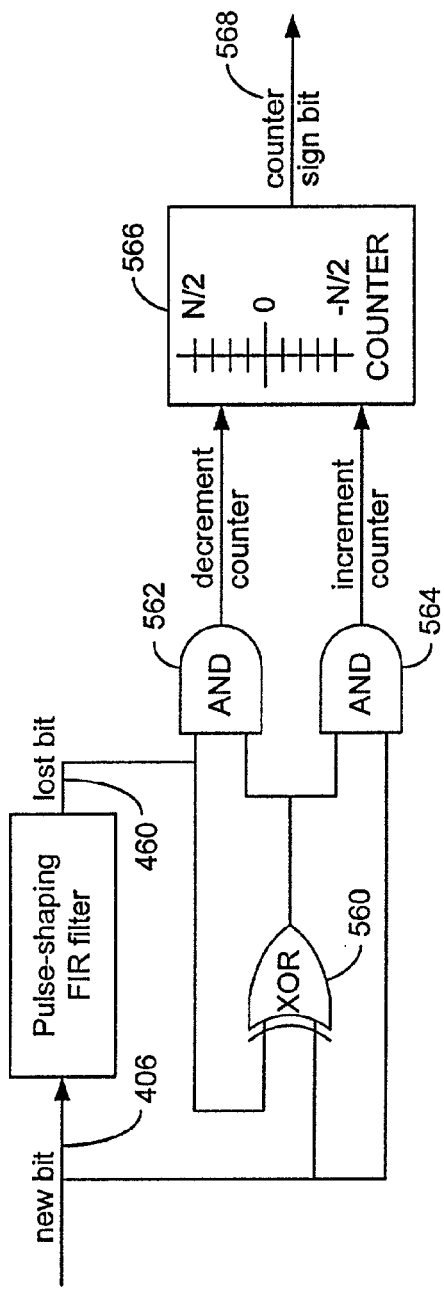
FIGS. 5D and 5E are block diagrams showing mechanisms for determining the majority input-bit type.

FIG. 5D is a block diagram of a circuit for determining the majority input-bit type. This circuit performs the task of determining, at the time each output bit is to be computed, and whether the majority of input bits involved in the pulse-shaping filter's processing are ones or zeros. Various techniques might be employed to do this, for example: Let's start the system with, say, all zero bits at the outputs of the delay chain elements such as the delay elements 404, 432, 440, and 452 illustrated in FIG. 5A. (These are the system's "initial conditions" and no matter how the system is built, or what values they are given, the first N−1 data output values, but only those values, would be affected by this choice.) The system for determining the majority input bit type includes a counter 566, and a logical circuit having an "exclusive or" gate 560 and two "and" gates 562 and 564 coupled to the digital filter 500. The counter 566 is capable of counting from −N/2 to N/2 if N is even, and from −(N+1)/2 to (N−1)/2 if N is odd, and is initialized to a value of −N/2 or −(N+1)/2, respectively. As each new input data bit is encountered by the pulse-shaping finite impulse response (FIR) filter 500, all the previous data bits are shifted across the top delay chain, resulting in a bit being "lost" from the delay output of the last stage in the filter 500. As this occurs, the counter 566 needs to be updated to reflect how the new input bit and the loss of the old input bit affects the majority input bit type. When two zero bits occur as the new bit and the lost bit, or when two one bits occur, the counter 566 is not updated, as no change will have occurred in the majority of input bits present—in fact, the total number of one and zero bits will not have changed, just their locations. When a new one bit comes in and a zero bit is lost, however, the logic provided by the "exclusive or" gate 560, and the "and" gates 562 and 564, increments the counter 566. Similarly, the counter 566 is decremented when the new bit is a zero and the lost bit is a one. After each counter 566 update we can just interrogate the counter's sign bit 568 to learn whether the input data currently being processed have a majority of ones or a majority of zeros.

Figure 5E:
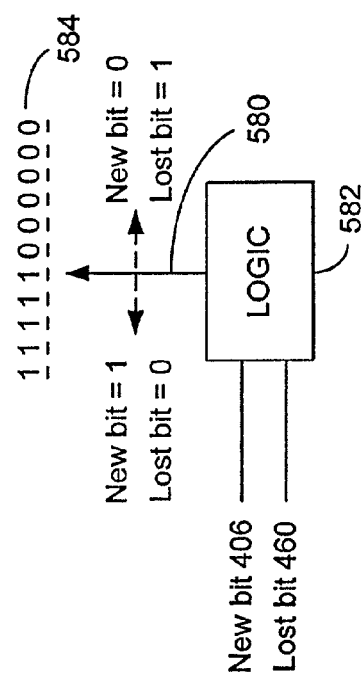

FIG. 5E shows another mechanism that can be employed to determine the majority input-bit type. The mechanism uses the new bit 406 and the lost bit 460, and logic 582 to logically position a pointer 580. When the new bit and the lost bit are different, the pointer is repositioned to reflect the new majority input bit type. For example, when the new bit 406 is a "1" and the lost bit is a "0," the pointer is moved to point at a different register 584. In FIG. 5E, for example, the pointer 580 is moved to the left, whereas if the new bit 406 is a "0" and the lost bit is a "1, " the pointer 580 is moved to the right.

Figure 6A:
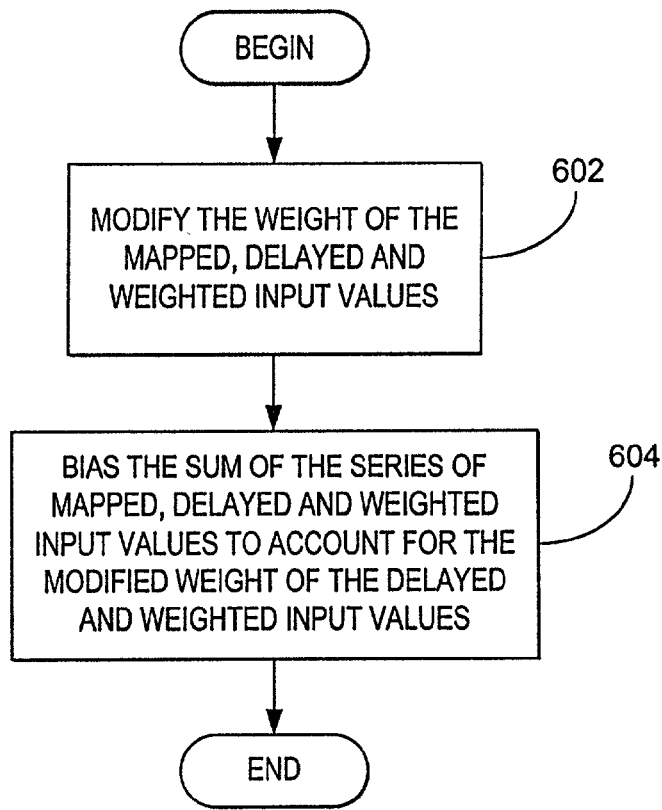
FIGS. 6A–6E are flow charts presenting exemplary steps used to practice low-power pulse-shaping digital filtering.

FIG. 6A is a flow chart illustrating exemplary process steps that can be used to develop the foregoing digital filter. First, a digital filter has been defined that implements a sum of a series of input values that are delayed and weighted by weights $\{h_0, h_1, \ldots, h_{N-1}\}$ to provide the desired digital filter response. Then, this digital filter is modified by mapping the input values (e.g. from {−1, 1} to {0, 1}), modifying the weights $\{h_0, h_1, \ldots, h_{N-1}\}$ and by biasing the sum of the delayed and weighted input values. This is depicted in blocks 602 and 604.

Figure 6B:
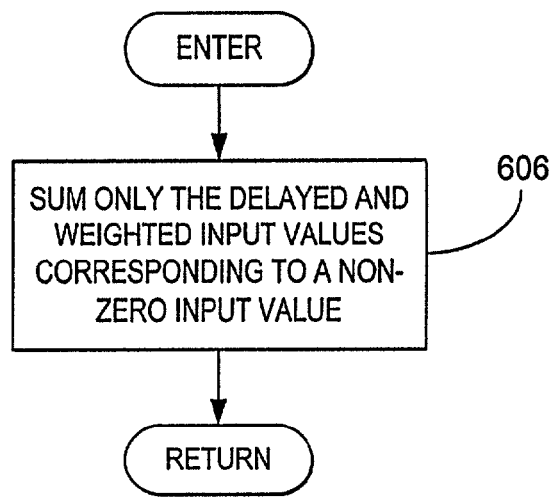

FIG. 6B is a flow chart illustrating additional exemplary process steps that can be used to practice the foregoing digital filter. By modifying the input values or the weights $\{h_0, h_1, \ldots, h_{N-1}\}$ properly, many of the values that would otherwise be weighted by weights $\{h_0, h_1, \ldots, h_{N-1}\}$ are zero, and add nothing to the digital filter output. In such cases, these operations may be skipped by summing only those delayed and weighted input values that are non-zero. This is depicted in block 606.

Figure 6C:
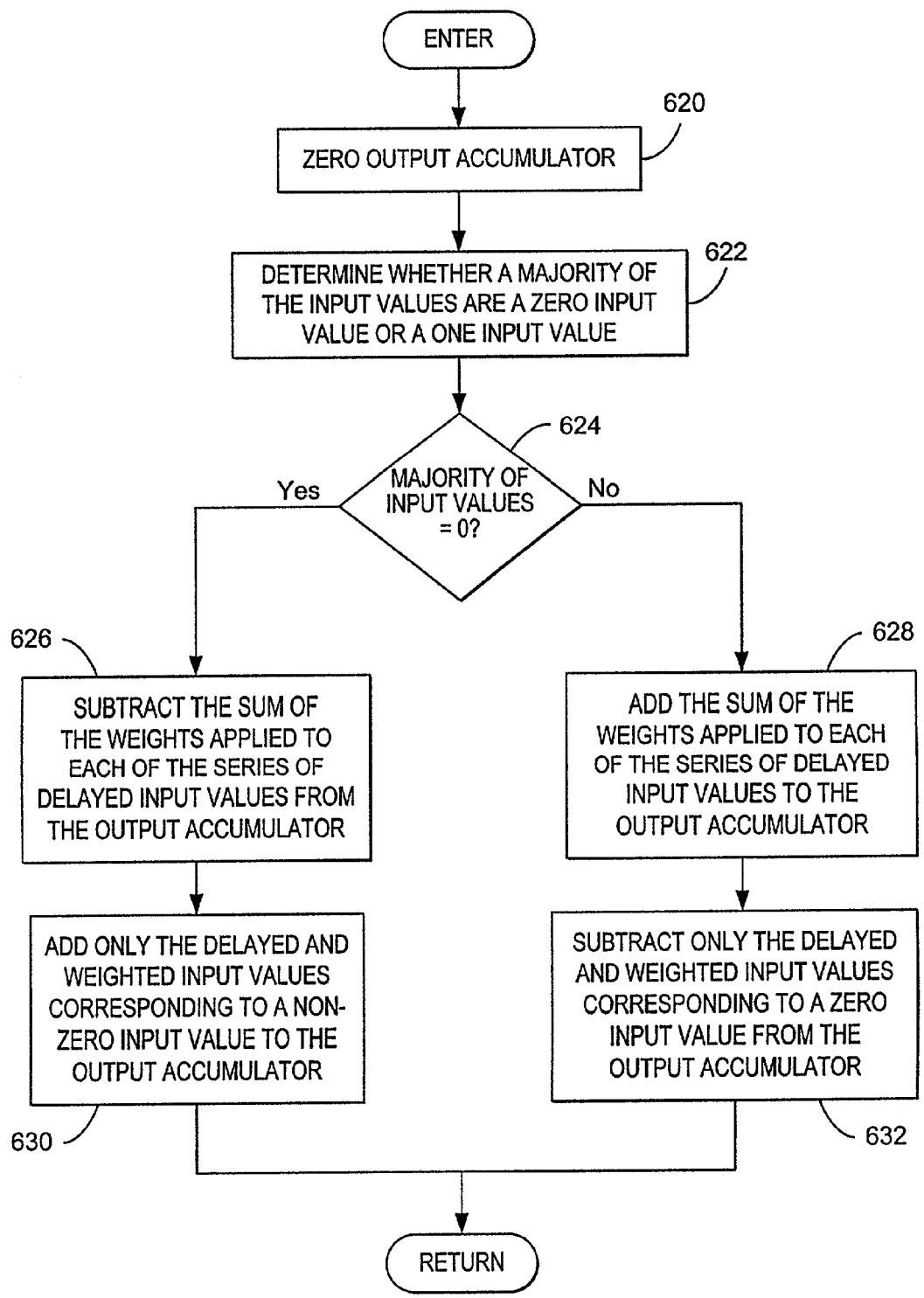

FIG. 6C is a flow chart illustrating additional exemplary process steps that can be used to practice the foregoing digital filter. After zeroing 620 the output accumulator, a determination of the majority input bit-type is performed, as shown in block 622. If the majority of input values is zero, the sum of the weights $\{h_0, h_1, \ldots, h_{N-1}\}$ applied to each of the series of delayed input values is subtracted from the output accumulator, and only the delayed and weighted input values corresponding to non-zero input values are summed, as shown in blocks 626 and 630. If, however, the majority of input values are non-zero (i.e. "1" for an input stream comprising only ones or zeros), the sum of the weights $\{h_0, h_1, \ldots, h_{N-1}\}$ applied to each of the series of delayed input values is added to the output accumulator, and only the delayed and weighted input values corresponding to zero input values are subtracted from it, as shown in blocks 628 and 632. The result is a savings of additions/subtractions, and consequently a power savings. When actual multiplication operations are employed in computing the delayed and weighted input values, additional savings may be realized by skipping the tap multiplication operations for zero values.

Figure 6D:
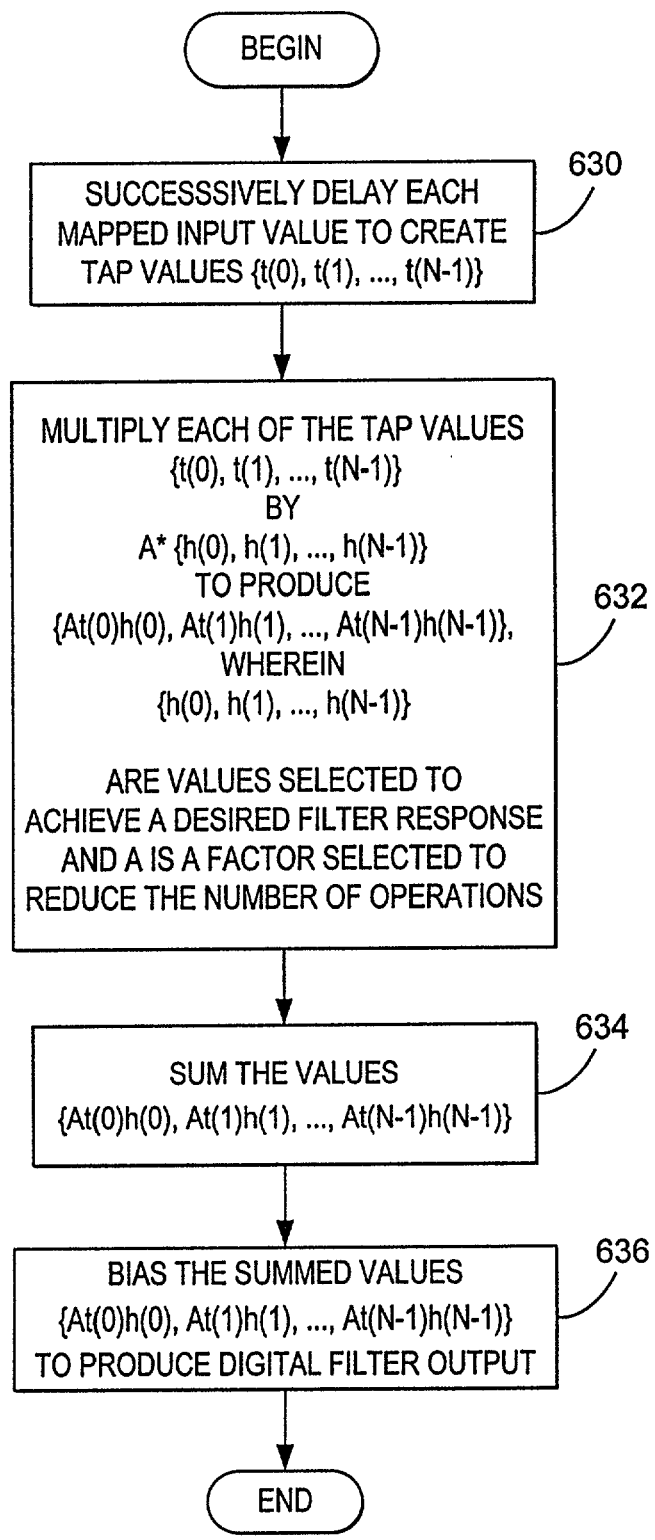

FIG. 6D is a flow chart illustrating the process steps to filter a series of input values $\{x_0, x_1, \ldots, x_{N-1}\}$. First, each input value is successively delayed and mapped to an appropriate sequence of tap values $\{t_0, t_1, \ldots, t_{N-1}\}$, as shown in block 630. For example, the input sequence $\{1, -1, -1, 1, -1\}$ maps to the sequence $\{1, 0, 0, 1, 0\}$ as $\{x_0, x_1, \ldots, x_{N-1}\}$ maps to $\{t_0, t_1, \ldots, t_{N-1}\}$. In this case, the factor A is selected as 2. Similarly, the input sequence $\{1, -1, -1, 1, -1\}$ may be mapped to the sequence $\{2, 0, 0, 2, 0\}$, in which case, the factor A is selected as 1.

Next, the tap values are multiplied by $A \cdot \{h_0, h_1, \ldots, h_{N-1}\}$ to produce $\{At_0 h_0, At_1 h_1, \ldots, At_{N-1} h_{N-1}\}$, as shown in block 632. The values $\{h_0, h_1, \ldots, h_{N-1}\}$ are weight values selected to achieve a desired filter response, and A is a factor selected to reduce the number of operations performed in filtering the input data stream. Then, the values $\{At_0 h_0, At_1 h_1, \ldots, At_{N-1} h_{N-1}\}$ are summed 634, producing $$\sum_{k=0}^{N-1} At_k h_k.$$

A bias is then applied 636 to the summed values to produce the digital filter output to compensate for the modified $\{At_0 h_0, At_1 h_1, \ldots, At_{N-1} h_{N-1}\}$ values in the digital filter.

Figure 6E:
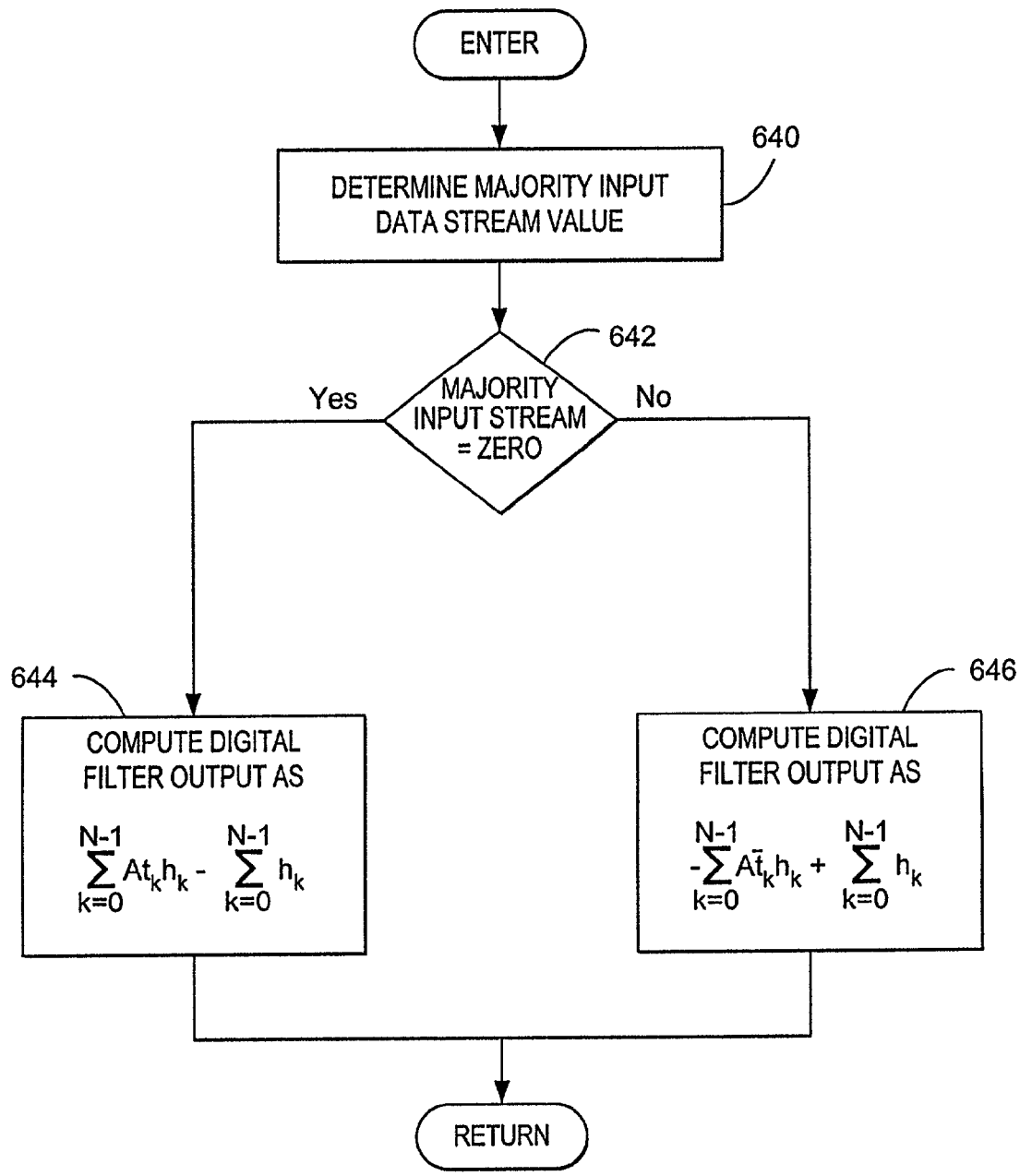

FIG. 6E is a flow chart illustrating further process steps used in one embodiment of the present invention where the mapped input data has the values {0, 1}. First, the majority input bit type is determined 640. Then if the majority of the bits in the mapped input stream $t_k$ are zero, the digital filter output is computed as $$\sum_{k=0}^{N-1} At_k h_k - \sum_{0}^{N-1} h_k.$$

If, however, the majority of the bits in the input stream are non-zero, the digital filter output is computed as $$-\sum_{k=0}^{N-1} A\bar{t}_k h_k + \sum_{k=0}^{N-1} h_k,$$

where $\bar{t}_k$ denotes the inversion of bit $t_k$.

Application to BPSK and QPSK Modulation

The system described above is appropriate for a binary phase-shift keying (BPSK) modulation system. Another popular type of digital modulation system is quadrature phase-shift keying (QPSK).

Figure 7:
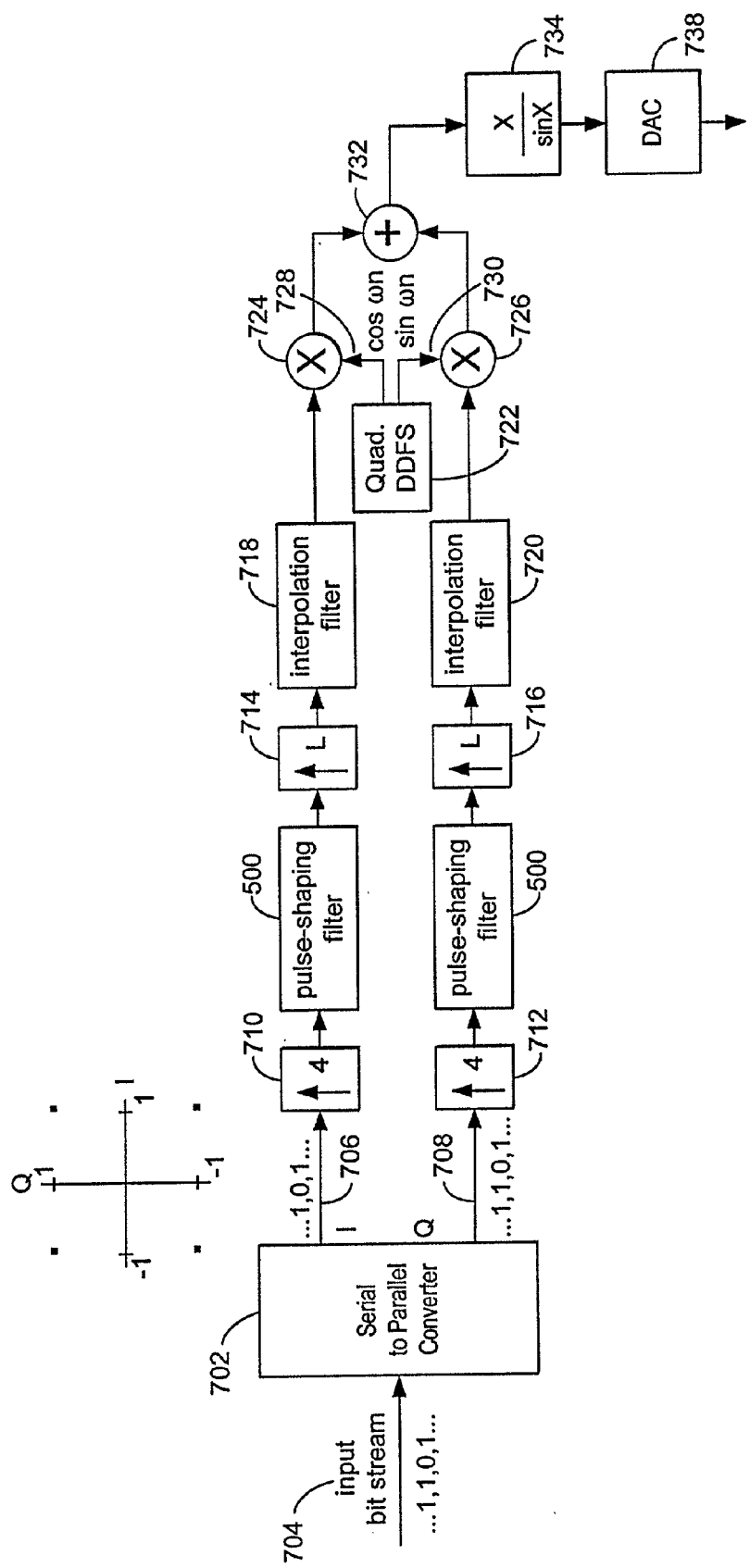
FIG. 7 is a block diagram showing application of the low-power pulse-shaping digital filter to a QPSK modulation system.

FIG. 7 is a block diagram of the application of the low-power pulse-shaping digital filter to a QPSK modulation system. In a QPSK system, pairs of bits are taken from the input bit-stream 704, and each bit of a pair is processed by one of two separate channels, called the in-phase (I) channel 706 and the quadrature (Q) channel 708. The data rate for each of the two channels 706 708 is half the input data 704 rate. FIG. 7 shows additional components frequently found in such systems, such as interpolation filters 718, 720 and digital frequency synthesizers 722, but the basic operation of each pulse-shaping filter 500 can proceed as we've described above. That is, we just build two such pulse-shaping filters 500, one for each channel, or time share a single filter.

Application to QAM Modulation

FIG. 8 is a diagram showing an increasingly popular modulation scheme: quadrature amplitude modulation (QAM). QAM can be implemented in various degrees of sophistication. FIG. 8 illustrates "16-QAM," which takes four data bits at a time from the incoming bit-stream 804, i.e., processes four-bit "symbols" and forms each four-bit symbol into two bit-pairs, sending one bit-pair onto each of the I channel 806 and the Q channel 808. The constellation diagram of FIG. 8 shows how the four amplitude modulation levels for each channel can be associated with the 16 equally-spaced points (16 symbols) in the I-Q plane defined by the quadrature axis 810 and the in-phase axis 812. Now, unlike QPSK (which can be considered "4-QAM"), we require more elaborate pulse-shaping filters so that the two-bit data can be handled.

Figure 9:
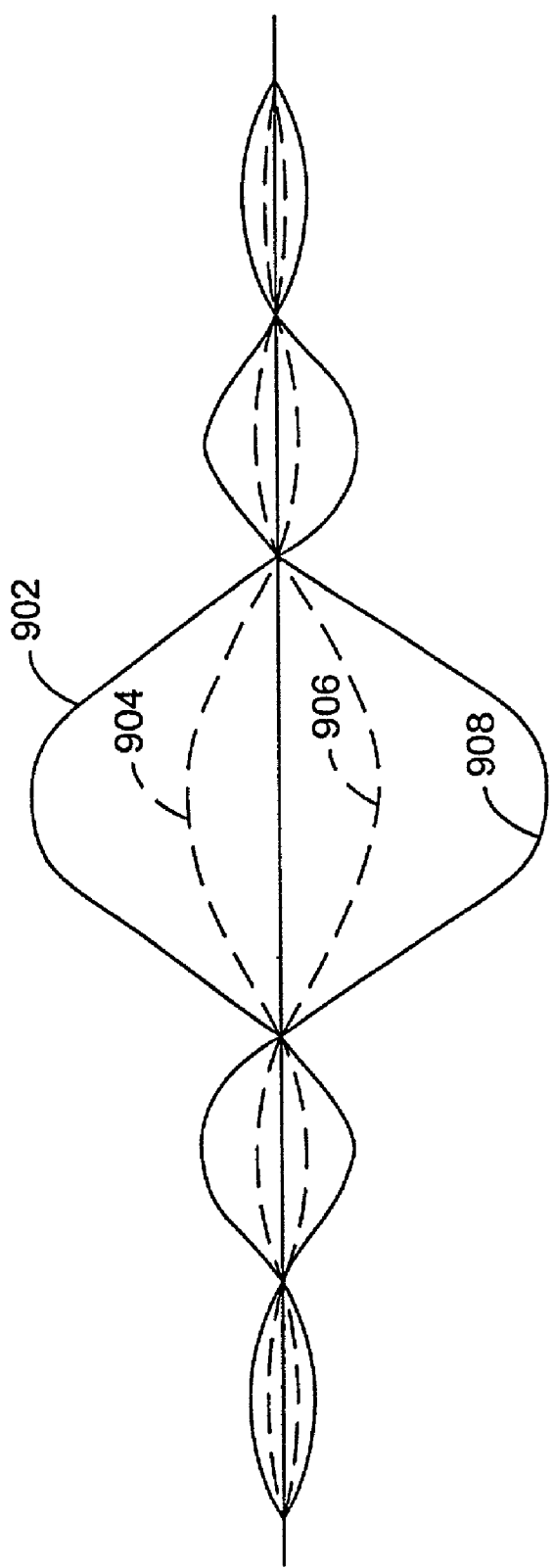
FIG. 9 is a diagram illustrating four possible impulse responses for each channel's bit pair in a 16-QAM system.

FIG. 9 shows that each channel's pulse-shaping filter (and the subsequent fixed digital and analog processing) must produce one of four possible responses, 902, 904, 906, and 908, depending on the particular bit-pair being processed. These responses require scaled copies of the type of pulse-shaping filter response already discussed.

A very straightforward approach to implementing these pulse-shaping filters would be to build a simple FIR filter employing tap multipliers that accept signed three-bit input data (which conveniently encodes the values ±¼ and ±¾). While conceptually simple, this would be somewhat wasteful since two-bit data on each channel should be employable as each channel's symbols have only four possibilities at each discrete time point. It would also be desirable to employ multiplierless filters, as we did previously. That can be accomplished as follows:

In a manner similar to the QPSK case, where each bit in a channel's bit-stream uses the zero state to represent the negative of the one state (i.e., "1" means one, and "0" means −1) we treat each of the two bits of each 16-QAM channel similarly. For example, denoting the bit-pair of a channel's pulse-shaping filter by ab we can define the values of these bits as follows:

$$a = \begin{cases} 0 \text{ means } -1/2 \\ 1 \text{ means } 1/2 \end{cases}$$

$$b = \begin{cases} 0 \text{ means } -1/4 \\ 1 \text{ means } 1/4 \end{cases}$$

Then, for the bit-pair ab we have the relationship described in Table I below:

TABLE I

| a | b | |
|---|---|---|
| 1 | 1 | ⇒ 3/4 |
| 1 | 0 | ⇒ 1/4 |
| 0 | 1 | ⇒ −1/4 |
| 0 | 0 | ⇒ −3/4 |

Notice that this encoding of the bit-pairs ab is for the convenience of the filter design. It would be an easy matter to implement in logic circuitry a translation table that identifies other desired bit-pair patterns with the bit-pair patterns associated with the numbers ±¼ and ±¾ in the above table.

Figure 10:
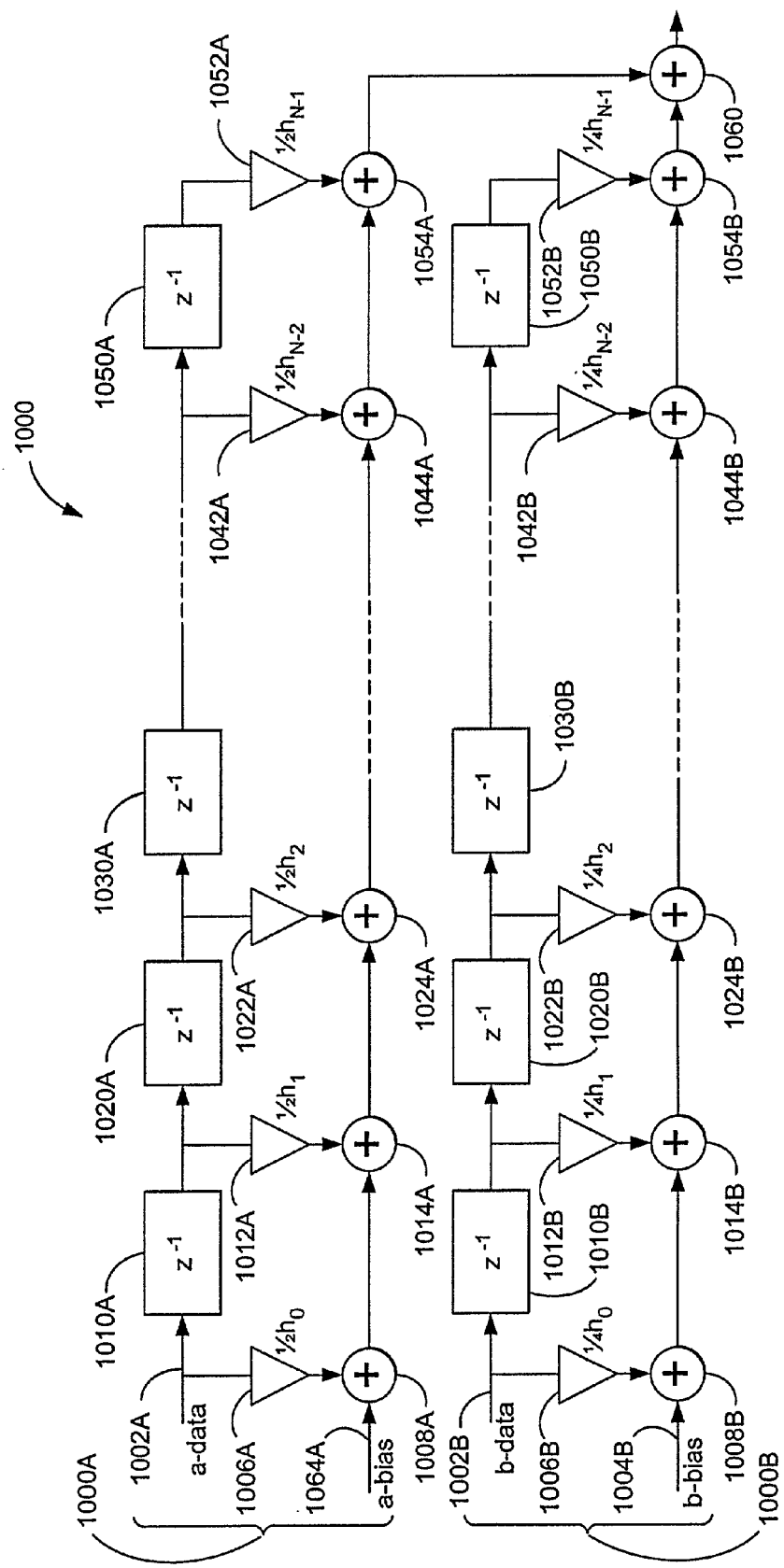
FIG. 10 is a block diagram showing a bias added to an N-tap finite impulse response pulse-shaping filter for one 16-QAM channel.

FIG. 10 is a block diagram showing how this encoding can be used to implement two multiplierless FIR filters in the manner previously described. Here, one filter 1000A accepts the one-bit a-data and the other filter 1000B accepts the one-bit b-data. The a-data tap-coefficients are modified from their normal values as follows: First, we use (½)$h_k$ for the coefficients $h_k$ of the a-data filter 1006A, 1012A, 1022A, 1042A, and 1052A, and (¼)$h_k$ for the coefficients $h_k$ of the b-data filter 1006B, 1012B, 1022B, 1042B, and 1052B. With the understanding that these are the values of the two filters' coefficients, in terms of the actual filter-tap values, but continuing to refer to the coefficients of these two filters simply as $h_k$ the same manipulations, i.e., using $-\Sigma h_k$ and 2$h_k$, etc., can be employed to obtain low-power implementations of the 16-QAM filters. One adder 1060 needs to be employed to combine the output bit-streams of the a-data and the b-data filters, as shown in FIG. 10.

The same principles can be applied to other QAM systems. For 64-QAM, for example, we just require three separate multiplierless filters on each channel: An a-data filter, a b-data filter, and a c-data filter, where the filter coefficients are scaled by ½, ¼, and ⅛, respectively.

A variation on this system design that might be advantageous is to keep all channels' coefficients the same—i.e., let the a-channel, b-channel, etc., all have the original $h_k$ tap weights, and let all channels process the input data as described for the simple BPSK case. Then, when the channels' outputs are added together, it would be a simple matter to employ hard-wired shifts to account for the different weightings (e.g., ½, ¼. . . ) on the different channels. A further extension of this variation would be to employ just a single filter channel, with the a-data, b-data, etc. interleaved or time-multiplexed to obtain the equivalent of multiple channels.

Application to Linear-Phase Filters

Figure 11:
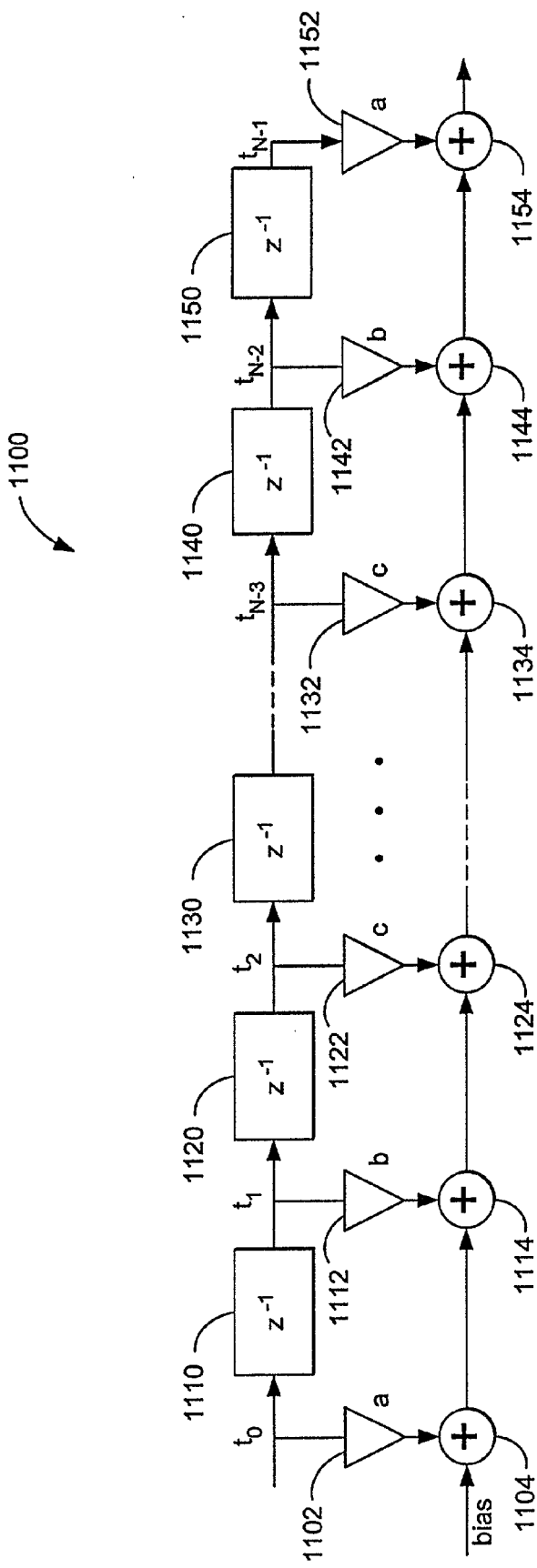
FIG. 11 is a block diagram of an exemplary linear-phase finite impulse response digital filter.

FIG. 11 shows application of the low-power pulse-shaping filter principles described above to a linear phase digital filter 1100. In a linear-phase digital filter, the tap weights $\{h_0, h_1, h_2, \ldots, h_{N-3}, h_{N-2}, h_{N-1}\}$ described earlier have even (or odd) symmetry. That is, they can be defined as one or more tap weight pairs $\{h_{i-1}, h_{N-i}\}$ wherein $h_{i-1} = h_{N-i}$ (or $h_{i-1} = -h_{N-i}$) for $i=\{, 1, 2, 3, \ldots, N/2\}$ when N is even and $i=\{1, 2, 3, \ldots, (N+1)/2\}$ when N is odd, with each tap weight pair $\{h_{i-1}, h_{N-i}\}$ associated with a tap value pair $\{t_{i-1}, t_{N-i}\}$. To simplify notation, the gain of each tap weight in a tap weight pair $\{h_{i-1}, h_{N-i}\}$ can be represented by a single gain variable such as gains a, b, and c shown in FIG. 11. Hence, in the even-symmetry case, for example, tap weight 1102 has the same weight as tap weight 1152, tap weight 1112 has the same weight as tap weight 1142 and so on.

In the event that a filter processing a stream of one-bit data (with, as above, zero and one input bits interpreted as ±1) is a linear phase filter (now illustrated by the even symmetry and even number of tap coefficients case, but, in the explanation below, it will be clear that any linear-phase symmetry can also be accommodated through simple changes in the details)—there's no easily apparent way to save on computations by exploiting the linear-phase feature. If the filter were to actually employ multiplication operations, about half the multiply operations could be saved by reorganizing the way in which the additions are performed. But there are no multiplication operations to save when processing one-bit data—so it seems we're required to perform N–1 additions per output sample, just as would be required without linear phase.

As disclosed above, it is possible to reduce these addition operations to at most N/2, but this doesn't in any way exploit the filter's linear-phase feature. It is also possible to take advantage of the symmetric coefficient pattern of the linear phase digital filter to reduce the required number of addition/subtraction operations in such a filter even further . . . to at most N/3.

Consider the possible data-value combinations for the pair of bits associated at some point in time with equal-coefficient taps in the linear-phase filter of FIG. 11. There are three different possibilities: a zero and a one, in which case the taps' contributions to the output sum cancel one another; a pair of ones, in which case we require that twice the common tap value be added to the output sum; and a pair of zeros, in which case we require that twice the common tap value be subtracted from the output sum. In the spirit of the preceding discussion, we can employ biasing offsets to avoid actually performing some of the add/subtract operations. We will want to avoid the computations associated with the largest of the three sets of possible kinds of tap-pairs to achieve the greatest savings. Thus, for k=0, . . . , (N/2)–1, we need to identify the set to which each tap-pair belongs, as follows:

Let $A_k = x(k) \oplus x(N-1-k) (\rightarrow A_k = 1$ if and only if one bit is 0 and one is 1).

Let $B_k = x(k) \cap x(N-1-k) \rightarrow B_k = 1$ if and only if both bits are 1).

Let $C_k =$ not $(x(k) \cup x(N-1-k))(\rightarrow C_k = 1$ if and only if both bits are 0).

Since for each k exactly one of $A_k$, $B_k$, $C_k$ is one, we can build circuitry for computing only, say, $A_k$ and $B_k$.

Figure 12:
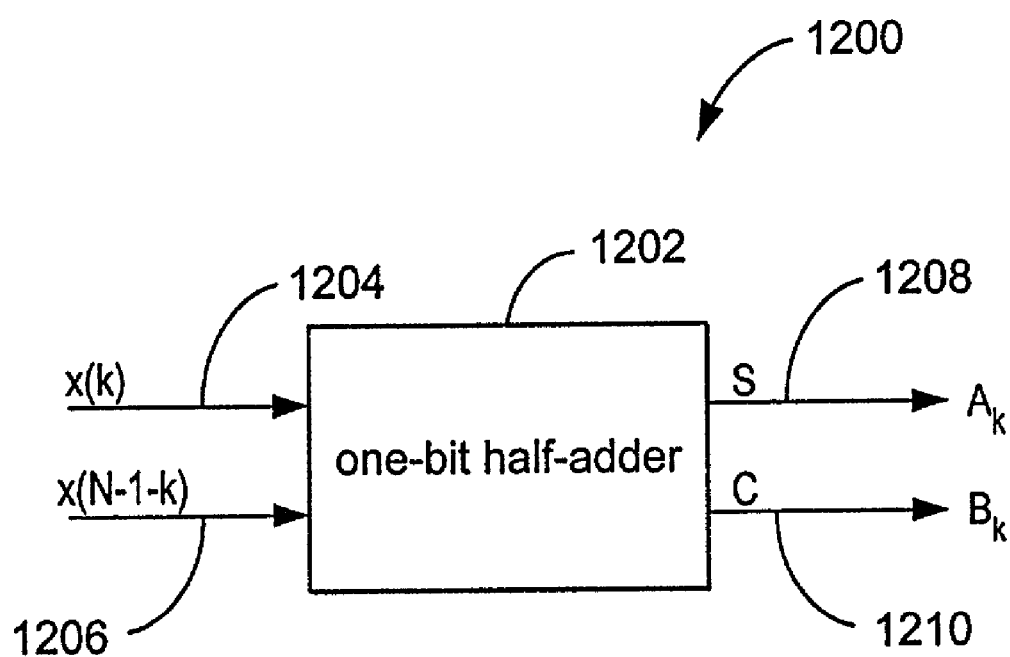
FIG. 12 is a half-adder used to diagnose a bit pattern of a bit-pair x(k), x(N−1-k)

FIG. 12 shows one possible apparatus for computing $A_k$ and $B_k$. The apparatus comprises a half adder 1202. Thus, for N even (although we can also treat the N odd case) we require N/2 half-adders 1202 whose outputs can be used to identify the optimal bias value and the corresponding tap-coefficient modifications that should be used in evaluating the filter's output value. There are three possible cases, as shown in the Table II:

TABLE II

| Case | Bias offset | when $A_k = 1$ | when $B_k = 1$ | when $A_k = B_k = 0$ |
| --- | --- | --- | --- | --- |
| Case A: (at least 1/3 of the N/2 tap-pairs are 0 & 1) | 0 | — | $2h_k$ | $-2h_k$ |
| Case B: (at least 1/3 of the N/2 tap-pairs are 1 & 1) | $2\Sigma h_k$ | $-2h_k$ | — | $-4h_k$ |
| Case C: (at least 1/3 of the N/2 tap-pairs are 0 & 0) | $-2\Sigma h_k$ | $2h_k$ | $4h_k$ | — |

By employing the computations indicated in the appropriate row of Table II, we can eliminate at least ⅓ of the N/2 tap-pair add/subtract operations. Therefore we must perform at most (⅔)×(N/2)=N/3 add/subtract operations. Notice that, when computing the 2N/3 savings, rounding works in our favor. For example, if we were building a 20-tap linear-phase filter, for any distribution of input data bits across the 20 taps, there would always be (at least) four of the ten tap-pairs that qualify for one of the three cases (A, B, C, in the above table) since each tap-pair must qualify for exactly one case and all three cases therefore can't have at most three tap-pairs. Thus, we need never process more than six add/subtract operations, which yields a 14/20=70% savings in add/subtract operations.

The linear-phase low-power pulse-shaping digital filter also comprises a circuit for detecting that at least ⅓ of the half adder 1202 sum 1208 or carry 1210 outputs are high.

Figure 13:
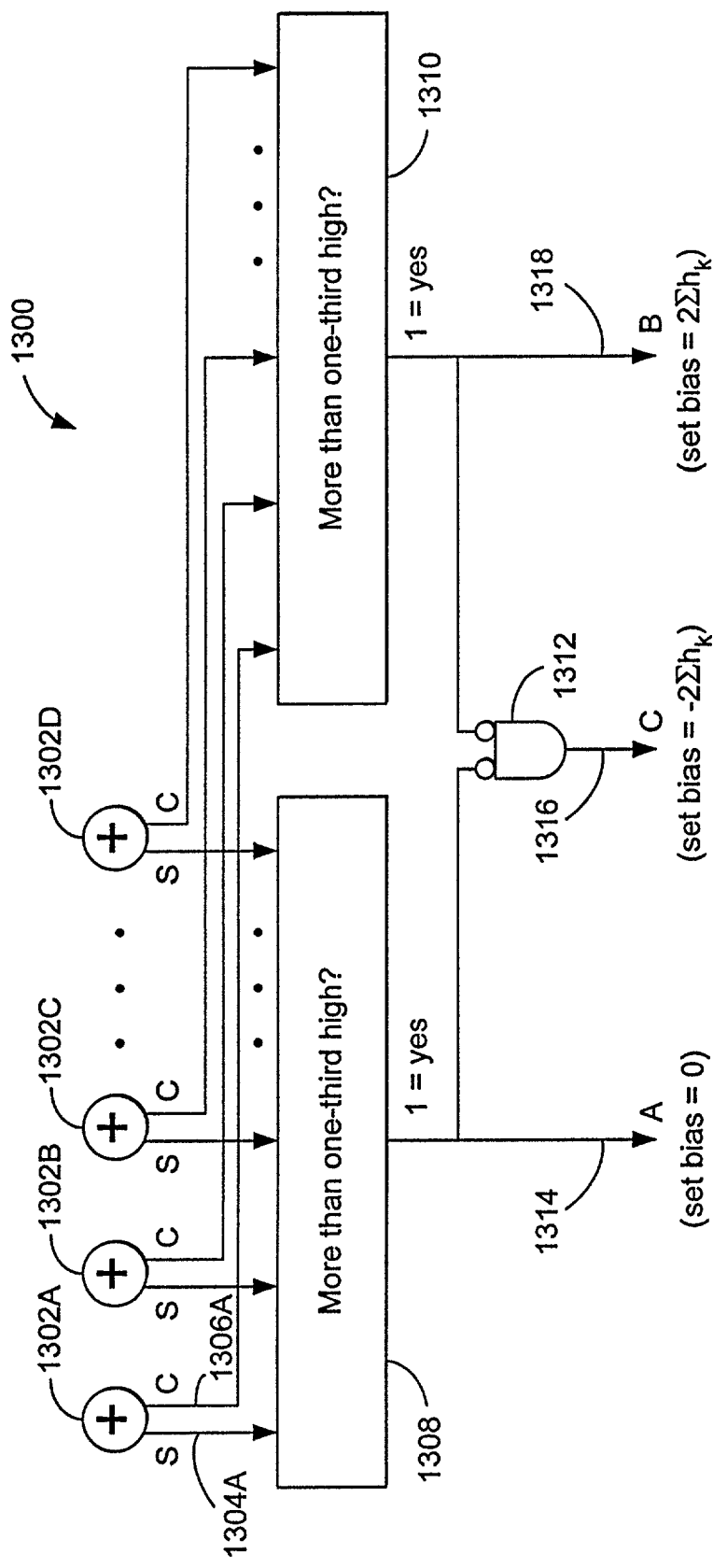
FIG. 13 is a block diagram of an apparatus for finding the majority input bit-pair type.

FIG. 13 is a block diagram illustrating an exemplary system for detecting when at least ⅓ of the half adder 1202 sum or carry outputs are high. Depending on the desired level of complexity in circuit design, the optimal choice between the A or B outputs (should they both be high for some set of input bits) might be made by comparing the actual number of high inputs and selecting the case with the largest number. Alternatively, we might just make an arbitrary choice—say, always pick A 1314. In addition to the circuitry shown in FIG. 13, the individual $S_k$ and $C_k$ bits 1304A and 1306A are also used to select the specific type of add/subtract operation needed for each tap-pair, according to Table II above.

Application to General FIR Filters

It's also possible to employ the techniques discussed above to design completely general FIR digital filters, i.e., filters having B-bit two's-complement input data and M-bit tap-coefficients, where B and M are arbitrary positive integers. Our previous discussion concerning QAM pulse-shaping filters provides a structure for filters employing multi-bit input data that's suitable for this application; however appropriate modifications must be made to ensure that the input-data sign bits are processed correctly. Consider, for example, the input data to be scaled such that it has signed fractional values. That is, let's assume the B-bit input data is of the form $b_0.b_1b_2 \ldots b_{(B-1)})$, where $b_0$ is the sign-bit (having weight $-1$), $b_1$, has weight $\frac{1}{2}$, $b_2$ has weight $\frac{1}{4}$, etc. Thus, referring to each one-bit-data filter by the subscript number of its data bit, the tap weights for the bit-n filter (for n=0, 1, ..., B−1) should be scaled from their original $h_k$ values to become $2^{-n}h_k$ and the corresponding bias offset value for that one-bit-data filter should be, depending on whether the majority of the filter's input bits are zero or one, respectively, either 0 or $2^{-n}\Sigma h_k$ for n≠0 and either 0 or $-\Sigma h_k$ for n=0 (the sign bit).

Figure 14:
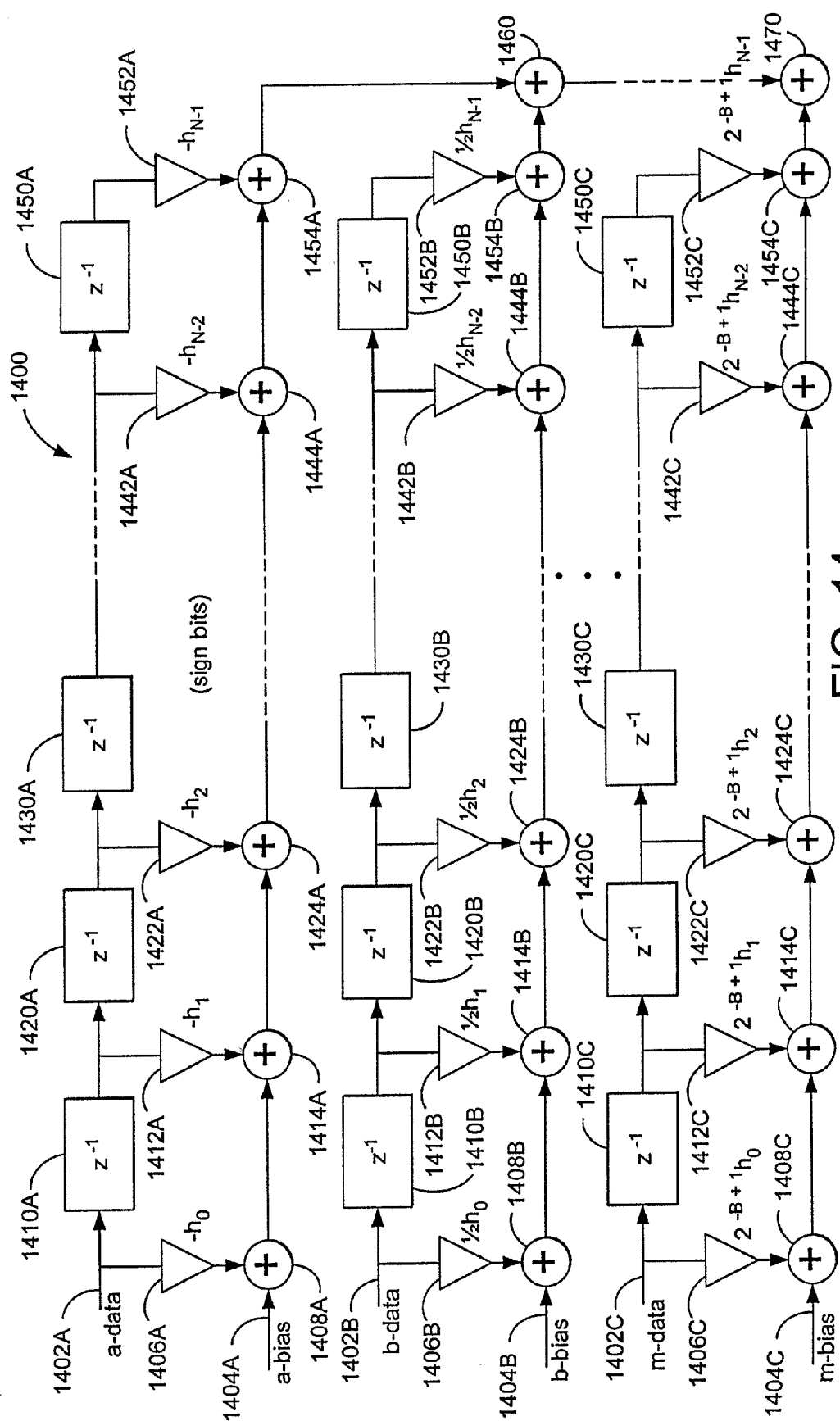
FIG. 14 is a block diagram showing a bias applied to a general N-tap finite impulse response digital filter that processes B-bit two's complement data.

FIG. 14 is a block diagram showing the application of a bias applied to a general N-tap finite impulse response digital filter having B-bit two's-complement input data and M-bit tap-coefficients, where B and M are arbitrary positive integers.

Setting aside linear-phase issues for the moment, for an N-tap filter with B-bit data (for N even), (B×N/2)+B−1 (at most) additions are used for the evaluation of each output data sample of the system. This number can be reduced further at the expense of increased data storage and retrieval circuitry, by combining the B bias additions into fewer additions Oust one addition, in the extreme) since all these offsets are ultimately accumulated into a common final value. A standard implementation of the same filter using Booth-encoded multipliers (with B even) would require N×[(B/2)−1]+N−1=(NB/2)−1 additions. While these totals are both close to NB/2, the number of operations required in the foregoing implementation is always higher, but only exceeds the Booth total by one add when just a single combined bias value is employed, rather than B such values. (Recall, however, the total for the foregoing implementation is an upper bound on the number of adds that will be performed. The actual number is data dependent, which is not the case for the Booth total.) In an implementation where parallel processing is employed, since different combinations of additions must be performed first (in parallel) before other additions can proceed, the specific sizes of N and B could well be the factor that determines which processing scheme would take less time overall. With both N and B even, the relation that would need to be satisfied for the foregoing approach to yield a faster overall system than the Booth-encoding approach is (N/2)+(B−1)<[(B/2)−1]+(N−1), which is equivalent to N>B+2.

Turning now to the case of general linear-phase FIR filters, the number of additions required for the system depicted in FIG. 14 is (at most) [B×(N/3)]+(B−1) while a Booth-encoded system would require {[(B/2)−1]×N/2}+(N−1) total additions. It can be shown, using these expressions, that the foregoing system requires fewer addition operations when B<6 and N is sufficiently large, namely N>12B/(6−B). Again, the comparison becomes even more favorable to our approach when fewer than B (combined) bias offset values are employed. In any event, if the concern is speed, and parallel processing is employed, the foregoing method is faster than the Booth-encoding approach when N/3+(B−1)<1+(B/2−1)+(N/2−1) which can be reduced to the simple relation N>3B.

Application to Transpose FIR Filter Configurations

Figure 15:
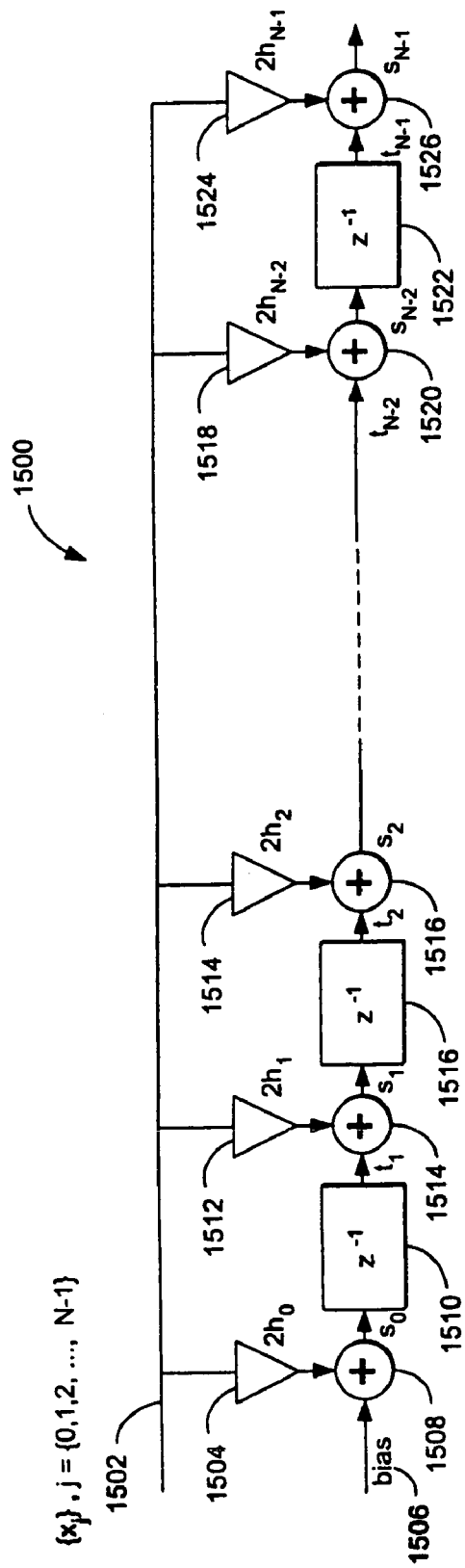
FIG. 15 is a block diagram of a low-power pulse-shaping finite impulse response digital filter in an N-tap transpose configuration.

An example of a transposed FIR filter is shown in FIG. 15. The above-described techniques can be employed for reducing the number of additions in FIR filters while implementing the transposed FIR filter 1500. FIG. 15 illustrates the use of $2h_k$ tap coefficients 1504, 1512, 1514, 1518, and 1524, and a $\pm\Sigma h_k$ bias 1506. A simple version of this system would employ a fixed $-\Sigma h_k$ bias and perform additions only when input values of one appear. Alternatively, an appropriate stream of $\pm\Sigma h_k$ values must be moving along the delay chain at the bottom of FIG. 15 so that, as options to avoid the addition of successive input data-sample values to the sum being accumulated arise, the full advantage can be taken of the data pattern that will be experienced. This is easily arranged if the input bit stream is stored in a shift register prior to its entry into the filter and if the "majority one/zero" decision is made in a manner as described previously, but this time operating on the shift register contents. As each $\pm\Sigma h_k$ bias value must be chosen, we simply refer to this majority circuit's output to determine the best choice based on the input bits that will subsequently be encountered by the filter as its output value is accumulated, starting from the bias value. Alternatively, the bias value can be added to the output data at the filter output, or elsewhere in a manner similar to the variations described for the direct form FIR case.

Figure 16:
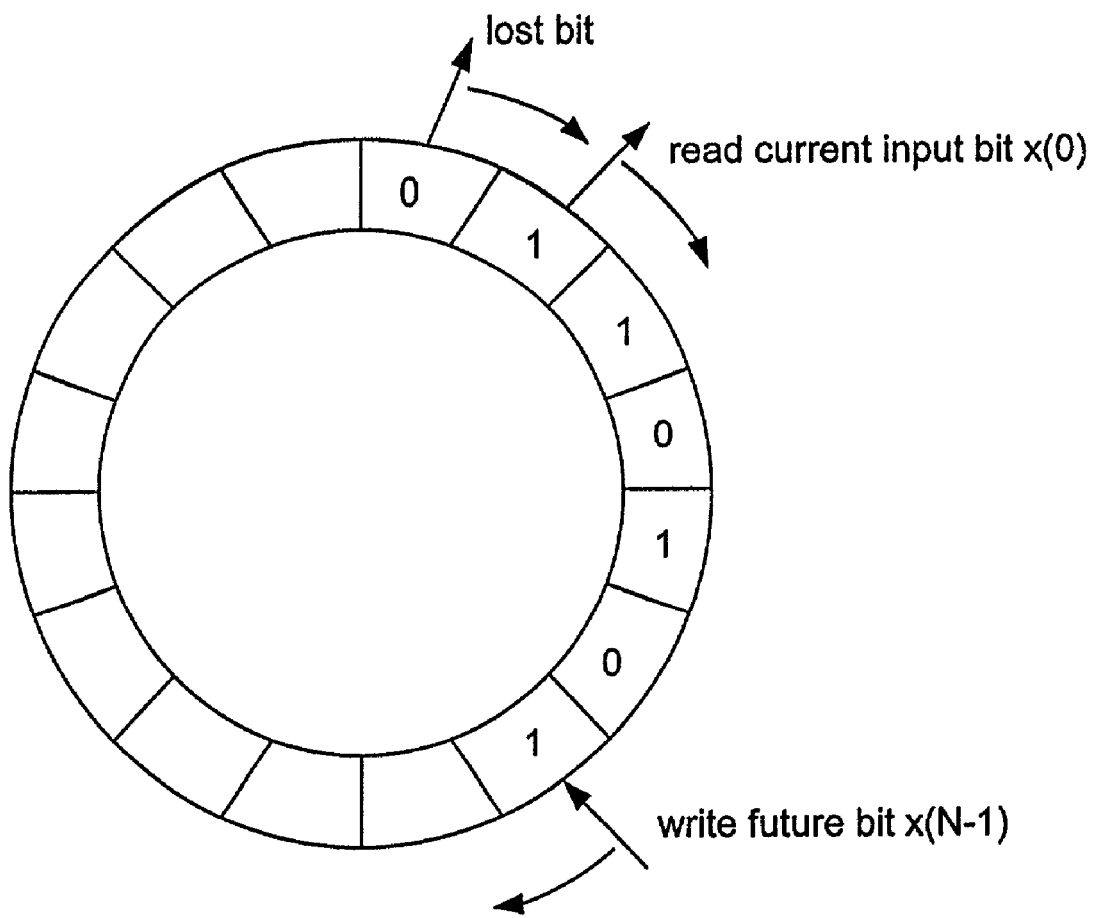
FIG. 16 is a diagram illustrating the circular read-write storage for N future bits.

FIG. 16 is a diagram illustrating a circular read-write storage for N future bits. This circular read/write storage arrangement can be used as an alternative to a standard shift register.

Additional Considerations

Consider a low power, linear phase, interpolating-by-four pulse-shaping filter implemented in polyphase form. The algorithm is independently applied to each polyphase branch. An accumulator is used in each branch to save area, and selective clock generation is applied to save power. Only one of the two cases is processed (that is, the processing of input bits mapped to ones or the processing of input bits mapped to zeros) and the filter coefficients are stored once in a register and routed to each accumulator or summation element.

Figure 17:
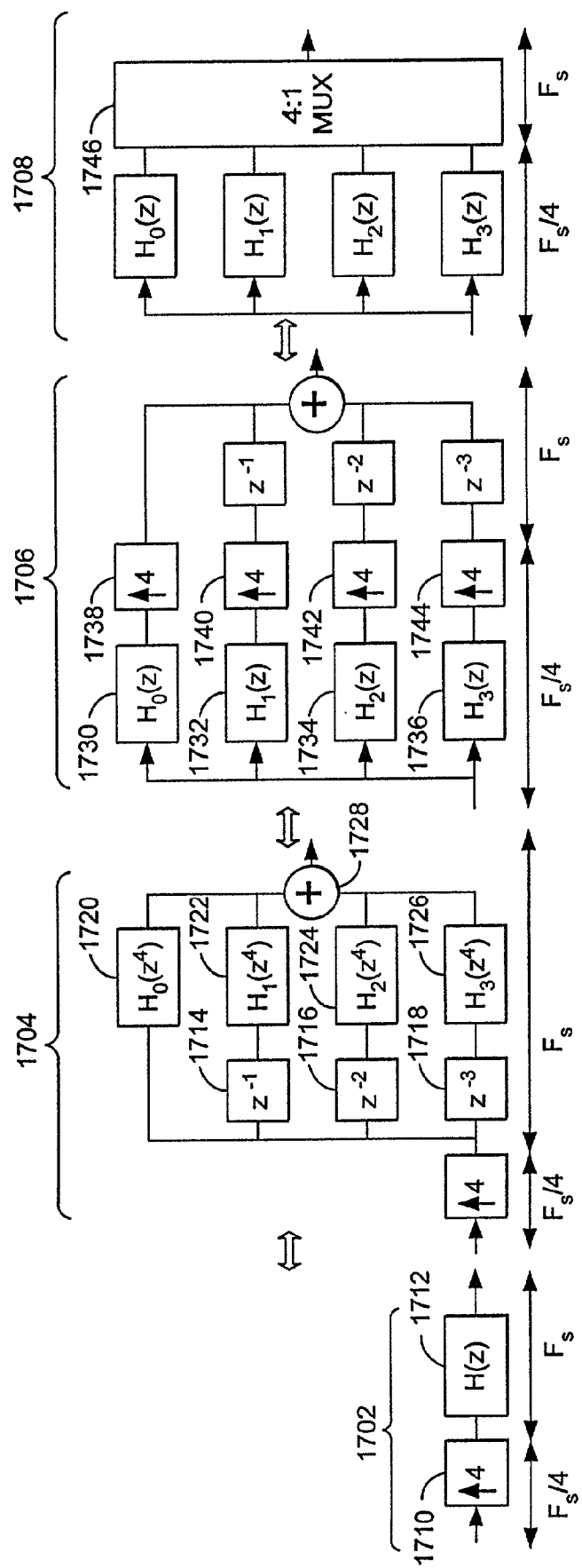
FIG. 17 is a polyphase implementation of an interpolate-by-four filter.

Since the algorithm does not treat zeros as zero, it is convenient to implement a filter that performs interpolation along with an expander in polyphase form because, in this form, the expander zeros are eliminated. FIG. 17 shows the transformnation of an interpolate-by-four filter into polyphase form. Filter 1712 can be expanded into delay elements 1714, 1716, and 1718, branch filters 1720, 1722, 1724, and 1726, and an adder 1728. For example, for a 10-tap (N=10) FIR filter:

$$H(z) = \sum_{k=0}^{9} h_k z^{-k}$$
$$= h_0 + h_1 z^{-1} + h_2 z^{-2} + h_3 z^{-3} + h_4 z^{-4} + h_5 z^{-5} +$$
$$h_6 z^{-6} + h_7 z^{-7} + h_8 z^{-8} + h_9 z^{-9}$$
$$= (h_0 + h_4 z^{-4} + h_8 z^{-8}) + z^{-1}(h_1 + h_5 z^{-4} + h_9 z^{-8}) +$$
$$z^{-2}(h_2 + h_6 z^{-4}) + z^{-3}(h_3 + h_7 z^{-4})$$
$$= H_0(z^4) + z^{-1}H_1(z^4) + z^{-2}H_2(z^4) + z^{-3}H_3(z^4).$$

Application of a noble identity (see, for example, P. P. Vaidyanathan, *Multirate Systems and Filter Banks* previously referenced) allows for the interchanging of the expander 1710 and filters 1720, 1722, 1724, and 1726 resulting in a filter structure 1706 in which the delay elements 1714, 1716, and 1718 have been moved through the new branch filters 1730, 1732, 1734, and 1736 and expanders 1738, 1740, 1742, and 1744. The four expanders

Figure 18:
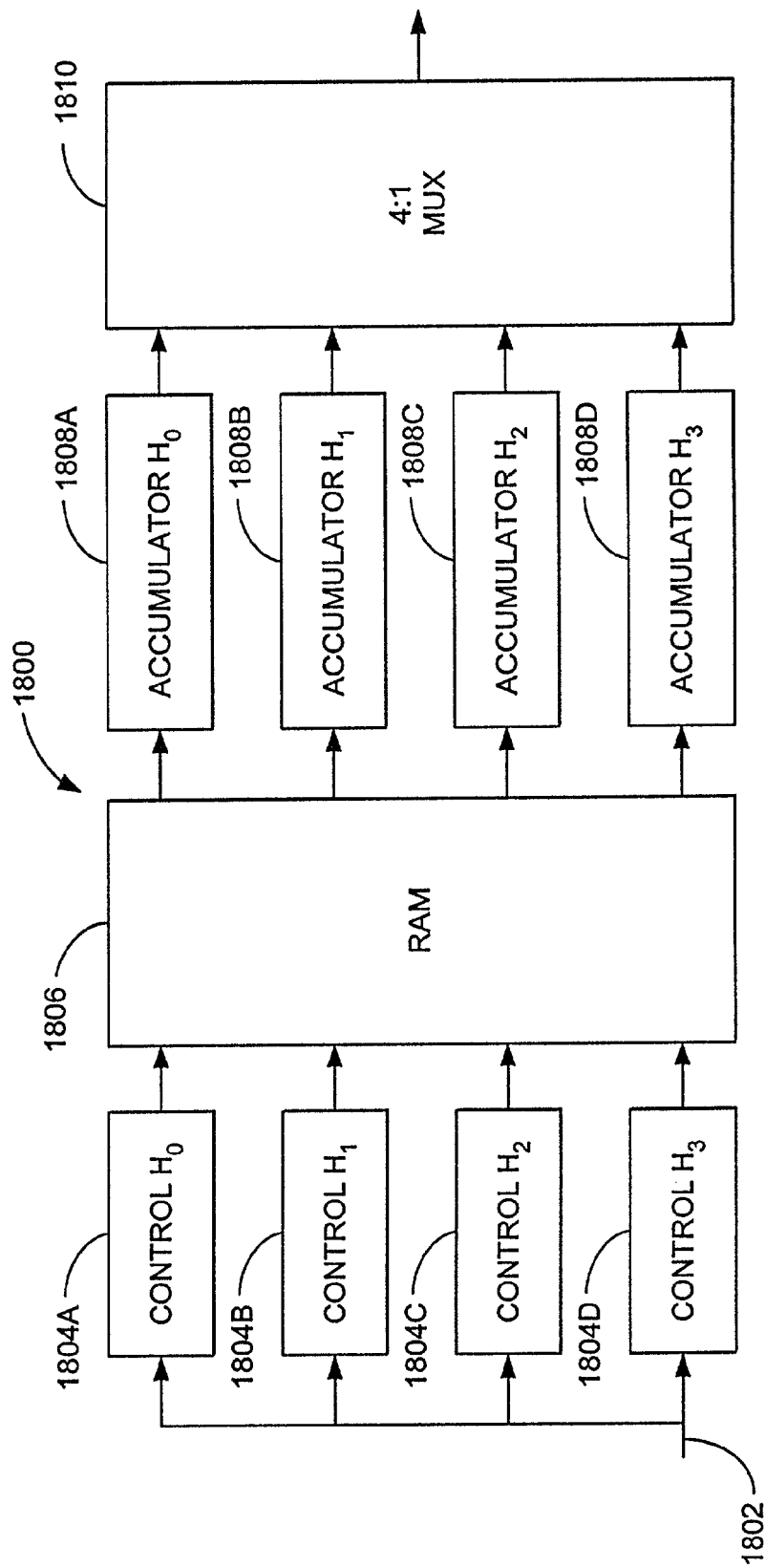
FIG. 18 is a block diagram showing an implementation of a low power, linear phase, interpolating-by-four pulse-shaping filter implemented in polyphase form using a random access memory (RAM)

1738, 1740, 1742, and 1744, the delay elements 1714, 1716, and 1718, and the adder 1728 are logically equivalent to a 4:1 mux 1746. This change results in a filter structure 1708 consisting of branch filters 1730, 1732, 1734, and 1736 which operate only on the original input bits and not on any expander zeros and a 4:1 mux 1746. Label $F_s$ denotes the components operating at the higher sampling rate and label $F_s/4$ denotes the components operating at the lower (input bit) sampling rate. The FIR filters 1730, 1732, 1734, and 1736 can be implemented using a random access memory (RAM), control, and accumulator blocks as shown in FIG. 18. Control $H_k$ 1804A–1804D and accumulator $H_k$ 1808A–1808D along with the RAM 1806 comprise FIR filter $H_k$ 1730, 1732, 1734, and 1736 in FIG. 17 where k=0, 1, 2, and 3. Each polyphase branch independently implements the algorithm so each accumulator 1808A–1808D may require different coefficients at the same time. For example, the accumulator in $H_0$ 1808A may need $h_0$ and $h_3$, the accumulator in $H_1$ 1808B may need $h_6$ and $h_7$, the accumulator in $H_2$ 1808C may need $h_8$, and the accumulator in $H_3$ 1808D may need $h_2$, $h_4$, and $h_5$. In order for the accumulators to run in parallel, a multi read-port RAM 1806 is required. Multi read-port RAMs 1806 consume more area, and the number of read-ports required quickly becomes impractical. For example, suppose we have an interpolating-by-four pulse-shaping filter implemented in polyphase form. A filter that implements QPSK requires a 4 read-port RAM, one that implements 16-QAM requires an 8 read-port RAM, and one that implements 64-QAM requires a 12 read-port RAM.

Figure 19:
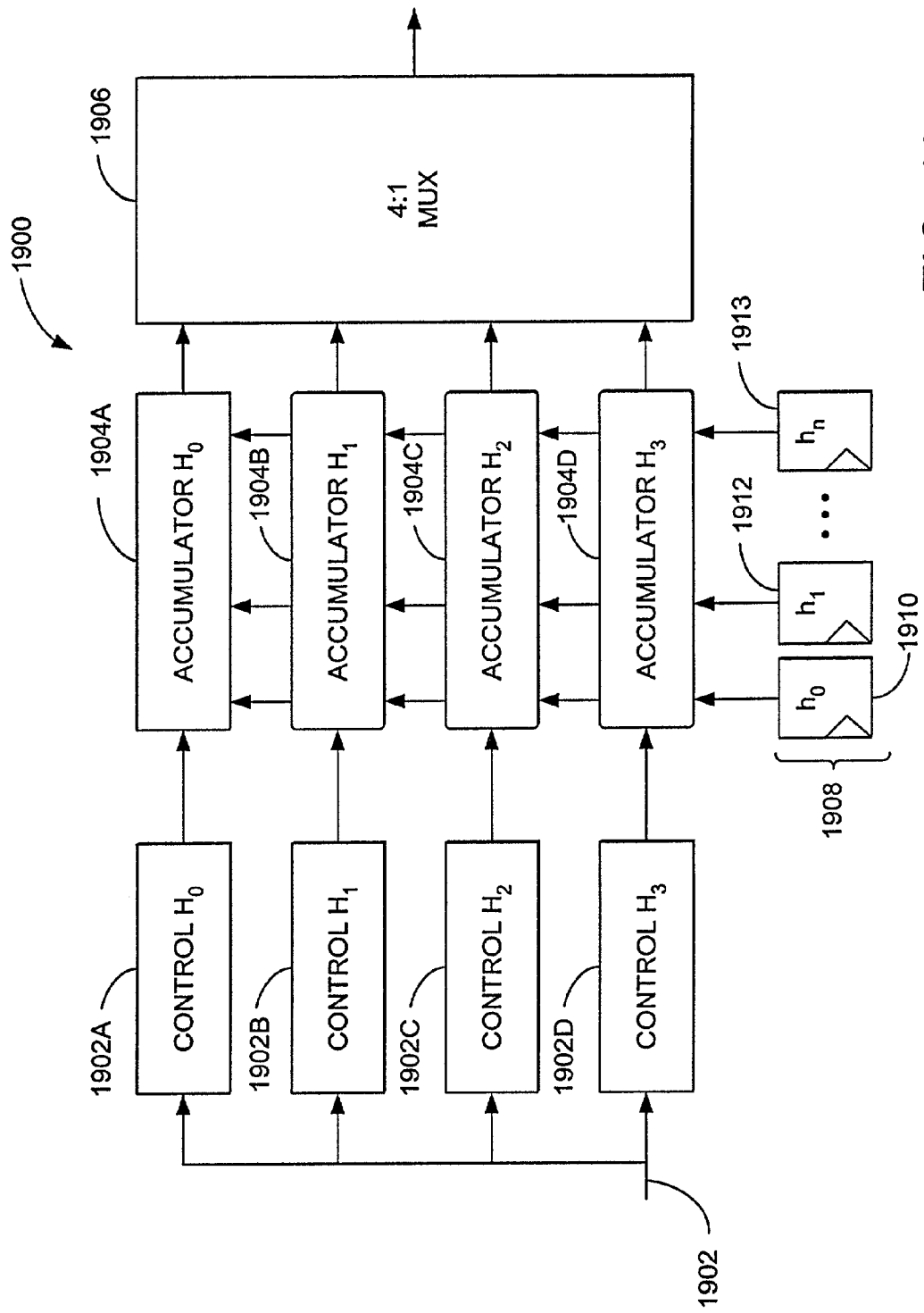
FIG. 19 is a block diagram showing an implementation of a low power, linear phase, interpolate-by-four pulse-shaping filter implemented in polyphase form using registers.

FIG. 19 is a block diagram showing an implementation of a low-power linear phase, interpolating by four pulse-shaping digital filter implemented in polyphase form using registers. This implementation does not require a multi-read port random access memory (RAM) and allows the storage of each coefficient once in one of the separate registers 1908 with the information routed to all of the sections. This effectively turns the RAM inside out, as the stored coefficients are simultaneously available to all of the summation elements without the need for generating an address for retrieval of the desired coefficient.

Another consequence of using an accumulator as the summation element is that a faster clock is required to do the additions before each new input arrives. However, a typical communication system has a faster clock in the system that can be appropriately divided down and used. Also, selective clock generation can reduce power. Clocks need only be generated for coefficients that are added instead of adding zero.

As previously described, only one of the two cases (ones or zeros) need be processed. That is, it is possible to just process the 1's or just process the 0's as the other case is obtained by negating the input, processing, and then negating the output. For example, consider 16-QAM with the input values listed in Table III below.

16-QAM

TABLE III

| Case | Input | Value |
|------|-------|-------|
| 1 | 00 | +1/4 = 1/2 − 1/4 |
| 2 | 01 | +3/4 = 1/2 + 1/4 |

TABLE III-continued

| Case | Input | Value |
|------|-------|-------|
| 3 | 10 | −3/4 = −1/2 − 1/4 |
| 4 | 11 | −1/4 = −1/2 + 1/4 |

Only cases 1 and 2 need to be built in hardware or processed. Case 3 is obtained by negating the input, processing as case 2, and then negating the output. Similarly, case 4 is obtained by negating the input, processing as case 1, and then negating the output.

Certain QAM cases allow for an even further reduction of the number of additions. Consider 16-QAM with the input values listed in the table above. Note that the first input bit (MSB) represents ±½ while the second bit (LSB) represents ∓¼. The 16-QAM inputs of 00=½−¼=+¼ and 11=−½+¼=−¼ can be implemented by just generating ±¼ whenever both inputs would cause additions in their respective sections. That is, whenever a bias value is not accounting for both of the input values just take ±¼. For example, consider a 10-tap filter with the following bit pairs at the 10 taps.

| $h_0$ | $h_1$ | $h_2$ | $h_3$ | $h_4$ | $h_5$ | $h_6$ | $h_7$ | $h_8$ | $h_9$ |
|-------|-------|-------|-------|-------|-------|-------|-------|-------|-------|
| 1 | 1 | 0 | 0 | 0 | 0 | 0 | 0 | 0 | 0 |
| 1 | 1 | 1 | 0 | 0 | 0 | 0 | 0 | 0 | 0 |

The algorithm states that the first row of bits will generated $$\frac{1}{2}\sum_i h_i - h_0 - h_1$$

and the second row will generate $$-\frac{1}{4}\sum_i h_i + \frac{1}{2}h_0 + \frac{1}{2}h_1 + \frac{1}{2}h_2.$$

Adding them together gives the desired result of $$\frac{1}{4}\sum_i h_i - \frac{1}{2}h_0 - \frac{1}{2}h_1 + \frac{1}{2}h_2.$$

However, taps $h_0$ and $h_1$ both have a 1 value, and both are not accounted for in the bias values. Therefore, the first row should generate $$\frac{1}{2}\sum_i h_i$$

and the second row $$-\frac{1}{4}\sum_i h_i - \frac{1}{2}h_0 - \frac{1}{2}h_1 + \frac{1}{2}h_2.$$

Adding them together gives the same result and saves two additions.

The algorithms can also be used to implement π/4 QPSK modulation using an approximation. Suppose the filter performs interpolation-by-four and is implemented in polyphase form. Two paths are used with weights of ⅝ and ¼. Every other tap on the ¼ path is killed in the following manner. First, only the 1st, 3rd, 5th, etc. taps are used in computing the output. Then, for the next output, only the 2nd, 4th, 6th, etc. taps are used. This effectively applies tap weights of ⅝ and ⅞=⅝+¼ to interleaved sequences of input bits. If all of the filter coefficients are scaled by 8/7 then the tap weights become 1 and 5/7 rather than 1 and $1/\sqrt{2}$. This amounts to a 1% error for the rotated constellation. The tap weights are easily implemented as ¼ is an arithmetic shift right by two bits and ⅝=½+⅛. Therefore, the algorithm can be implemented on both paths with the stated constraint on the killing of taps in the ¼ path.

The algorithm can be applied to sections of a filter or polyphase branch. This will reduce the complexity of the control hardware and potentially further reduce the number of additions, increase the speed of the filter, or reduce the area. For example, an 18-tap filter can be broken into two 9-tap sections. The algorithm can be independently applied to each section, and then, if required, the two partial sums can be added. However, if the circuitry following the filter can accommodate the partial sums, then one addition is saved. This may be the case if the following circuit uses carry-save arithmetic. The 18-tap filter has a maximum of nine additions while each 9-tap section has a maximum of four additions. If the 9-tap sections are run in parallel, then the speed of the filter may be doubled, and if a single 9-tap section is time-multiplexed, then area is saved.

A scrambler or randomizer in the transmitter can be employed to ensure a nearly equal mix of 1's and 0's. In such cases, this randomization means that the pulse-shaping filter in the transmitter will roughly see an even mix of 1's and 0's. Thus, the algorithm can expect to be working on an even mix of input data, and only one case may be implemented. No hardware is required to determine whether there are more 1's or 0's or to provide the appropriate bias value for each case. This greatly simplifies the hardware while still saving a significant amount of additions.

Embodiments Using Decimation Filters

Figure 20:
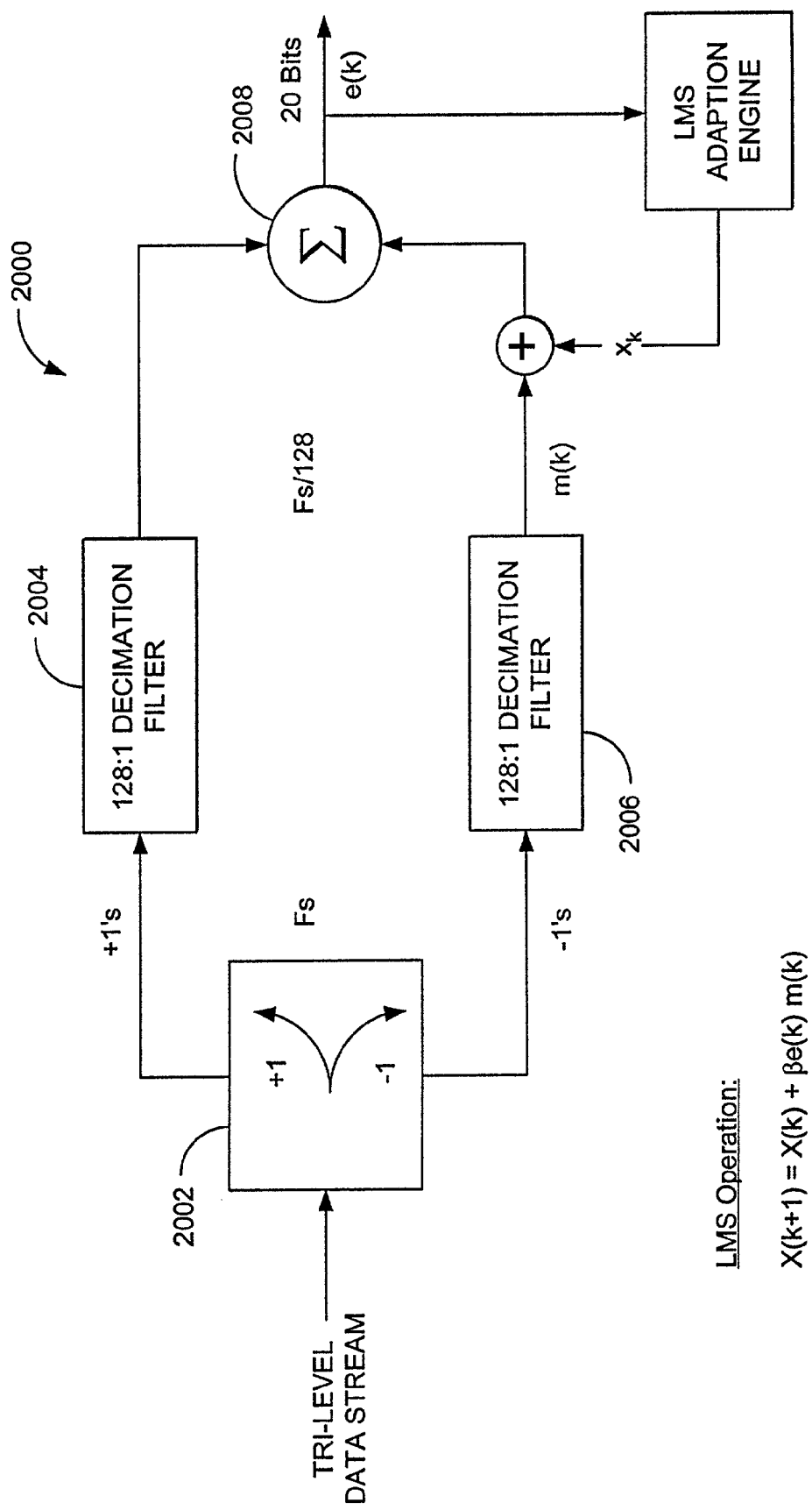
FIG. 20 is a block diagram of an alternative embodiment using an LMS filter/decimator chip.

FIG. 20 is a block diagram showing an alternative embodiment using a correcting least mean square (LMS) filter/decimator chip. Digital data entering the directing element 2002 of the digital filter 2000 is tri-level data (i.e. a stream of data samples, each being a member of the set {−1, 0, 1}). The positive one input values are directed to a first decimation filter 2004 and the negative one input values are directed to a second decimation filter 2006 by a directing element 2002. When a one is directed to the first decimation filter 2004 at a particular instant of time, a zero is created and sent simultaneously to the second decimation filter 2006. Similarly, a zero is sent to the first decimation filter 2004 whenever an incoming "−1" is directed to the second decimation filter 2006. Incoming zeros are routed to both the first decimation filter 2004 and the second decimation filter 2006. A further discussion of a filter such as that which is disclosed in FIG. 20 is presented in C. D. Thompson and S. R. Bernadas, "A Digitally-Corrected 20b Delta-Sigma Modulator," 1994 *IEEE International Solid State Circuits Conference*, pp. 194–195, Feb. 17, 1994, which is hereby incorporated by reference herein.

Although it is possible to arrange digital filters such as that which is disclosed in FIG. 20 so that an output data stream is produced at the same data rate as the input, such a configuration would be wasteful. As it is desired to decimate the outputs by a factor of N (in this instance, N=filter length=128), we only keep each $128^{th}$ sample of the output data streams. Therefore, we just wait until all N=128 input samples have been received, then compute the one desired output sample. We then bring in the next N=128 input samples. This process is repeated for subsequent input samples.

It is possible in principle that a total of N=128 non-zero bits might be received for the computation of some output sample pair (one output sample from the first decimation filter 2004 and one output sample from the second decimation filter 2006). For example, it is possible that no zero input values are received during some 128-bit input sequence. In such cases, the digital filter structure depicted in FIG. 20, would seem to require a total of up to N=128 addition operations to compute the outputs of both filters. (Here, whenever a zero bit is associated with a filter tap, there is no addition performed, unlike the digital filters previously described in the foregoing discussion in which zeros were processed as minus-ones.)

Further, if the input data was, in fact, evenly split between "+1" and "−1" samples, i.e. if we had 64 ones and 64 negative-ones and no input zeros, there would be 64 additions to perform for each filter, even when employing directly the gain modification and biasing techniques described herein. Thus, when considering each of the two filters as independent entities, it first appears that the gain modification and bias technique cannot be used to improve computational efficiency. However, as shown below, this is not the case, and both the first decimation filter 2004 and the second decimation filter 2006 outputs can be computed with no more than ⅔N additions. Moreover, if linear phase digital filters are employed, at most 5/12N additions are needed to compute the filter outputs for both the first decimation filter 2004 and the second decimation filter 2006.

This result is obtained by exploiting the fact that the first decimation filter 2004 and the second decimation filter 2006 are not in fact, independent, but are actually two copies of the same filter. That is, the tap-coefficients $\{h_0, h_1, \ldots, h_{127}\}$ are the same for both the first 2004 and second 2006 decimation filters. In addition to the zeros at the corresponding taps for both filters coming from input zero input values, there will be a zero at the first decimation filter's 2004 $k^{th}$ tap whenever the $k^{th}$ tap of the second decimation filter 2006 has a "−1" data value, and the $l^{th}$ tap of the second decimation filter 2006 has a zero whenever the first decimation filter's 2004 $l^{th}$ tap has a "+1."

When all of the N=128 input data samples have entered the digital filter 2000, each of the first/second decimation filter tap pairs can be considered as having one of the following three kinds of data vectors associated with it:

$$a = \begin{pmatrix} 1 \\ 0 \end{pmatrix}, b = \begin{pmatrix} 0 \\ 0 \end{pmatrix}, c = \begin{pmatrix} 0 \\ 1 \end{pmatrix}.$$

That is, tap k would be an a tap if the $k^{th}$ data bit for the first decimation filter 2004 is "1" and the $k^{th}$ data bit for the second decimation filter 2006 is "0," etc. Note that a "1" is used in c, rather than a "−1," because we can map the {0, −1} input data sequence for the second decimation filter 2006 into a {0, 1} sequence, thereby requiring only addition of the appropriate $h_k$ tap weights to produce the filter's output, and a single subtraction could be performed instead of an addition at the summation junction 2008.

After the input data has entered both filters, we then classify the N=128 tap pairs into the three sets of tap pairs defined above: a, b, and c according to their data values. That is, tap-k $\epsilon$ c if the $k^{th}$ data bit pair is a c-tap (i.e. if the $k^{th}$ bit for the first decimation filter 2004 is a "0" and the $k^{th}$ bit for the second decimation filter 2006 is a "1" after being mapped from a "−1").

At least one of the three sets a, b, and c must have at most N/3=128/3=42 (rounding down) members. This is because sets a, b, and c cannot all have at least 43 members, since that would require 129 or more tap-pair members. Also, at least one of the three data sets a, b, and c must have at least N/3=128/3=43 (rounding up) members. This is because sets a, b, and c can not all have no more than 42 members each, because that would total only 126 or less tap-pairs.

Consider the largest of the three sets a, b, and c:

Case 1: If the largest set is set b, then normal processing is performed. That is, the $h_k$ tap coefficient values are added for k$\epsilon$a to obtain the first decimation filter's 2004 output, and the $h_k$ tap coefficient values for taps k$\epsilon$c are added to get the second decimation filter's 2006 output. This requires at most a total of 128−43=85 additions. Note that this is equivalent to ⅔N additions (85=⅔128=⅔N). In this case, we are processing the non-zero bit taps and we are using a bias of zero for both filters.

Case 2: If set a is the largest of the three sets, then we process the taps corresponding to sets b and c. For the second decimation filter 2006, the additions of the $h_k$ tap coefficient values for the taps k$\epsilon$c are performed. That is, the second decimation filter 2006 processes the non-zero bit taps with a bias of zero.

The output of the first decimation filter 2004 is the sum of all tap-coefficient values minus $\Sigma_b$ and $\Sigma_c$, where $\Sigma_b$ denotes the sum of all tap-coefficient values $h_k$ for k$\epsilon$b and $\Sigma c$ denotes the sum of all tap coefficient values $h_k$ for k$\epsilon$c. We are now just computing the output of the first decimation filter 2004 by processing its zeros with a bias of $-\Sigma h_k$. That is, the output of the first decimation filter 2004 is $-(-\Sigma h_k + \Sigma_b + \Sigma_c)$ where the term $-\Sigma h_k$ is the bias, and the output of the second decimation filter is $0+\Sigma_c$ where 0 is the bias. As can be seen from the foregoing, $\Sigma_c$ need only be computed once, and can be used in both the first decimation filter 2004 and in the second decimation filter 2006. Note also that only add operations are being performed in the accumulators, and that no subtract operations are performed. As was the case in Case 1, the total computation required for obtaining both filter outputs is at most ⅔N additions.

Case 3: If set c is the largest, we proceed as in Case 2, using similar computations. The output of the first decimation filter 2004 is then $0+\Sigma_a$ and the output of the second decimation filter 2006 is $-(-\Sigma h_k + \Sigma_a + \Sigma_b)$ In summary, in all cases, we can avoid processing the tap-pairs of whichever set has the most elements ($\geq$ ⅓N). That is, in the exemplary case of a 128-bit tap filter pair, we save ⅓128=43 add operations or more (depending on the input data). Note, as in other embodiments, rounding (e.g. 42⅔→43) works in our favor.

Next, consider the case where the first decimation filter 2004 and the second decimation filter 2006 are linear phase filters. Consider explicitly the case where N is an even number and there is even coefficient symmetry. Other linear phase filters can be accomplished similarly. As before, we pair-up taps having equal values in each filter. Now, for each quad of filter taps (i.e. pair of taps in the first decimation filter 2004 and the corresponding pair of taps in the second decimation filter 2006, all four of which having the same $h_k$ filter-tap coefficient value) we can define six types of associated data matrices:

$$a = \begin{pmatrix} 1 & 1 \\ 0 & 0 \end{pmatrix};$$

$$b = \begin{pmatrix} 1 & 0 \\ 0 & 0 \end{pmatrix} \text{ or } \begin{pmatrix} 0 & 1 \\ 0 & 0 \end{pmatrix};$$

$$c = \begin{pmatrix} 1 & 0 \\ 0 & 1 \end{pmatrix} \text{ or } \begin{pmatrix} 0 & 1 \\ 1 & 0 \end{pmatrix};$$

$$d = \begin{pmatrix} 0 & 0 \\ 0 & 0 \end{pmatrix};$$

$$e = \begin{pmatrix} 0 & 0 \\ 1 & 0 \end{pmatrix} \text{ or } \begin{pmatrix} 0 & 0 \\ 0 & 1 \end{pmatrix};$$

$$f = \begin{pmatrix} 0 & 0 \\ 1 & 1 \end{pmatrix}.$$

In the computation of the filter outputs, in a manner similar to that employed in a single linear phase filter, the following result is obtained. For the type a data matrix above, we add $2h_k$ to the first decimation filter 2004 output and add nothing to the second decimation filter 2006 output. For the type b data matrix above, we add $h_k$ to the first decimation filter 2004 output and add nothing to the second decimation filter 2006. For the type c data matrix above, we add $h_k$ to both the top and bottom filter outputs. The foregoing is repeated for the type d–f data matrices.

After the input data has entered both filters, let the N/2 tap quads be classified into the six sets of tap-quads (a, b, c, d, e, and f) described above in a way that generalizes the previous discussion (i.e. tap-quad $h_k\epsilon$a if it is associated with data matrix of type a, etc.). At least one of these sets must have at least N/6 members. As in the previously discussed case of computing outputs of a single linear-phase filter, we can omit the consideration of the tap-coefficients corresponding to this largest tap-quad set, and we can obtain the outputs of both filters using $\Sigma_a, \Sigma_b, \ldots, \Sigma_f$ and appropriate bias values. Now, we have, at most, a total of ⅚ of the N/2 tap-quad values to be added, employing an appropriate bias value in each addition. That is, we require a total of ⅚·N/2=5/12N additions for both filter outputs.

Infinite Impulse Response Filters

Figure 21:
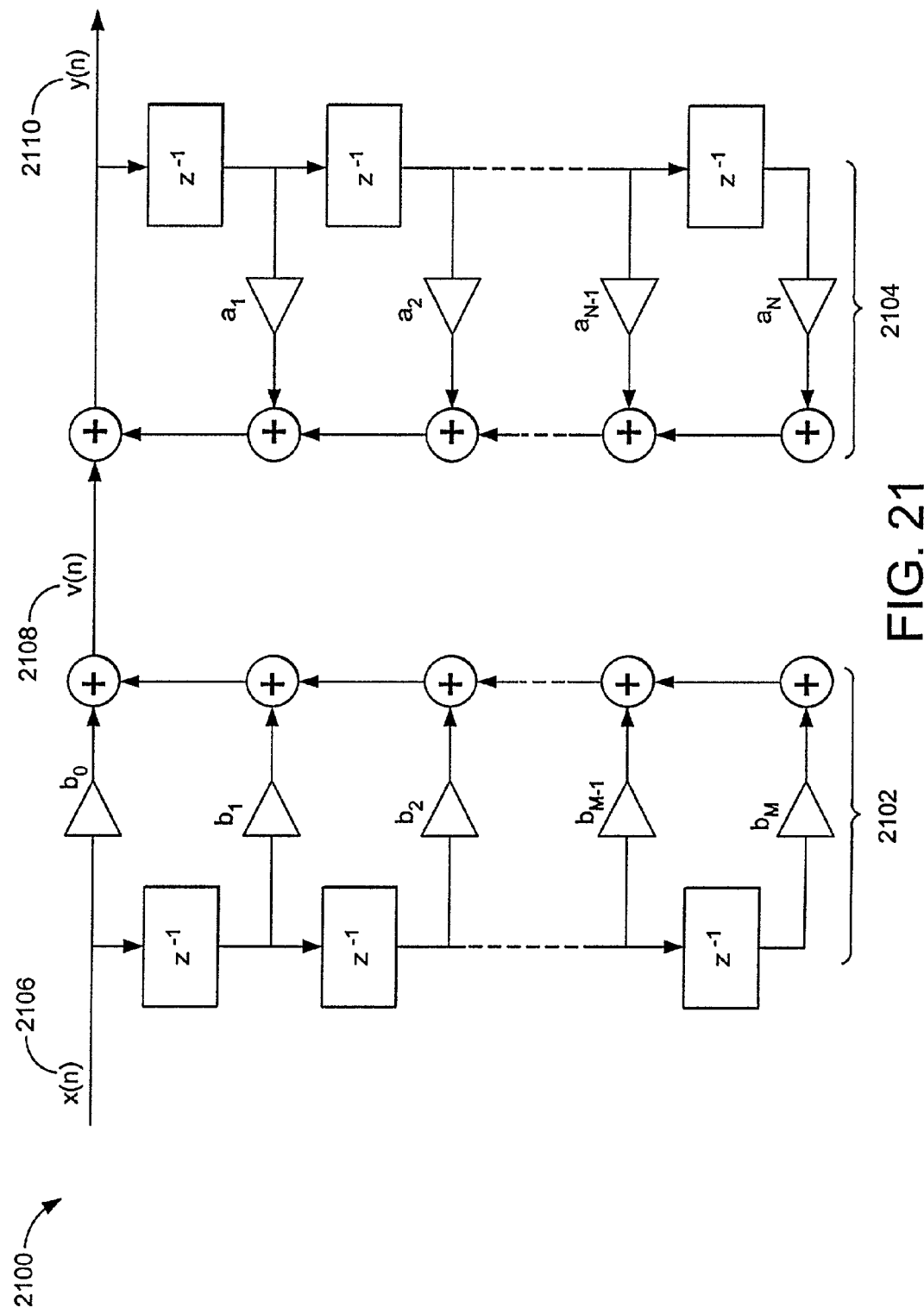
FIG. 21 is a block diagram of a direct form I realization of a difference equation describing an infinite impulse response digital filter.
Figure 22:
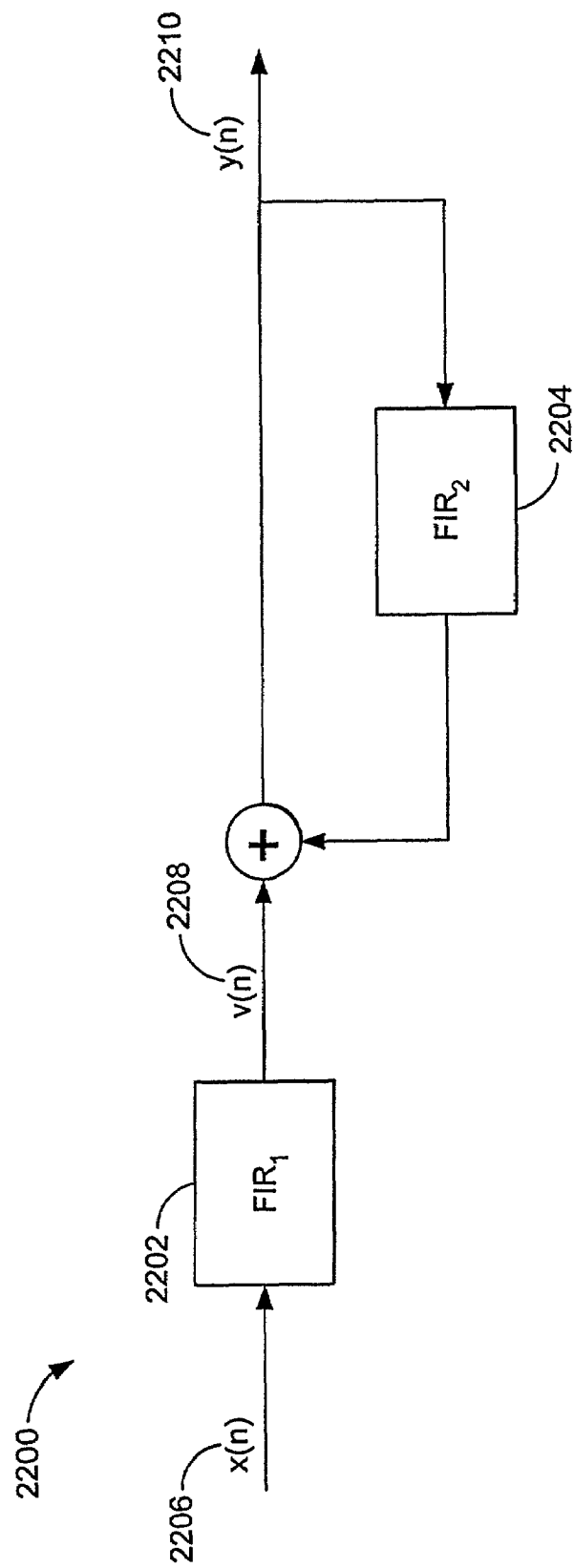
FIG. 22 is a block diagram showing an infinite impulse response digital filter realized by two finite impulse response filters.

Any infinite impulse response (IIR) digital filter, which can be described by the difference equation $$y(n) = \sum_{k=1}^{N} a_k y(n-k) + \sum_{k=0}^{M} b_k x(n-k),$$

can be realized in the direct form I structure shown in FIG. 21 (see, for example, J. G. Proakis and D. G. Manolakis, *Digital Signal Processing Principles, Algorithms, and Applications*, New York, N.Y., Macmillan, 1992, which is hereby incorporated by reference herein). IIR filter 2100, comprising two sections 2102 and 2104, can also be realized using two FIR filters 2202 and 2204 as shown in FIG. 22. The FIR filters 2202 and 2204 realize the functions of sections 2102 and 2104, respectively. The two FIR filters 2202 and 2204 can be implemented using any of the methods previously described. Therefore, IIR filters can also benefit from the low-power digital filtering methods described herein.

Additional Alternative Embodiments

As can be readily seen by the foregoing, the technique taught by the present invention (mapping the input data stream, selectively modifying the digital filter tap weight values, and applying a bias to compensate for the modified digital filter tap weight values) can be readily applied in a wide variety of digital filters.

We have also disclosed that the input values $\{x_0, x_1, \ldots, x_{N-1}\}$ can be advantageously mapped to different values to create a pattern of zeros and non-zero factors at each of the tap-weights to reduce the number of computations required to produce the digital filter output. For example, a digital filter designed to reduce computations by a certain factor for a particular majority input-bit type can be used to reduce computations for a different majority input bit type, by suitable mapping of the input data stream. Simple examples have been presented in which the factors $A_0 = A_1 = \ldots = A_{N-1} = 2$, and other examples have been presented in which different combinations of factors $\{A_0, A_1, \ldots, A_{N-1}\}$, input data stream mapping, and biasing can be applied to reduce the number of computations or increase the implementation efficiency of the digital filter.

Generally described, the method employed includes the steps of successively delaying each of a series of mapped input values to create tap values $\{t_0, t_1, \ldots, t_{N-1}\}$, multiplying each of the tap values by weight values $\{h_0, h_1, \ldots, h_{N-1}\}$ selected to achieve a desired filter response and by factors $\{A_0, A_1, \ldots, A_{N-1}\}$ selected to reduce the number of operations performed in filtering the input data stream to produce $\{A_0 t_0 h_0, A_1 t_1 h_1, \ldots, A_{N-1} t_{N-1} h_{N-1}\}$. The resulting values $\{A_0 t_0 h_0, A_1 t_1 h_1, \ldots, A_{N-1} t_{N-1} h_{N-1}\}$ are combined to produce $$\sum_{k=0}^{N-1} A_k t_k h_k,$$

and the result is biased by an appropriate value to compensate for the applied factors $\{A_0, A_1, \ldots, A_{N-1}\}$.

Using the foregoing teaching, j tap value subsets can be defined, each of these subsets associated with an accompanying factor and weight value $A_j$ to reduce the number of computations. For example, the tap values can be broken into two subsets comprising a first subset $\{t_0, t_1, \ldots, t_{N/2}\}$ associated with a factor $A_1$, and a second subset $\{t_{N/2+1}, \ldots, t_{N-1}\}$ associated with a factor $A_2$. With suitable biasing and mapping of the input data stream, the desired digital filter response can be achieved, while minimizing the number of computations performed, increasing computation speed, and/or reducing circuit complexity of the digital filter.

Implementation of the Direct-Form Low-Power Digital Pulse-Shaping Filter

As the foregoing illustrates, the power dissipation of a digital pulse-shaping filter designed in accord with our low-power filtering algorithm is highly implementation-dependent. The direct form filter structure of FIG. 4, commonly used in "traditional" pulse-shaping filters, is very elegant, compact, and robust. It is easy to construct its layout in either standard cell or datapath format and the layout contains a minimum of cells, all of which are fully utilized. Thus, it is an excellent structure for low-power implementation. However, several modifications must be made to allow it to implement the low-power filtering algorithm and achieve lower power dissipation than the "traditional" version.

Recall that the low-power algorithm requires the addition of a bias value and the determination of the majority input bit type. If there is a majority of zeros in the input bit stream then the bias value is $-\Sigma_k h_k = -(h_0 + \ldots + h_{N-1})$ and doubled tap weights $2h_k$ are added for each input one bit while input zero bits require "no computation." If the majority of bits in the input stream are one bits then the bias is $\Sigma_k h_k = -(h_0 + \ldots + h_{N-1})$ and doubled tap weights $2h_k$ are subtracted for each input zero bit while one input bits require "no computation." Alternatively, it may be more attractive to always employ a bias of $-\Sigma_k h_k$, to always perform additions, and to negate the final accumulated output whenever the input-bit-type majority is one.

FIG. 5A shows the addition of the bias value to the direct-form structure, and FIG. 5D shows circuitry to calculate the majority input bit type for a length N (even) filter.

One way to implement the "no computation" described above is to simply add zero. However, this causes the adders (504, 416, 436, 446, and 456) to toggle and therefore dissipate power.

Figure 23:
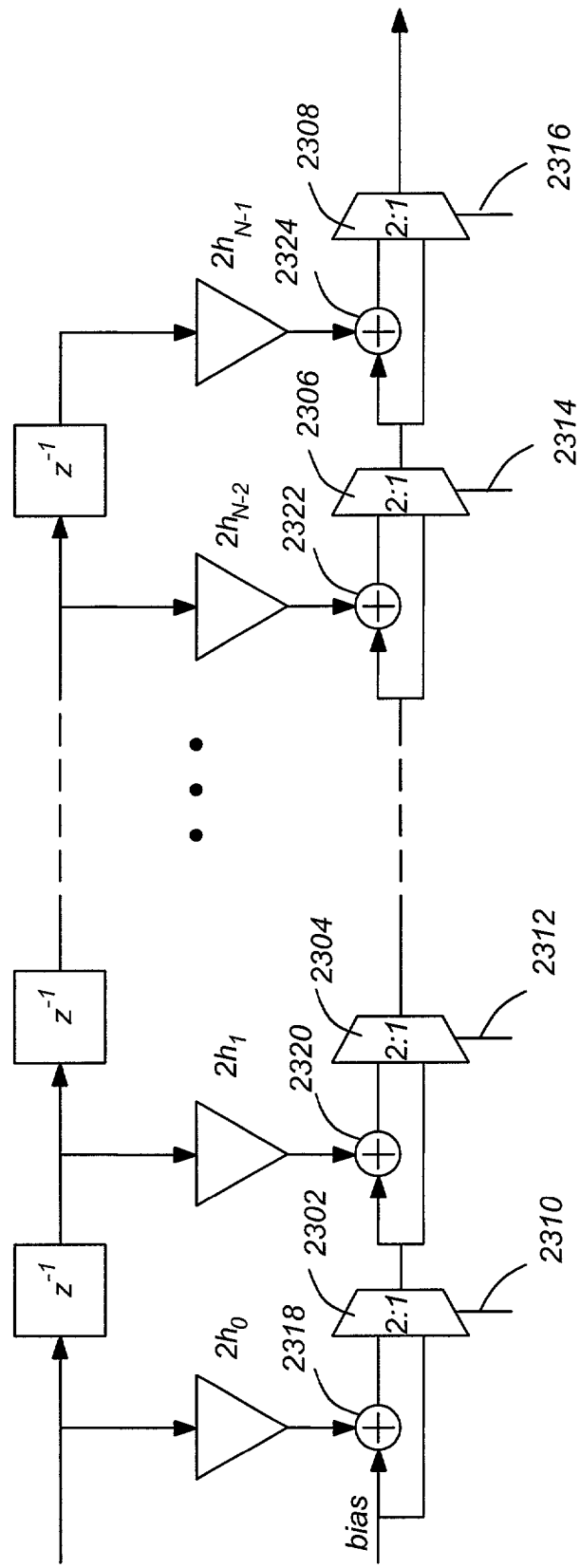
FIG. 23 is a diagram illustrating a system using multiplexers to bypass adders.

FIG. 23 is a diagram illustrating another method for implementing the "no computation" described above. As shown in FIG. 23, a plurality of multiplexers 2302–2308 controlled by control inputs 2310–2316 are used to bypass each of the adders 2318–2324. In this system, the output of the multiplexers 2302–2308 is controlled by the value of the control inputs 2310–2316. This embodiment removes the addition of zero from the accumulated sum, but power is still dissipated by the adders 2318–2324 since its inputs still will have changed. In order to implement the "no computation" in a power efficient manner it is desirable that all inputs to the adders 2318–2324 remain unchanged and the output of each adder must be bypassed.

Figure 24:
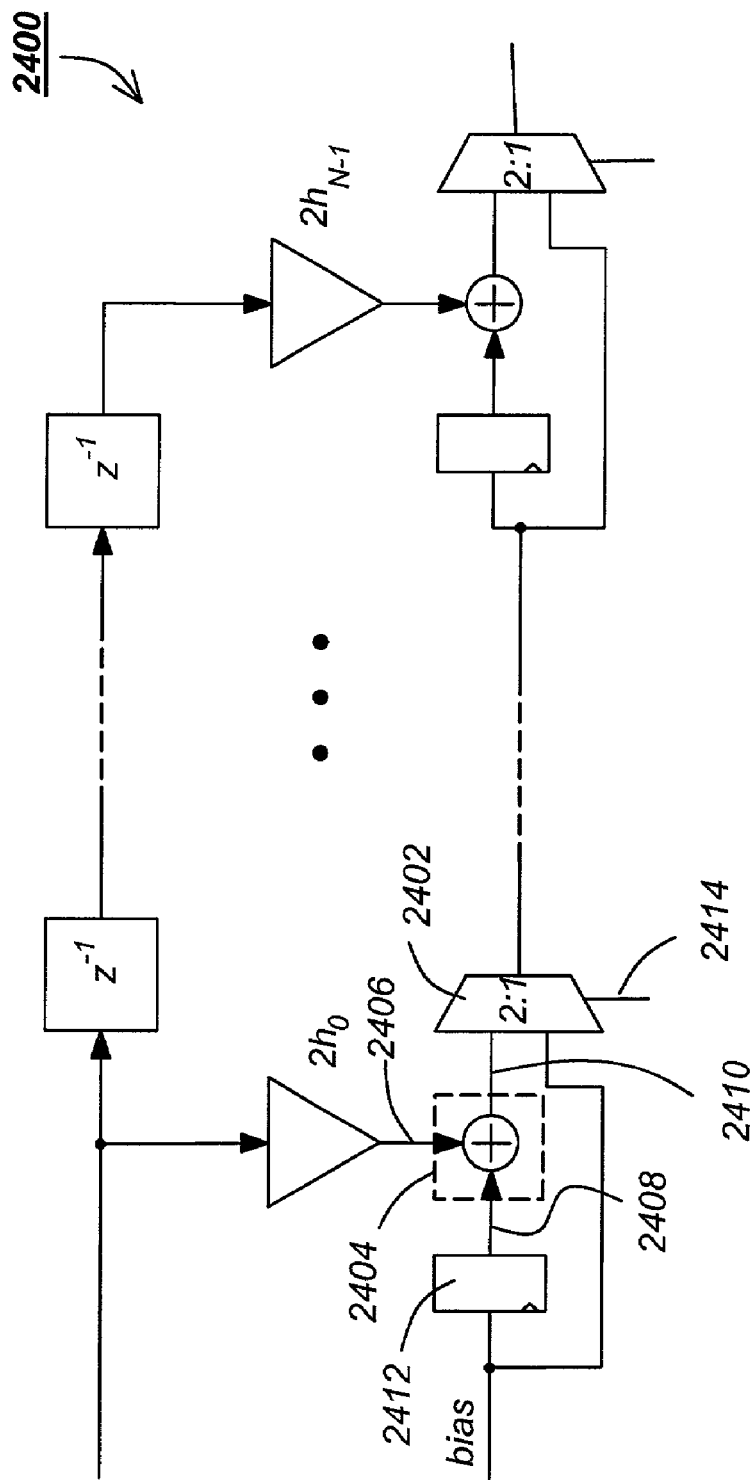
FIG. 24 is a diagram illustrating a system using multiplexers and registers to both bypass and hold data.

FIG. 24 is a diagram illustrating a system having a register 2412 placed before the adder input 2408. As was the case with the system illustrated in FIG. 23, a multiplexer (MUX) 2402 is used to bypass the adder 2404. In this system, data is clocked into the register only when the output 2410 of the adder 2404 is desired, but then the power dissipation of a register 2412 will have been added to the system 2400, tending to offset our power savings obtained from the methods described above. A better method of holding the adder inputs is required.

A truth table is presented below showing adder logic that holds the adder inputs with minimal additional circuitry.

| A | B | C | SUM | CARRY | A ⊕ B | $\overline{A \oplus B}$ |
|---|---|---|-----|-------|-------|-------------------------|
| 0 | 0 | 0 | 0   | 0     | 0     | 1                       |
| 0 | 0 | 1 | 1   | 0     | 0     | 1                       |
| 0 | 1 | 0 | 1   | 0     | 1     | 0                       |
| 0 | 1 | 1 | 0   | 1     | 1     | 0                       |
| 1 | 0 | 0 | 1   | 0     | 1     | 0                       |
| 1 | 0 | 1 | 0   | 1     | 1     | 0                       |
| 1 | 1 | 0 | 0   | 1     | 0     | 1                       |
| 1 | 1 | 1 | 1   | 1     | 0     | 1                       |

The following logical relationships exist between the inputs A, B, and C (carry$_m$) and the outputs (SUM and CARRY).

CARRY=C when $A \oplus B=1$

CARRY=$A$ (or $B$) when $A \oplus B=0$

SUM=$C$ when $A \oplus B=0$

SUM=$\overline{C}$ when $A \oplus B=1$

These relations describe how a transmission-gate adder is implemented, as described further below.

Figure 25A:
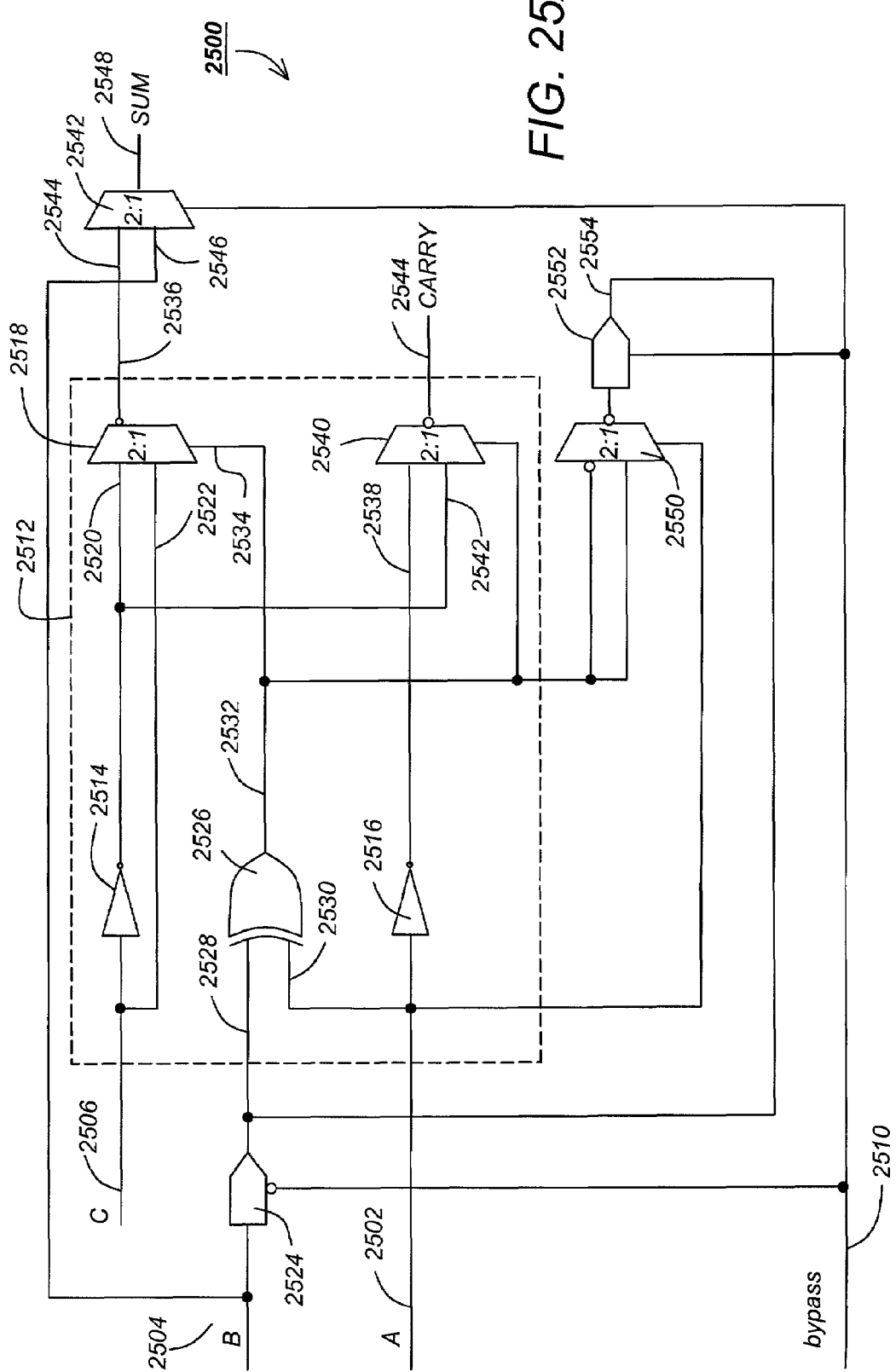
FIG. 25A is a diagram depicting one embodiment of a low power bypassable adder.

A and B can be regenerated according to the following:

$A=A \oplus B$ when $B=0$ $A=\overline{A \oplus B}$ when $B=1$ $B=A \oplus B$ when $A=0$ $B=\overline{A \oplus B}$ when $A=1$ FIG. 25A is a diagram depicting one embodiment of a bypassable adder 2500. The bypassable adder 2500 comprises a first input 2502, a second input 2504, and a carry input 2506. The second input 2504 is communicatively coupled to a transmission gate 2524 which is controlled by a bypass input 2510.

The first input 2502, the second input 2504 and the carry input 2506 are communicatively coupled to a transmission gate adder 2512. The transmission gate adder 2512 comprises a first multiplexer 2518 having a first input 2520 communicatively coupled to the carry input 2506 via an inverter 2514 and a second input 2522 communicatively coupled to the carry input 2506.

The transmission gate adder 2512 also comprises a logic module 2526 such as an exclusive OR gate having a first input 2528, a second input 2530, and an output 2532. The first input 2528 is communicatively coupled to the second input 2504 via transmission gate 2524 and the second input 2530 is communicatively coupled to the first input 2502. In this configuration, the output 2532 is logically A⊕B. The output 2532 of the XOR gate 2526 is coupled to the control input 2534 of the multiplexer 2518, thus controlling whether C or $\overline{C}$ is presented at the output 2536 of the multiplexer 2518.

The first input 2502 is communicatively coupled to a first input 2538 of a second multiplexer 2540 in the transmission gate adder 2512. The second input 2542 of the second multiplexer 2540 is communicatively coupled to the first input 2520 of the first multiplexer 2518. Thus, the output 2544 of the second multiplexer 2540 (the CARRY output) is either the first input 2502 or the carry input 2506, depending on the value of the exclusive OR of the first input 2502 and the second input 2504.

The bypassable adder 2500 includes a multiplexer (MUX) 2542 having a first input 2544 communicatively coupled to the output 2536 of the first multiplexer 2518, and a second input 2546 communicatively coupled to the second input 2504. The output 2548 of the multiplexer 2542, which represents the output SUM of the adder 2500 is dependent upon the bypass input 2510. This allows the SUM output to be a held version of second input B 2504 (if the bypass input 2510 is applied) or C (if the bypass input 2510 is not applied and A⊕B=0) or $\overline{C}$ (if the bypass input 2510 is not applied and A⊕B=1).

The logic circuit further comprises an additional multiplexer 2550 with both inputs communicatively coupled to the XOR gate 2526. When the bypass input 2510 is high, the transmission gate 2552 allows the output of the additional multiplexer 2550 to be provided to the connection between the transmission gate 2524 and the XOR gate 2526.

Therefore, B (or A) can be held with the addition of a MUX 2550 and a pair of transmission gates 2524, 2552 to switch the adder 2500 inputs between a new input 2504 and the regenerated input 2554. An alternative way to regenerate B (or A) is to employ a second XOR gate.

This alternate regeneration method is based on the following relations (which actually just restate the previous relations more concisely):

$A=A \oplus B \oplus B$ $B=A \neq B \oplus A$

As described with respect to FIG. 24, a MUX can be used to bypass the entire adder 2404. Therefore, with the addition of one MUX (2402 of FIG. 24 or 2542 of FIG. 25A) to bypass the adder 2404, two transmission gates (or one MUX) per input to switch between the new and regenerated values, and one MUX or one XOR per input, we can implement the modified adder cell. FIG. 25A illustrates an embodiment wherein the B input is held using a MUX.

In the embodiment described above, the A input 2502 is assumed constant according to the filter implementation case where only additions are performed in computing the filter's output. In this case, the final output may need to be negated.

Figure 25B:
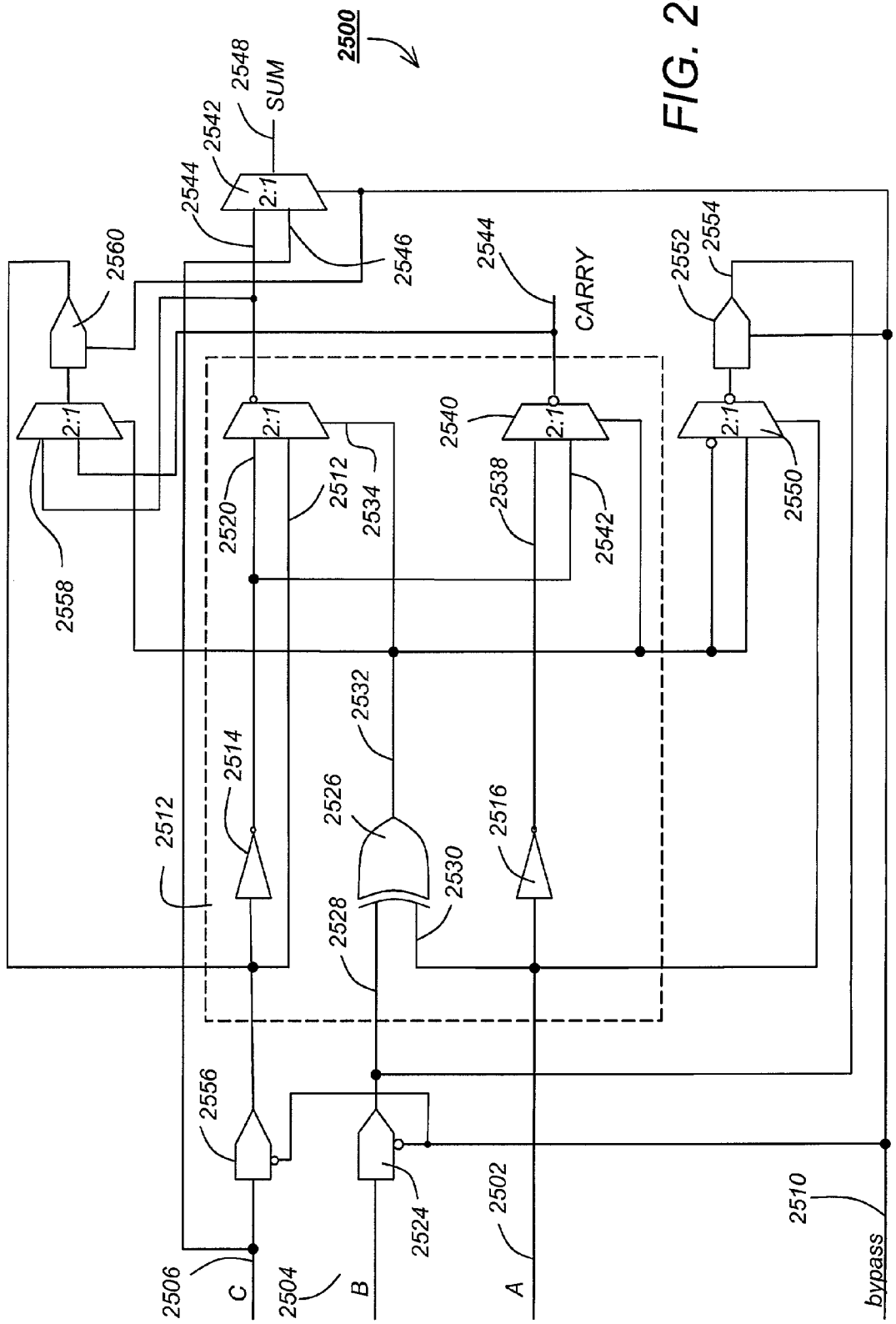
FIG. 25B is a diagram depicting a diagram of another embodiment of the low power bypassable adder.

FIG. 25B is a diagram of a bypassable adder that holds the inputs B and C and bypasses C to SUM. The system of FIG. 25B is analogous to that of FIG. 25A, except that the value of the carry input C 2506 is blocked by transmission gate 2556, and the regenerated input is fed back by the use of multiplexer 2558 and transmission gate 2560 under control of the bypass signal 2510.

Figure 25C:
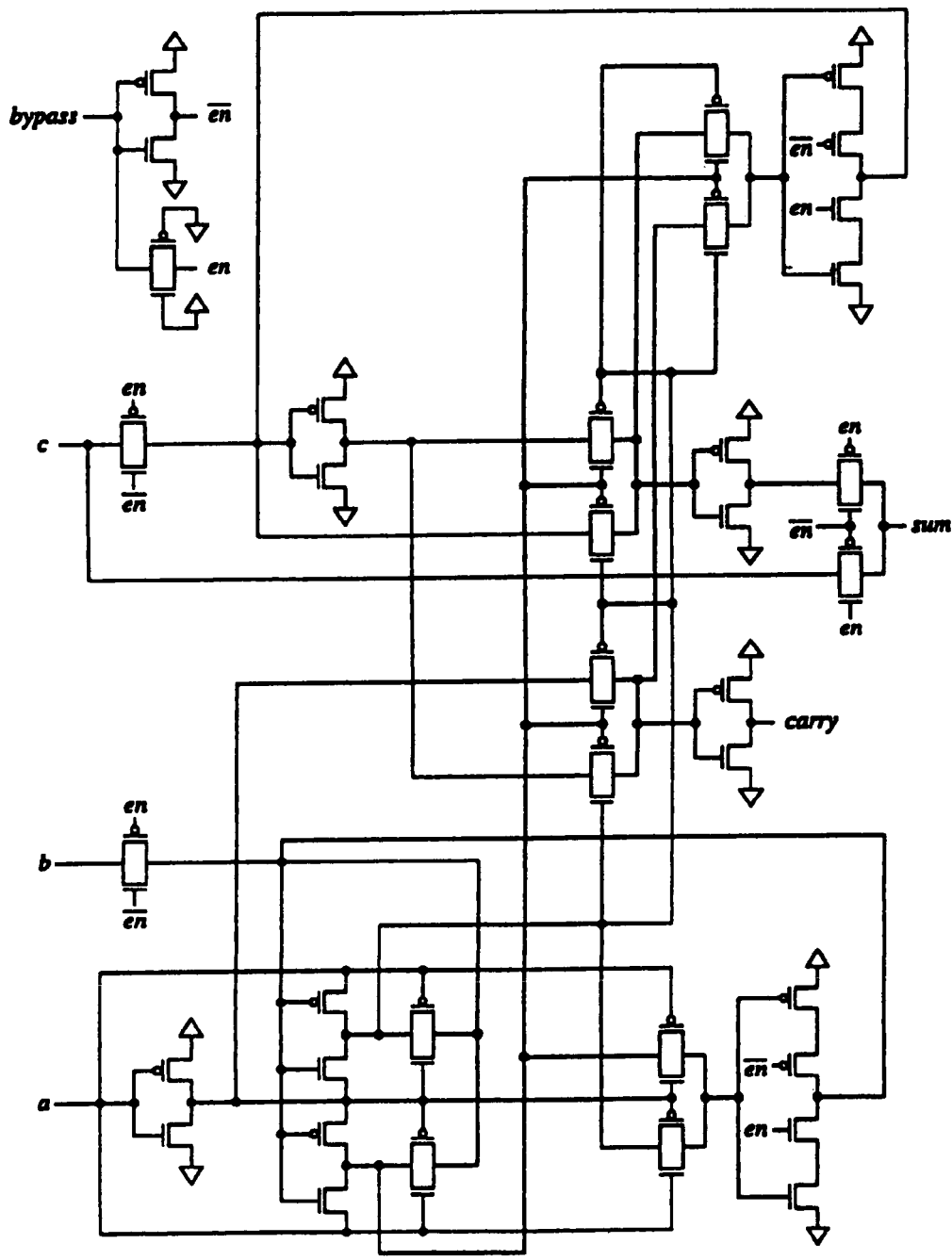
FIG. 25C is a schematic diagram of a bypassable adder.

FIG. 25C presents a transistor schematic of a bypassable adder.

Figure 26:
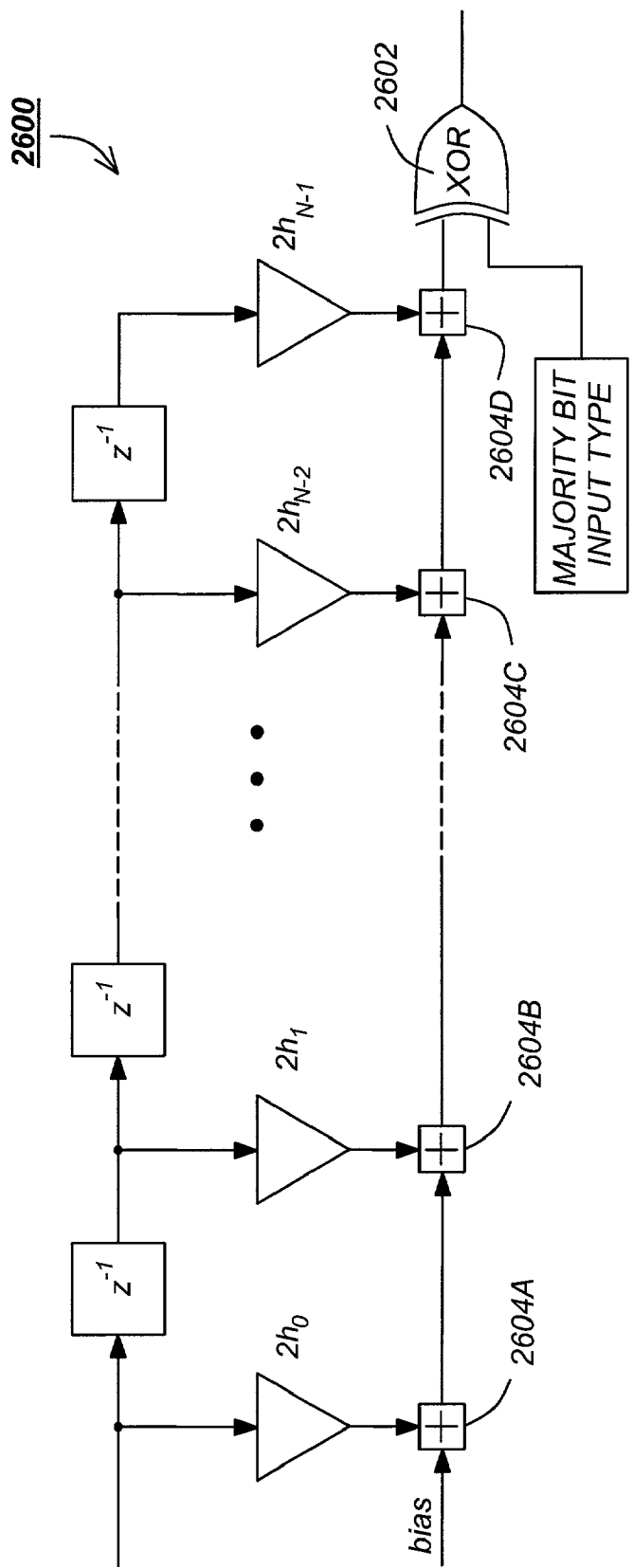
FIG. 26 is a diagram showing a finite impulse response digital filter and an XOR gate to negate the filter output.

FIG. 26 is diagram describing how negation of the final filter output may be accomplished. The filter 2600 shown in FIG. 26 includes an XOR gate 2602 at the filter's output.

If the adder is required to perform both additions and subtractions, both adder inputs A and B (2502 and 2504 on FIG. 25A and 25B) must be held. This can be accomplished in a variety of ways.

Figure 27:
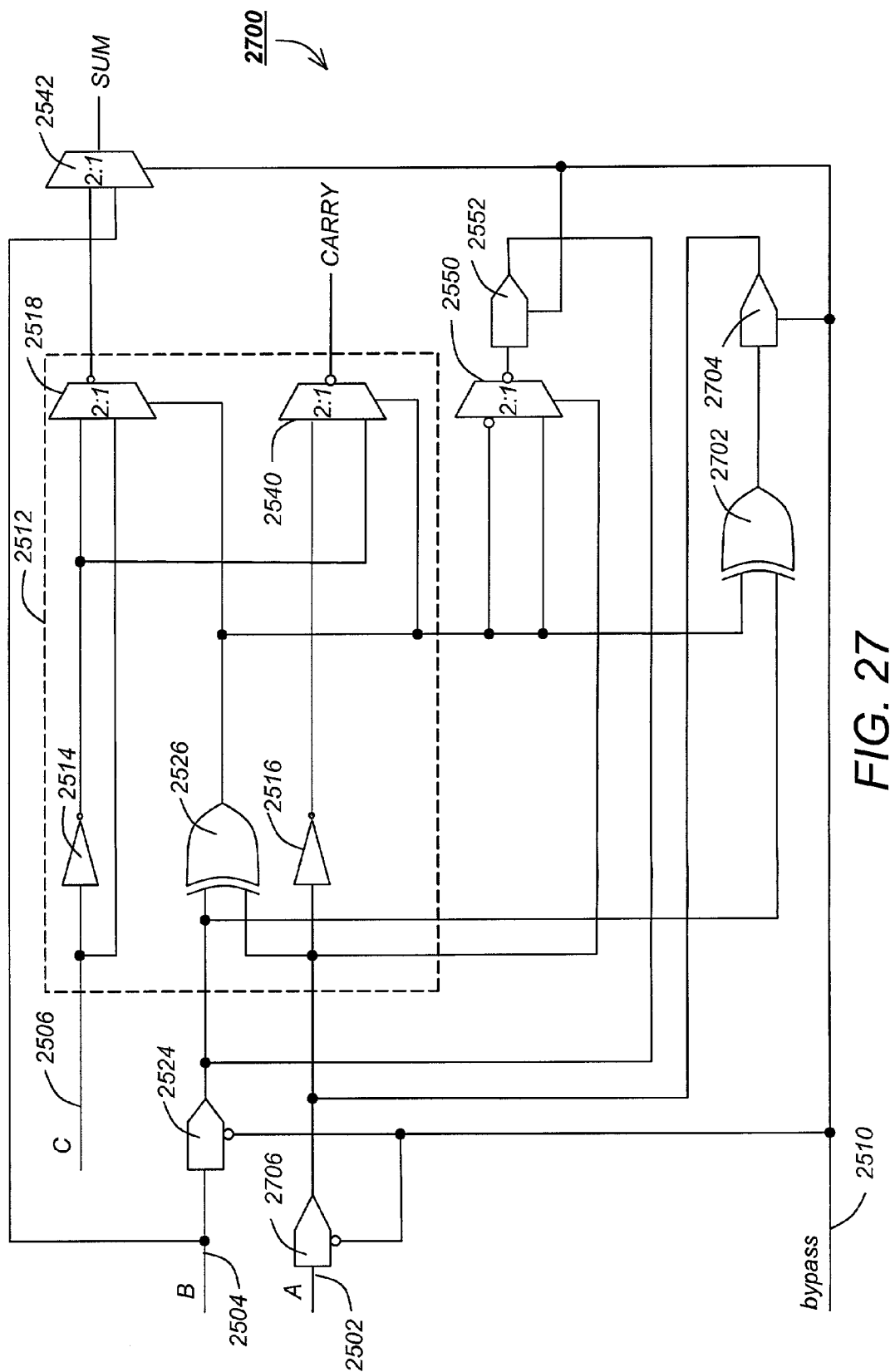
FIG. 27 is a diagram of an illustrative embodiment of a bypassable adder 2700 in which an XOR gate is used to regenerate one of the inputs (the A input)

FIG. 27 is a diagram of an illustrative embodiment of a bypassable adder 2700 in which an XOR gate is used to regenerate one of the inputs (the A input). This embodiment of the bypassable adder 2700 is similar to the embodiment depicted in FIG. 25A, except an additional transmission gate 2706 is disposed between the input 2502 and the transmission gate adder 2512 to hold the value of the first input 2502. The transmission gate 2706 is also controlled by the bypass input 2510. Further, additional elements including a second XOR gate 2702 and an additional transmission gate 2704 is used to regenerate and feedback the value of the first input 2502. Note that in this embodiment, a MUX 2550 is used to hold one input value (B) and an XOR 2702 is used to hold the other input (A).

Many other variations on these circuits can be employed as alternatives to hold the input values and feed back the values of subsequent circuitry to regenerate one or more of the input values.

Figure 28:
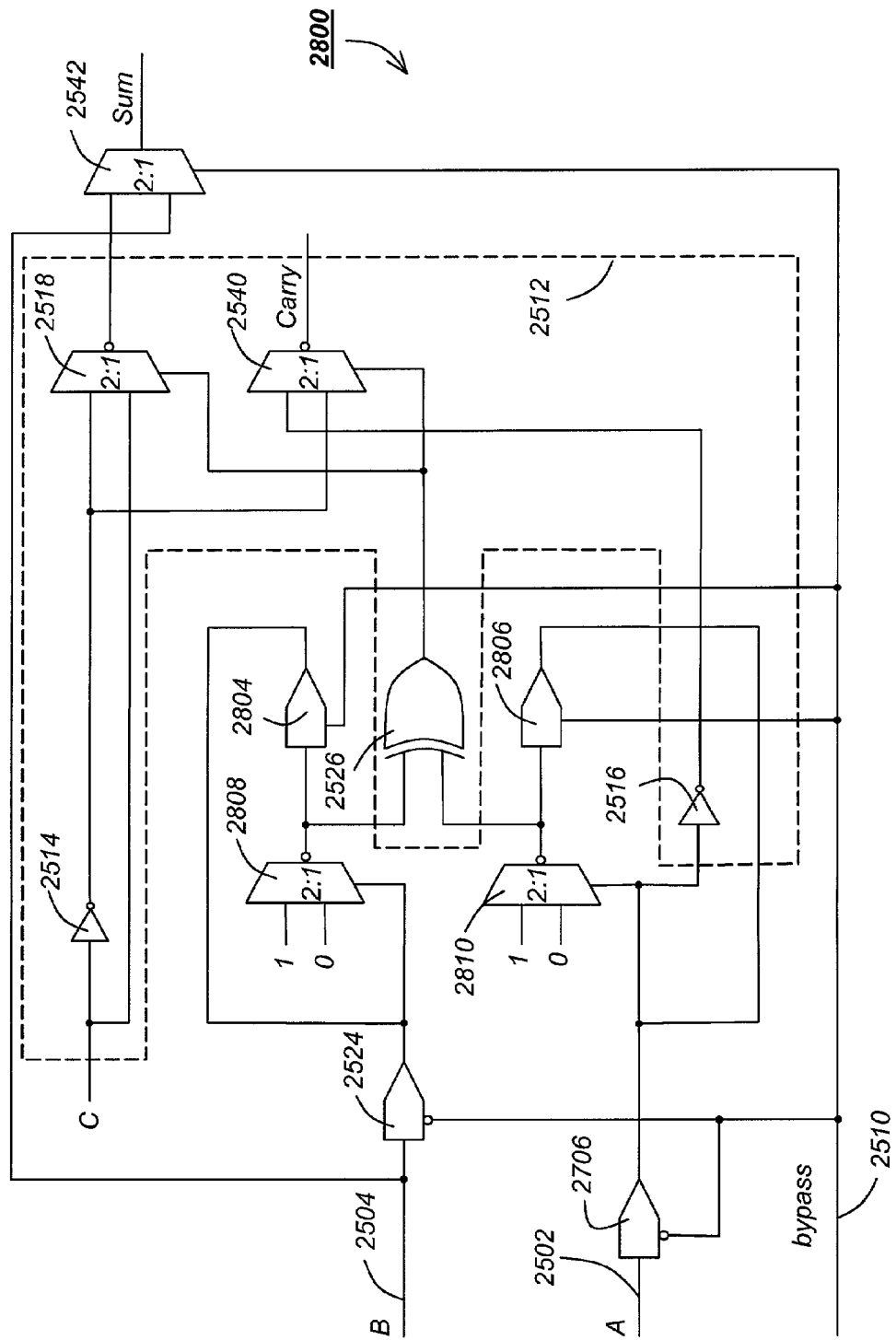
FIG. 28 is a diagram showing an alternative embodiment of the bypassable adder.

FIG. 28 is an alternate embodiment of the bypassable adder 2800. Like the embodiment pictured in FIG. 27, the bypassable adder 2800 includes the same transmission gates 2524 and 2706 and multiplexers 2542, 2518, and 2540, and inverters 2514 and 2516 as the embodiment illustrated in FIG. 27. However, in this embodiment, the multiplexer 2550, transmission gates 2552 and 2704, and XOR gates 2702 are replaced with other circuit elements.

In particular, in the embodiment illustrated in FIG. 28, a control input of a first multiplexer 2808 is communicatively coupled to the second input 2504, and the inputs to the first multiplexer 2808 are logical one and logical zero. Further, a transmission gate 2804 is used to feed back the second input value 2504 to the multiplexer 2808 under control of the bypass input 2510.

Similarly, a control input of a second multiplexer 2810 is communicatively coupled to the first input 2502, and the inputs to the second multiplexer 2810 are a logical one and a logical zero. A transmission gate 2806 is used to feed back the first input value 2502 to the multiplexer under control of the bypass input 2510.

The output of the first multiplexer 2808 and the second multiplexer 2810 are provided to an XOR gate 2526, providing an A⊕B signal which is used in the same manner as in the embodiment depicted in FIG. 27.

Other embodiments of the bypassable adder can be implemented. Such embodiments include circuit elements to feed back values from subsequent circuitry to regenerate one or more of the inputs. Of course, the C input must also be constant and this can be achieved by designing the "multipliers" in the direct-form filter structure to output $2h_k$ and $-2h_k$ so the first "badder" cell 2604 A of the "badder" cells 2604A–2604D in the carry-ripple adder does not require a C input. The C input can be tied low or a similarly designed half-adder cell can be used. Additions of plus or minus the coefficient achieve the desired addition or subtraction of the coefficient. FIG. 29 illustrates one embodiment of a "multiplier." If desired, the C input can be regenerated according to the following:

$C$=SUM when $A \oplus B$=0

$C$=CARRY when $A \oplus B$=1

Figure 30:
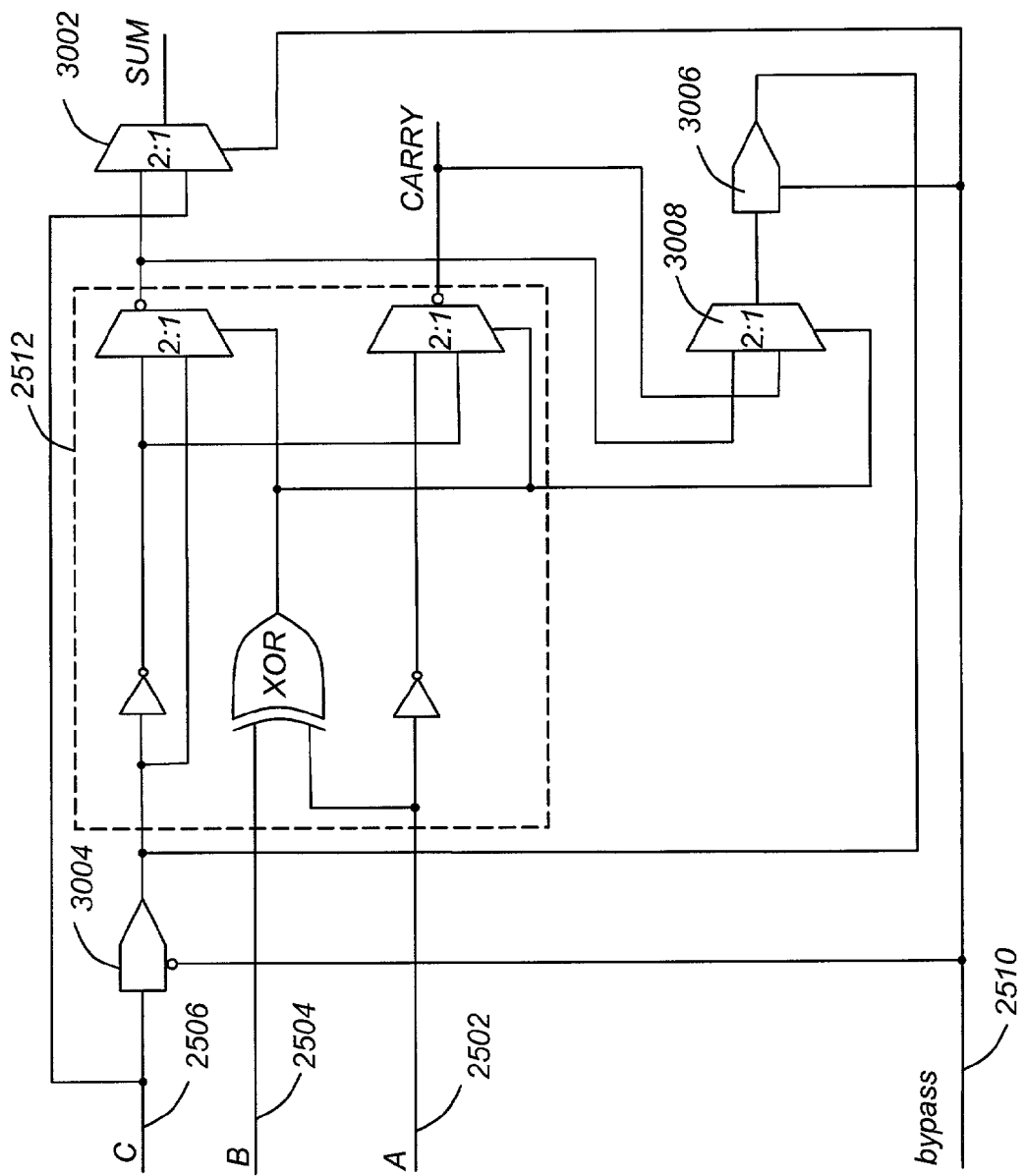
FIG. 30 is a diagram of one embodiment of a bypassable adder.

FIG. 30 is a diagram of another embodiment of the bypassable adder 3000. In this embodiment, the carry input C is held using a MUX 3008 and a pair of transmission gates 3006 and 3004 (or one more MUX) to switch between a new input and the regenerated input as shown in FIG. 30. Hereinafter, a bypassable adder that holds an input value is alternatively referred to as a "badder."

Often, a half-adder cell is used when performing an addition of two inputs. A truth table for a half adder is illustrated below:

| A | B | SUM | CARRY |
|---|---|-----|-------|
| 0 | 0 | 0   | 0     |
| 0 | 1 | 1   | 0     |
| 1 | 0 | 1   | 0     |
| 1 | 1 | 0   | 1     |

The SUM is equal to the XOR of the first input A and the second input B and the CARRY signal is equal to the AND of the first input A and the second input B. The following relations reveal other ways to construct a half adder SUM=B when A=0

SUM=$\overline{B}$ when A=1

SUM=A when B=0

SUM=$\overline{A}$ when B=1

CARRY=0 when A=0

CARRY=B when A=1

CARRY=0 when B=0

CARRY=A when B=1

These relationships show that MUXs can be used to implement the half adder function. The inputs A and B can be regenerated according to the following relations:

A=SUM when B=0

A=$\overline{SUM}$ when B=1

B=SUM when A=0

B=$\overline{SUM}$ when A=1

A=B when SUM=0

A=$\overline{B}$ when SUM=1

B=A when SUM=0

B=$\overline{A}$ when SUM=1

Therefore, A or B can be held with the use of a multiplexer and a pair of transmission gates to switch the half adder input between a new input and the regenerated value.

Alternatively, the XOR relations previously stated for an adder cell:

$A = A \oplus B \oplus B$ $B = A \oplus B \oplus A$ also apply to a half adder. The half adder's output can be bypassed with a MUX. A bypassable half adder cell with held inputs is called a "half badder" cell. The relations above suggest several ways to build "half badder" cells.

Figure 31:
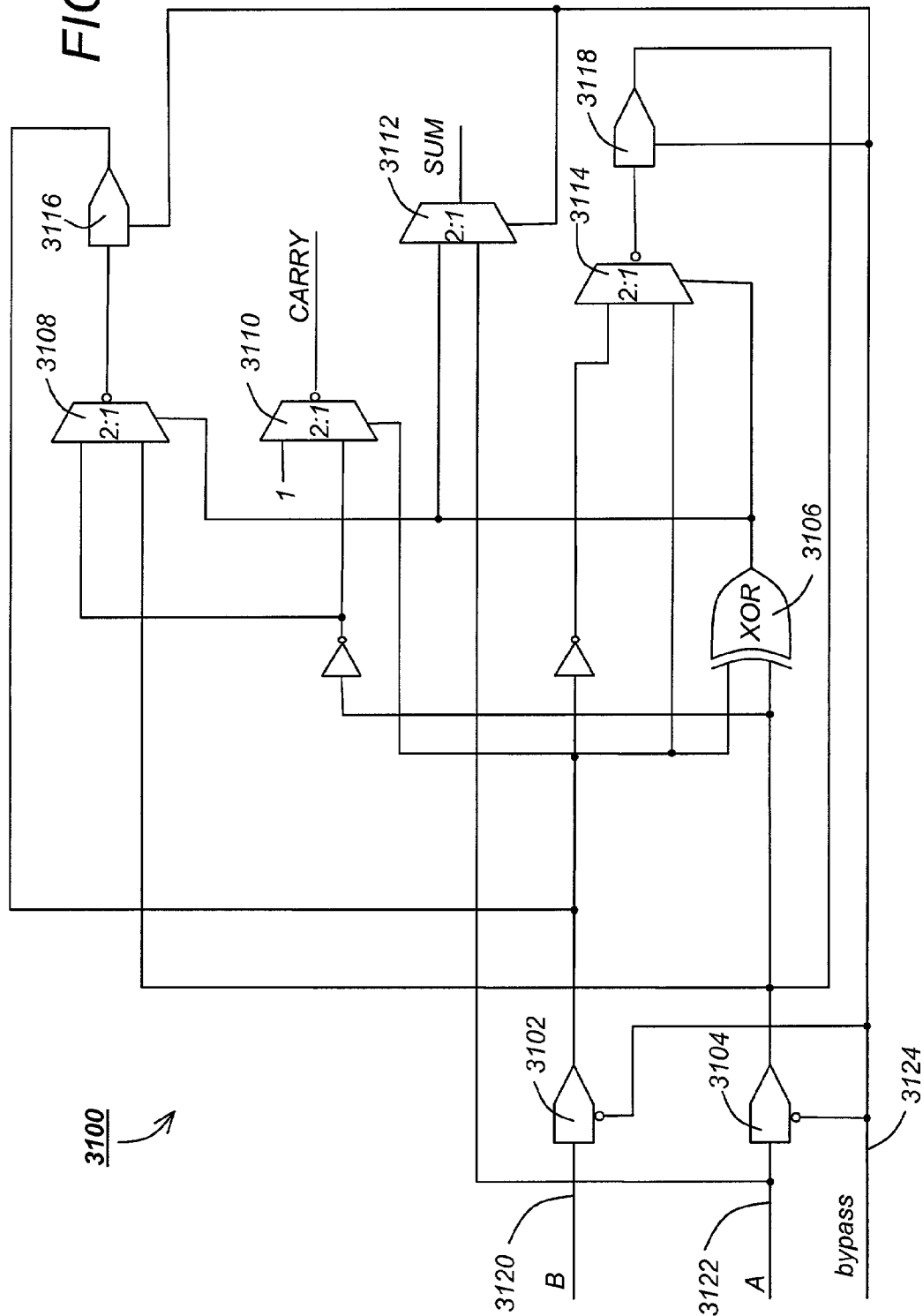
FIG. 31 is a diagram of an embodiment of a bypassable half adder.

FIG. 31 is one embodiment of a bypassable half adder 3100. The half adder 3100 comprises a first transmission gate 3104 for conditionally blocking the first input signal 3122 and a second transmission gate 3102 for conditionally blocking the second input signal 3120. XOR gate 3106 generates the relationship A⊕B, which is provided as a control input to multiplexers 3108 and 3114. Multiplexer 3108 provides a logical output of A or $\overline{A}$, depending on the value of A⊕B, and the logical output is provided to the output of the transmission gate 3102 when the bypass signal is present. Multiplexer 3110 provides either A or 0 as a carry signal, depending on the value of B. Multiplexer 3112 provides either A⊕B or A as the SUM according to the bypass signal. Multiplexer 3114 provides either $\overline{B}$ or B depending on the value of A⊕B, and its logical output is provided to the output of the transmission gate 3104 when the bypass signal is present.

Figure 32:
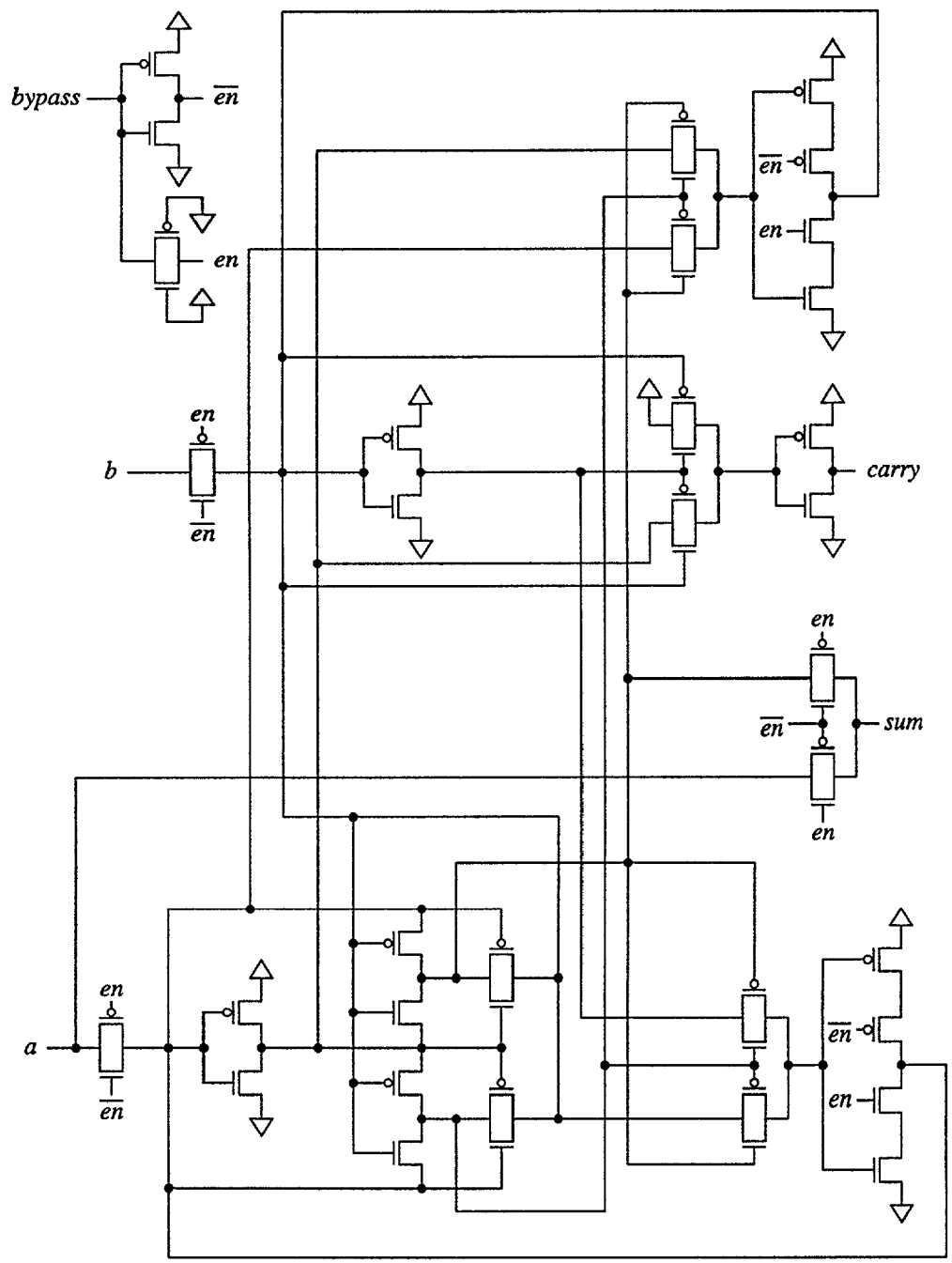
FIG. 32 is a schematic diagram depicting one embodiment of a transistor circuit implementing the logic of FIG. 31.

FIG. 32 is a schematic diagram depicting one embodiment of a transistor circuit implementing the logic of FIG. 31.

Figure 33:
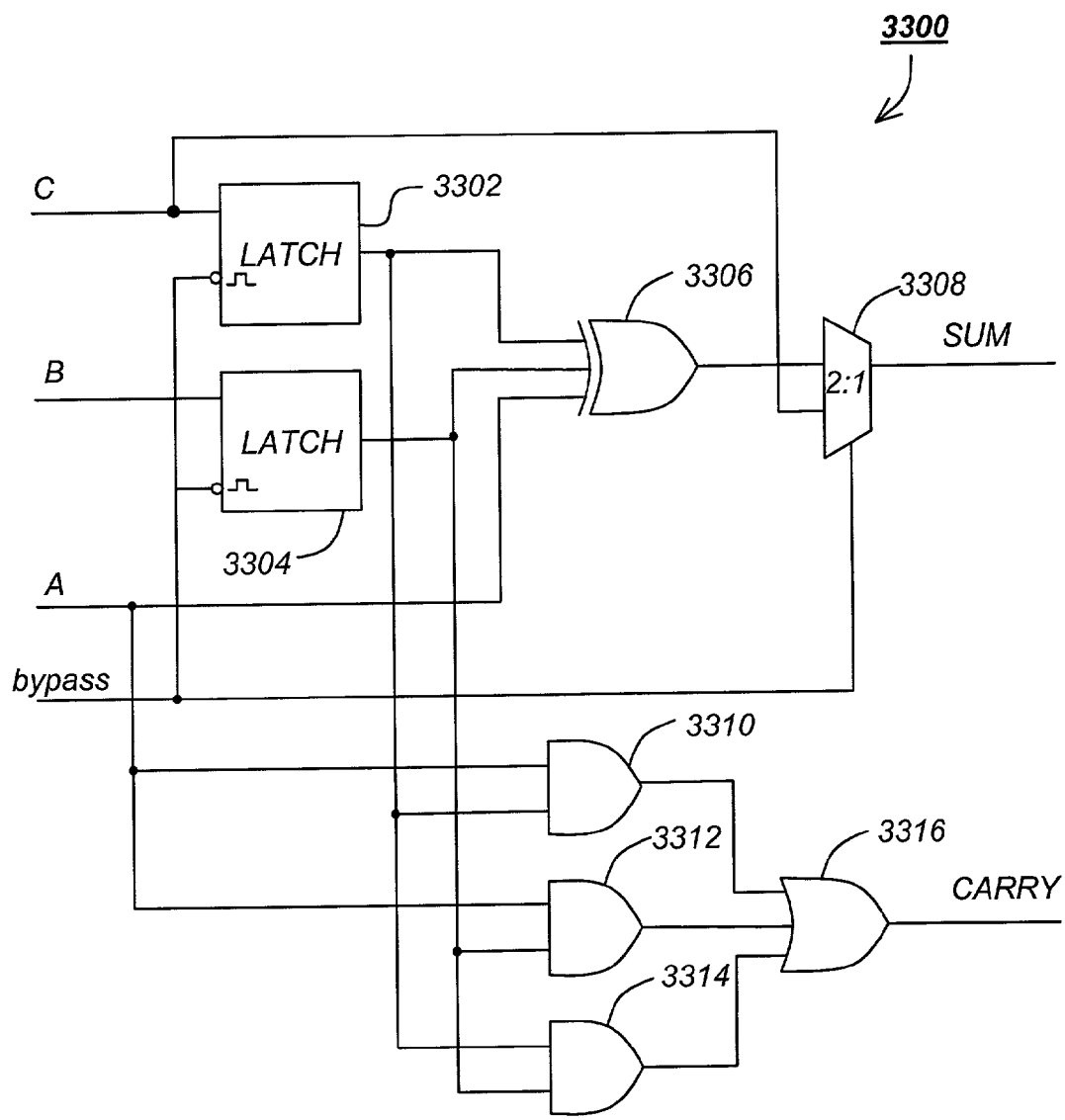
FIG. 33 is a logical model of another bypassable adder cell.

FIG. 33 is a logical model of a bypassable adder cell 3300. The bypassable adder cell 3300 comprises a first latch 3302 for holding the carry signal C according to a bypass signal bypass and a second latch 3304 for holding a second input signal B according to the bypass signal.

A latch is a level-sensitive device wherein the input/output relationship is controlled by the level of the input control signal. Such a device is defined in detail in *The Art of Digital Design*, by Winkel and Prosser, Prentice Hall, 1980, (e.g. pp. 104–106) which is hereby incorporated by reference herein. Other known variations of this device, such as an "edge-triggered" device are also appropriate for the FIG. 33 and FIG. 34 latch applications. The first input signal A and the output from the first latch 3302 and the second latch 3304 is provided to an XOR gate 3306, which produces an output that is logically equivalent to C⊕B⊕A. The output of the XOR gate 3306 is provided to a multiplexer 3308, which, in accordance with the bypass input, selects between the C input and the C⊕B⊕A input to produce the sum output.

The bypassable adder cell 3300 also comprises AND gates 3310–3314. AND gate 3310 accepts the A input and the latched C input to produce A·C, AND gate 3312 accepts the A input and the latched B input to produce A·B, and AND gate 3314 accepts latched C input and latched B input to produce C·B. These outputs are provided to OR gate 3316 to produce the carry signal.

Figure 34:
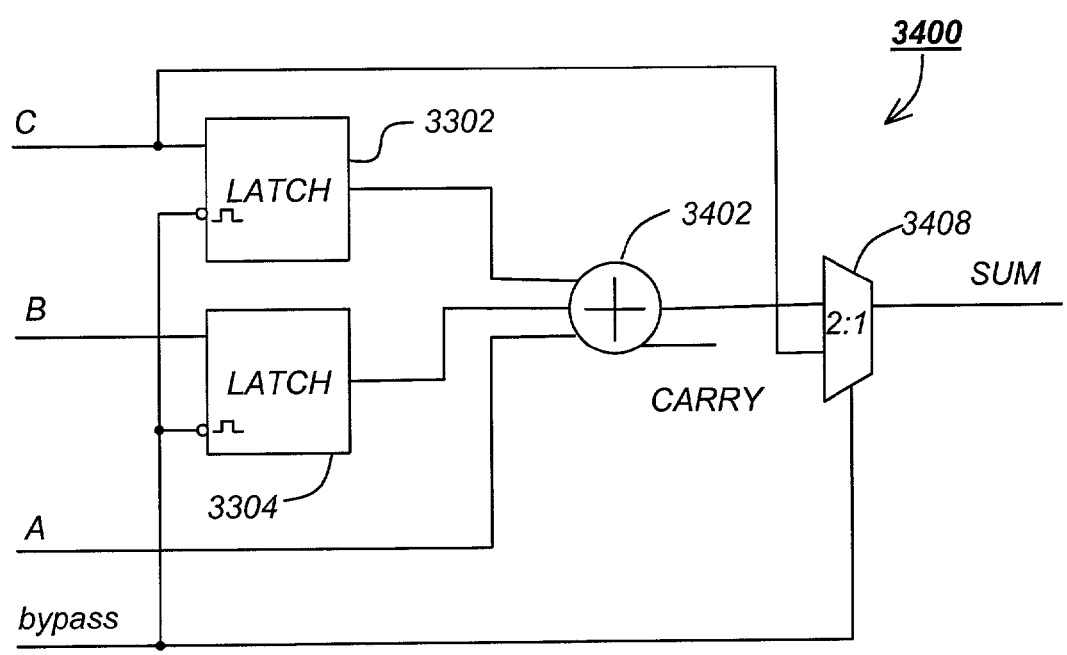
FIG. 34 is a diagram illustrating an embodiment of a bypassable adder providing the same functionality as the bypassable adder shown in FIG. 33, but with standard logic cells.

FIG. 34 is a diagram illustrating an embodiment of a bypassable adder 3400 providing the same functionality as the embodiment illustrated in FIG. 33, but by using latches, a multiplexer, and an adder 3402. The adder 3402 is a full adder with three inputs (from A, and from the output of latches 3302 and 3304 ) and a sum and carry output. This illustrates that the bypassable adder can be constructed using standard logic cells that are commonly found in digital logic libraries. Similarly, other versions of badders and half-badders such as those described previously, wherein various inputs are held an/or bypassed, can be implemented using latches, multiplexers, and logic gates.

CONCLUSION

This concludes the description of the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching.

For example, any one, any two, or all three adder inputs A, B, and C can be regenerated. Also, the feeding of A (or B or C) back to the adder's input can be accomplished in other ways. For example, appropriately sized transistors in the modified adder cell could allow for the direct feedback connection of A (or B or C) without the use of a transmission gate. In such embodiments, feedback would always occur and provision would be made for overriding with a new input having enough drive strength. A bypassable adder can also be used in other filter structures and in other applications where a convolutional sum is computed. These include the decimation filter of a sigma-delta analog-to-digital converter and a correlator such as those used in spread spectrum communication systems. Moreover, it is conceivable that many other systems that employ adders can derive benefits such as higher-speed operation, lower power dissipation, and lower switching noise generation through the use of the bypassable adder. Furthermore, the basic circuit that is being bypassed, or whose inputs are being held, need not be an adder or a half adder. Other circuits having one or more inputs and one or more outputs, wherein some other relation, not necessarily addition (that is some other mapping relationship instead of those depicted herein) governs the input/output relationship of the circuit, can have its outputs, or internal signals, used to hold its inputs in a manner similar to those illustrated here using adders.

A further example of an embodiment of the present invention employs only the holding operation via a bypass control signal without also employing the bypass operation.

It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A circuit for adding a signal at a first input (A) and a second input (B) to produce a sum output (S) according to a bypass signal, comprising:

a third input (bypass) for accepting the bypass signal;

a logic circuit, communicatively coupled to the third input (bypass) and at least one of the first input (A) and the second input (B), the logic circuit configured to hold at least one of a value of the first input (A) and a value of the second input (B) according to the third input (bypass);

a bypass path through which at least one of the first input (A) and the second input (B) is routed according to the bypass signal; and a second logic circuit communicatively coupled to the third input (bypass) and an adder output and an output of the bypass path, the second logic circuit configured to pass only one of the adder output and an output of the bypass path to the sum output (S) according to the third input (bypass);

wherein the logic circuit further generates a carry output (CARRY) without computing a new adder output according to the bypass signal (bypass).

2. The circuit of claim 1, wherein the logic circuit further generates the sum output (S) without computing a new sum output (S) according to the third input (bypass).

3. The circuit of claim 1, further comprising:

a carry input (C) and a carry output (CARRY); and wherein the logic circuit further holds a value of the carry input (C) according to the third input (bypass).

4. The circuit of claim 1, wherein the logic circuit is configured to hold the value of the first input (A) and the value of the second input (B) according to the third input (bypass).

5. The circuit of claim 4, wherein the logic circuit comprises a transmission gate adder.

6. The circuit of claim 5, wherein the transmission gate adder comprises:
a first multiplexer having a first multiplexer first input communicatively coupled to the first input (A), a first multiplexer second input, and a first multiplexer control input;
a second multiplexer having a second multiplexer first input communicatively coupled to the second input (B), a second multiplexer second input, and a second multiplexer control input
a first logic module having a first logic module first input, a first logic module second input, and a first logic module output, the first logic module output having an EXCLUSIVE OR relationship between the first logic module first input and the first logic module second input; and
wherein the first logic module input is communicatively coupled to the first input (A), the logic module second input is communicatively coupled to the second input (B), and the first logic module output is communicatively coupled to the first multiplexer control input and the second multiplexer control input.

7. The circuit of claim 1, wherein the logic circuit comprises an adder and at least one latch.

8. A circuit for adding a signal at a first input (A) and a second input (B) to produce a sum output (S) according to a bypass signal, comprising:
a third input (bypass) for accepting the bypass signal;
a logic circuit, communicatively coupled to the third input (bypass) and at least one of the first input (A) and die second input (B), the logic circuit configured to hold at least one of a value of the first input (A) and a value of the second input (B) according to the third input (bypass);
a bypass path through which at least one of the first input (A) and the second input (B) is routed according to the bypass signal;
a second logic circuit communicatively coupled to the third input (bypass) and an adder output and on output of the bypass path, the second logic circuit configured to pass only one of the adder output and an output of the bypass path to the sum output (S) according to the third input (bypass);
wherein the logic circuit comprises a transmission gate adder comprising:
a first multiplexer having a first multiplexer first input communicatively coupled to the first input (A), a first multiplexer second input, and a first multiplexer control input;
a second multiplexer having a second multiplexer first input communicatively coupled to the second input (B), a second multiplexer second input, and a second multiplexer control input;
a first logic module having a first logic module first input, a first logic module second input, and a first logic module output, the first logic module output having an EXCLUSIVE OR relationship between the first logic module first input and the first logic module second input; and
wherein the first logic module input is communicatively coupled to the first input (A), the logic module second input is communicatively coupled to the second input (B), and the first logic module output is communicatively coupled to the first multiplexer control input and the second multiplexer control input.

9. The circuit of claim 8, wherein the first logic module is an EXCLUSIVE OR gate.

10. The circuit of claim 9, further comprising:
a first inverter communicatively coupled between the first input (A) and the first multiplexer first input; and
a second inverter communicatively coupled between the second input (B) and second multiplexer first input.

11. The circuit of claim 8, wherein the logic circuit comprises:
a second logic module having a second logic module first input, a second logic module second input, and a second logic module output, the second logic module output having an EXCLUSIVE OR relationship between the second logic module first input and the second logic module second input; and
wherein the second logic module first input is communicatively coupled to the first logic module output.

12. The circuit of claim 11, wherein the second logic module is an EXCLUSIVE OR gate.

13. A device for adding a signal at a first input (A) and a second input (B) to produce an adder output (S), comprising
a bypass input (bypass); and
a logic circuit, communicatively coupled to the bypass input (bypass), the first input (A), and the second input (B), the logic circuit configured to generate the adder output (S) without computing a new adder output according to the bypass input (bypass);
wherein the logic circuit is further configured to hold a value of at leas one of the first input (A) and the second input (B) according to the bypass input (bypass).

14. The device of claim 1, further comprising:
a carry input (C) and a carry output (CARRY); and
wherein the logic circuit further holds a value of the carry input (C) according to the bypass input (bypass).

15. The device of claim 13, wherein the logic circuit further regenerates a carry output (CARRY) without computing a new adder output according to the bypass input (bypass).

16. The device of claim 13, wherein the logic circuit comprises a latch.

17. A circuit for adding a signal at a first input (A) and a second input (B) to produce a sum output (S) according to a bypass signal, comprising:
a third input (bypass) for accepting the bypass signal; and
a holding means for holding a value of at least one of the first input (A) and the second input (B) according to the third input (bypass); and
wherein the holding means is communicatively coupled to the third input (bypass), the at least one of the first input (A) and the second input (B), the holding means configured to hold at least one of a value of the first input (A) and a value of the second input (B) according to the third input (bypass);
a bypass path through which at least one of the first input (A) and the second input (B) are routed according to the bypass signal; and
a logic circuit communicatively coupled to the third input (bypass) and an adder output and an output of the bypass path, the logic circuit configured to pass only one of the adder output and the output of the bypass path to the sum output (S) according to the third input (bypass);
wherein the holding means further comprises means fur generating the adder output (S) without computing a new sum output according to the third input (bypass).

18. The circuit of claim 17, further comprising:
a carry input (C) and a carry output (CARRY); and
wherein the holding means further holds a value of the carry input (C) according to the third input (bypass).

19. The circuit of claim 17, wherein the holding means further generates the carry output (CARRY) without computing a new output according to the third input (bypass).

20. The circuit of claim 19, wherein the holding means campuses a transmission gate adder.

21. The circuit of claim 20, wherein the transmission gate adder comprises:
a first multiplexing means having a first multiplexing means first input communicatively coupled to the first input (A), a first multiplexing means second input, and a first multiplexing means control input;
a second multiplexing means having a second multiplexing means first input communicatively coupled to the second input (B), a second multiplexing means second input, and a second multiplexing means control input;
a first logic means having a first logic means first input, a first logic means second input, and a first logic means output, the first logic means output having an EXCLUSIVE OR relationship between the first logic means first input and the first logic means second input; and
wherein the first logic means input is communicatively coupled to the first input (A), the first logic means second input is communicatively coupled to the second input (B), and the first logic means output is communicatively coupled to the first multiplexing means control input end the second multiplexing means control input.

22. The circuit of claim 21, further comprising:
a first inverting means communicatively coupled between the first input (A) and the first multiplexing means first input; and
a second inverter communicatively coupled between the second input (B) and second multiplexing means first input.

23. The circuit of claim 17, wherein the holding means is configured to hold a value of the first input (A) and a value of the second input (B) according to the third input (bypass).

24. The circuit of claim 23, wherein the holding means comprises a transmission gate adder.

25. The circuit of claim 24, wherein the transmission gate adder comprises:
a first multiplexing means having a first multiplexing means first input communicatively coupled to the first input (A), a first multiplexing means second input, and a first multiplexing means control input;
a second multiplexing means having a second multiplexing means first input communicatively coupled to the second input (B), a second multiplexing means second input, and a second multiplexing means control input;
a first logic means having a first logic means first input, a first logic means second input, and a first logic means output, the first logic means output having an EXCLUSIVE OR relationship between the first logic means first input and the first logic means second input; and
wherein the first logic means input is communicatively coupled to the first input (A), the logic means second input is communicatively coupled to the second input (B) and the first logic means output is communicatively coupled to the first multiplexing means control input and the second multiplexing means control input.

26. The circuit of claim 25, wherein the logic means comprises:
a second logic means having a second logic means first input, a second logic means second input, and a second logic means output, the second logic means output having a relationship selected from a group comprising an EXCLUSIVE OR relationship and a multiplexing relationship between the second logic means first input end the second logic means second input and
wherein the second logic means first input is communicatively coupled to the first logic means output.

27. A device for adding a signal at a first input (A) and a second input (B) to produce an adder output (S), comprising:
a bypass input (bypass); and
a generating means, communicatively coupled to the bypass input (bypass), the first input (A), and the second input (B), the generating means configured to generate the adder output (S) without computing a new adder output according to the bypass input (bypass);
wherein the generating means is further configured to hold a value of at least one of the first input (A) and the second input (B) according to die bypass input (bypass).

28. The device of claim 27, further comprising:
a carry input (C) and a cony output (CARRY); and
wherein the generating means further holds the carry input (C) according to the bypass input (bypass).

29. The device of claim 27, wherein the generating means further generates a carry output (CARRY) without computing a new output according to the bypass signal (bypass).

30. The circuit of claim 17, wherein the holding means comprises a latch.

31. An apparatus for adding a signal at a first input (A) and a second input (B) to produce a sum output (S), comprising:
means for accepting a third input (bypass);
means for holding at least one of a value of the first input (A) and a value of the second input (B) and passing only one of an adder output and a routed at least one of the first input (A) and the second input (B) to the sum output (S) according to the third input (bypass); and
means of generating the sum output without computing a new adder output according to the bypass input (bypass).

32. The apparatus of claim 31, further comprising:
means of holding a value of a carry input (C) according to the third input (bypass).

33. The apparatus of claim 31, further comprising:
means for generating the carry output (CARRY) without computing a new output according to the third input (bypass).

34. The method apparatus of claim 31, wherein the at least one of the value of the first input (A) and the value of the second input (B) is held according to the bypass input (bypass) by a latch having a clock input controlled by the third input.

35. A circuit having one or more inputs A, B, . . . and producing one or more outputs S1, S2, . . . according to a mapping function mapping the inputs A, B, . . . to one or more mapper outputs, the circuit comprising:
a further input (bypass); and
a first circuit element communicatively coupled to the further input (bypass);
a second circuit element, communicatively coupled to at least one of the inputs A, B, . . . that conditionally holds a value of one of the inputs A, B, . . . according to the further input (bypass);
a bypass path though which one or more of the inputs A, B, . . . are routed according to the further input (bypass);
a third circuit element, communicatively coupled to the further input (bypass) and the one or more mapper outputs and an output of the bypass path, the third circuit element configured to pass only one of the (1)

one or more mapper outputs and (2) output of the bypass path, according to the further input (bypass); wherein the circuit further generates at least one of the outputs S1, S2, . . . without computing a new output S1, 52, . . . according to the bypass input.

36. The circuit of claim 35, wherein the mapping function is describable by a truth table.

37. The circuit of claim 36, wherein the circuit is an adder that adds the one or more inputs A, B, . . . to produce the one or more outputs S1, S2, . . . .

38. The circuit of claim 35, wherein the circuit holds a value of more than one of the inputs A, B, . . . according to the bypass input.

39. The circuit of claim 35, wherein the circuit is an adder and the circuit further comprises:
   a carry input and a carry output; and
   wherein the circuit further holds a value of the carry input according to the bypass input.

40. The circuit of claim 39, wherein the circuit further regenerates the carry input according to the bypass input.

41. The circuit of claim 35, wherein the second circuit element comprises at least one latch communicatively coupled to at least one of the inputs A, B, . . . , wherein the latch includes a logical input, a clock input communicatively coupled to the bypass input, and an output, and the larch presents the logical input to the output only in response to a signal at the clock input.

42. An apparatus for processing one or more inputs A, B, . . . to produce one or more outputs S1, S2, . . . according to a mapping function having one or more inputs A, B, . . . and one or mote mapper outputs, comprising:
   means for accepting a further input (bypass);
   means for conditionally holding a value of one of the inputs A, B, . . . and passing only one of (1) the one or more mapper outputs and (2) an output of a bypass path through which one of the inputs A, B, . . . are routed to the one or more outputs S1. S2, . . . according to the further input (bypass); and
   generating at least one of the outputs S1, S2, . . . without computing a new output S1, S2, . . . . according to the further input.

43. The apparatus of claim 42, further comprising means for generating at least another of the outputs S1, S2, . . . without computing a new another output S1, S2, . . . according to the further input.

44. The apparatus of claim 42, further comprising:
   means for holding a value of at least a second one of the inputs A, B, . . . according to the further input.

45. The apparatus of claim 42, wherein the value of one of the inputs A, B, . . . is conditionally held according to the farther input by a latch having a clock input controlled by the further input.

* * * * *

UNITED STATES PATENT AND TRADEMARK OFFICE
CERTIFICATE OF CORRECTION

| | | |
|---|---|---|
| PATENT NO. | : 7,228,325 B2 | Page 1 of 1 |
| APPLICATION NO. | : 09/938978 | |
| DATED | : June 5, 2007 | |
| INVENTOR(S) | : Willson, Jr. et al. | |

It is certified that error appears in the above-identified patent and that said Letters Patent is hereby corrected as shown below:

<u>Column 31</u>:

Claim 8, line 30, please delete "die" and insert --the--;

<u>Column 34</u>:

Claim 26, line 2, please delete "end" and insert --and--;

<u>Column 34</u>:

Claim 28, line 18, please delete "cony" and insert --carry--;

<u>Column 34</u>:

Claim 31, line 34, please delete "of" and insert --for--; and

<u>Column 35</u>:

Claim 41, line 25, please delete "larch" and insert --latch--.

Signed and Sealed this
Twenty-eighth Day of December, 2010

David J. Kappos
*Director of the United States Patent and Trademark Office*